United States Patent [19]

Tapia et al.

[11] Patent Number: 5,555,285

[45] Date of Patent: Sep. 10, 1996

[54] MULTI-VARIATE SYSTEM HAVING AN INTELLIGENT TELECOMMUNICATIONS INTERFACE WITH AUTOMATIC ADAPTIVE DELAY DISTORTION EQUALIZATION (AND RELATED METHOD)

[75] Inventors: Javier J. Tapia, Wheaton; Richard R. McBeth, Sugar Grove; Paul E. O'Neil, St. Charles, all of Ill.

[73] Assignee: Westell Incorporated, Aurora, Ill.

[21] Appl. No.: 413,421

[22] Filed: Mar. 30, 1995

[51] Int. Cl.⁶ .............................. H03H 7/40; H04M 3/08; H04M 7/04

[52] U.S. Cl. .................... 379/28; 379/398; 379/414; 375/232

[58] Field of Search .................... 379/398, 6, 28, 379/394, 98, 24, 414; 375/214, 226, 231, 232

[56] References Cited

U.S. PATENT DOCUMENTS

| | | | |
|---|---|---|---|
| 3,842,247 | 10/1974 | Anderson | 375/224 X |
| 3,849,744 | 11/1974 | Puruya | 375/229 X |
| 4,663,583 | 5/1987 | Ludwick et al. | 323/217 |
| 4,845,735 | 7/1989 | Payne et al. | 379/5 |
| 5,061,925 | 10/1991 | Sooch et al. | 341/120 |
| 5,181,228 | 1/1993 | Takatori | 375/103 |
| 5,187,742 | 2/1993 | Moran, III et al. | 379/398 X |
| 5,475,315 | 12/1995 | Cabot | 379/6 X |

OTHER PUBLICATIONS

AT&T Bell Laboratories, "Transmission Systems For Communication", 5th Ed, 1982, Ch. 11, pp. 246–249.

P. E. Fleischer, "Active Ajustable Loss And Delay Equalizers", IEEE Trans On Comm, vol. Com-22 (Jul. 1974) pp. 951–955.

Primary Examiner—Krista M. Zele
Assistant Examiner—Devendra Kumar
Attorney, Agent, or Firm—Milton S. Gerstein; Marvin N. Benn

[57] ABSTRACT

A multi-variate system having a microprocessor-based telecommunications interface which has a digital adaptive all-pass filter and automatically variable delay distortion equalization circuitry which in combination provide both pre and post delay distortion equalization on the transmit and receive sides of bidirectional data lines (or dedicated telephone lines), which interfaces a conventional 4-wire analog facility and a data station termination at the customer premises equipment. A method of practicing the preferred embodiment of the invention is also disclosed.

27 Claims, 39 Drawing Sheets

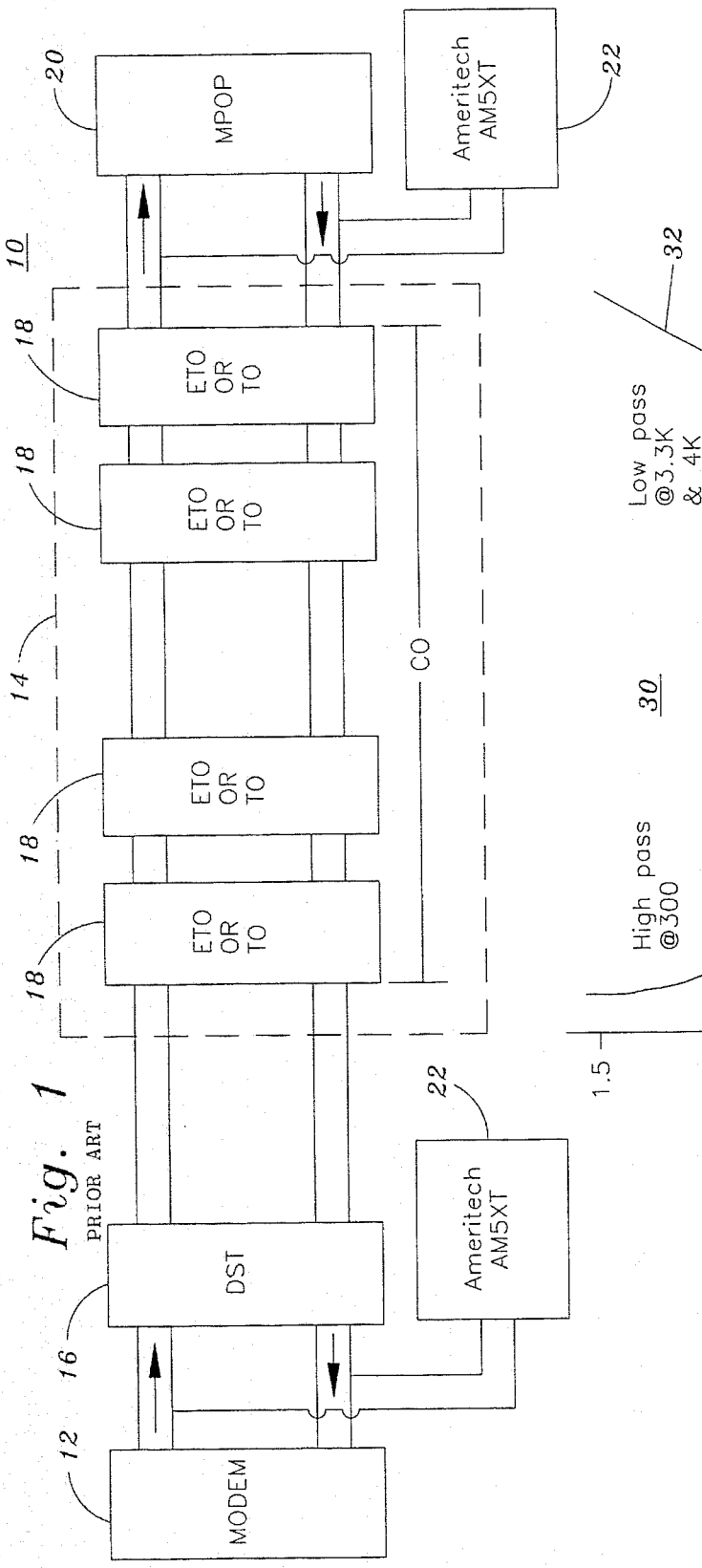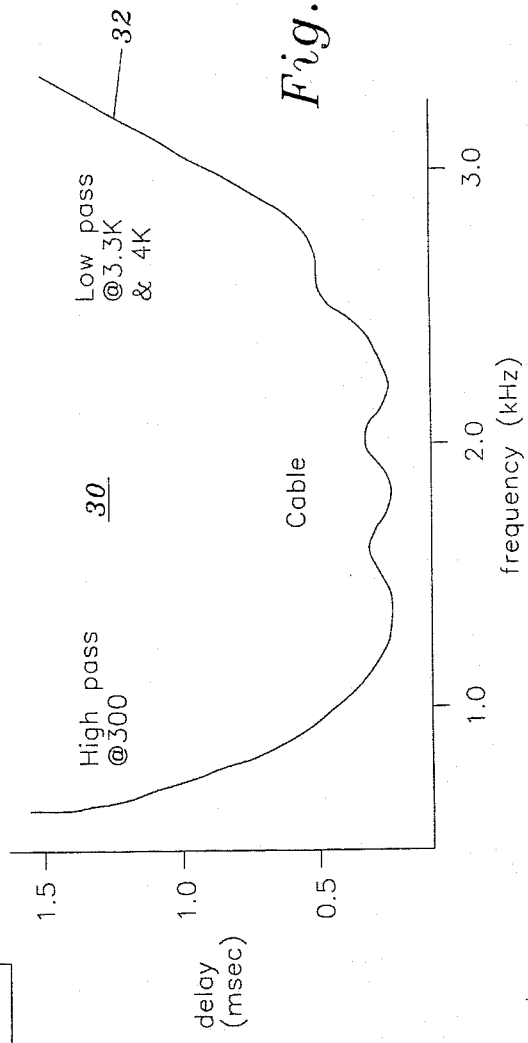

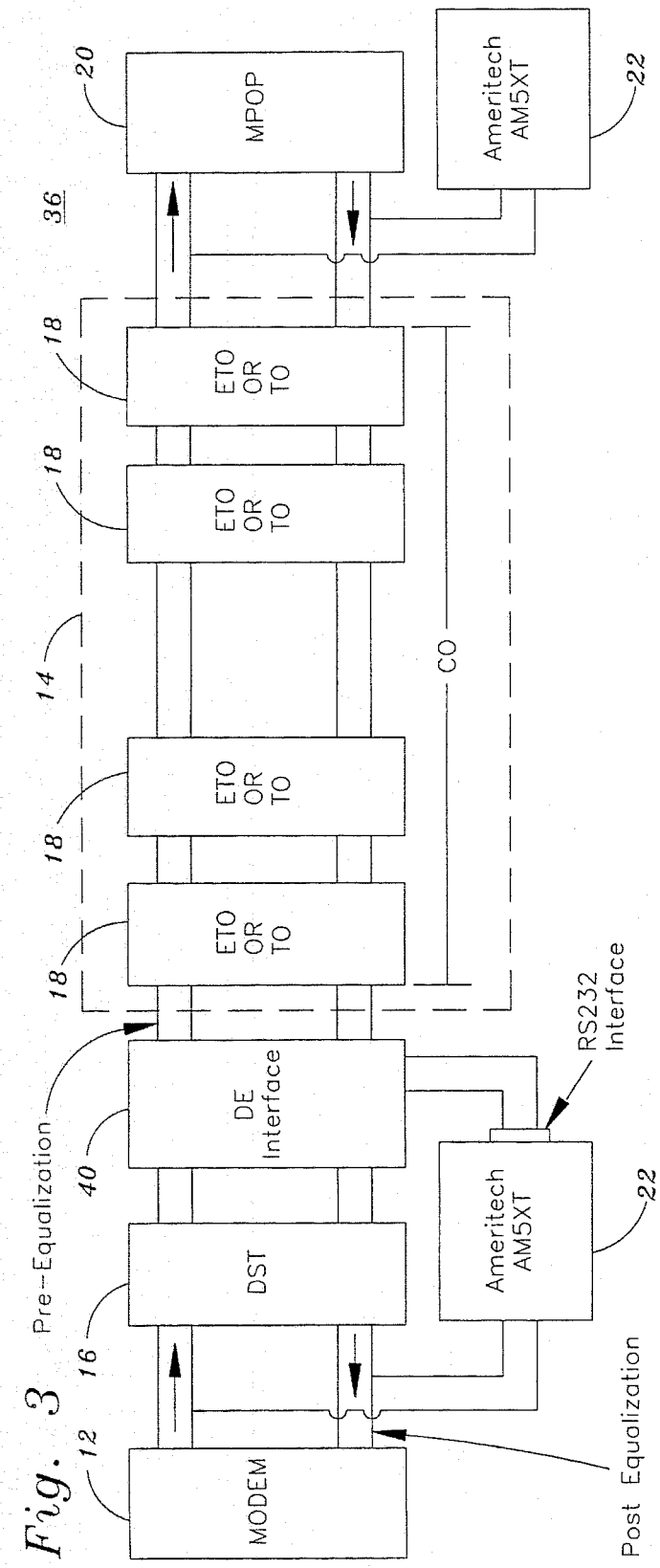
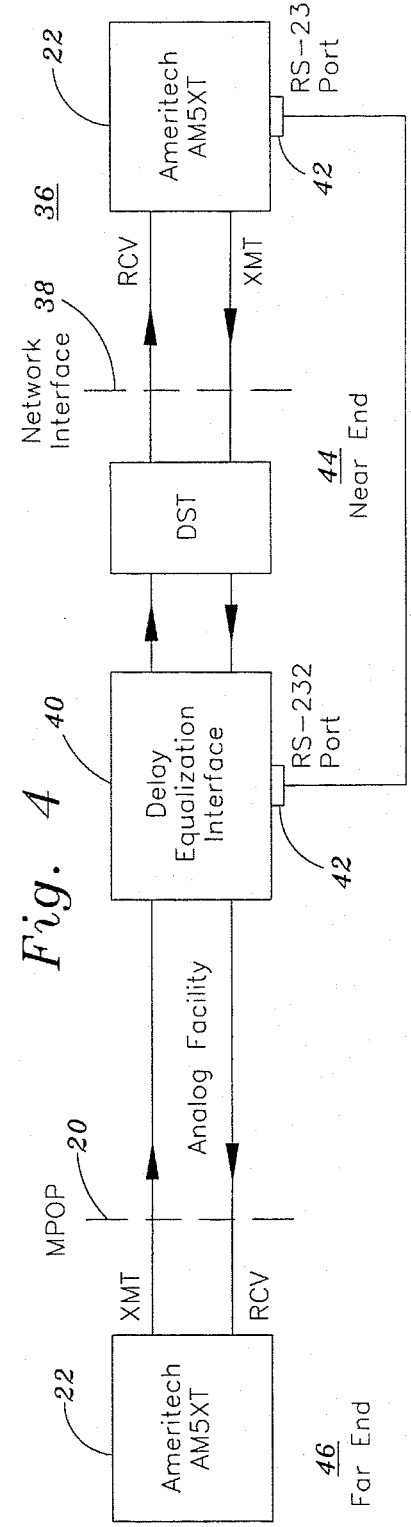

220

300

320

320

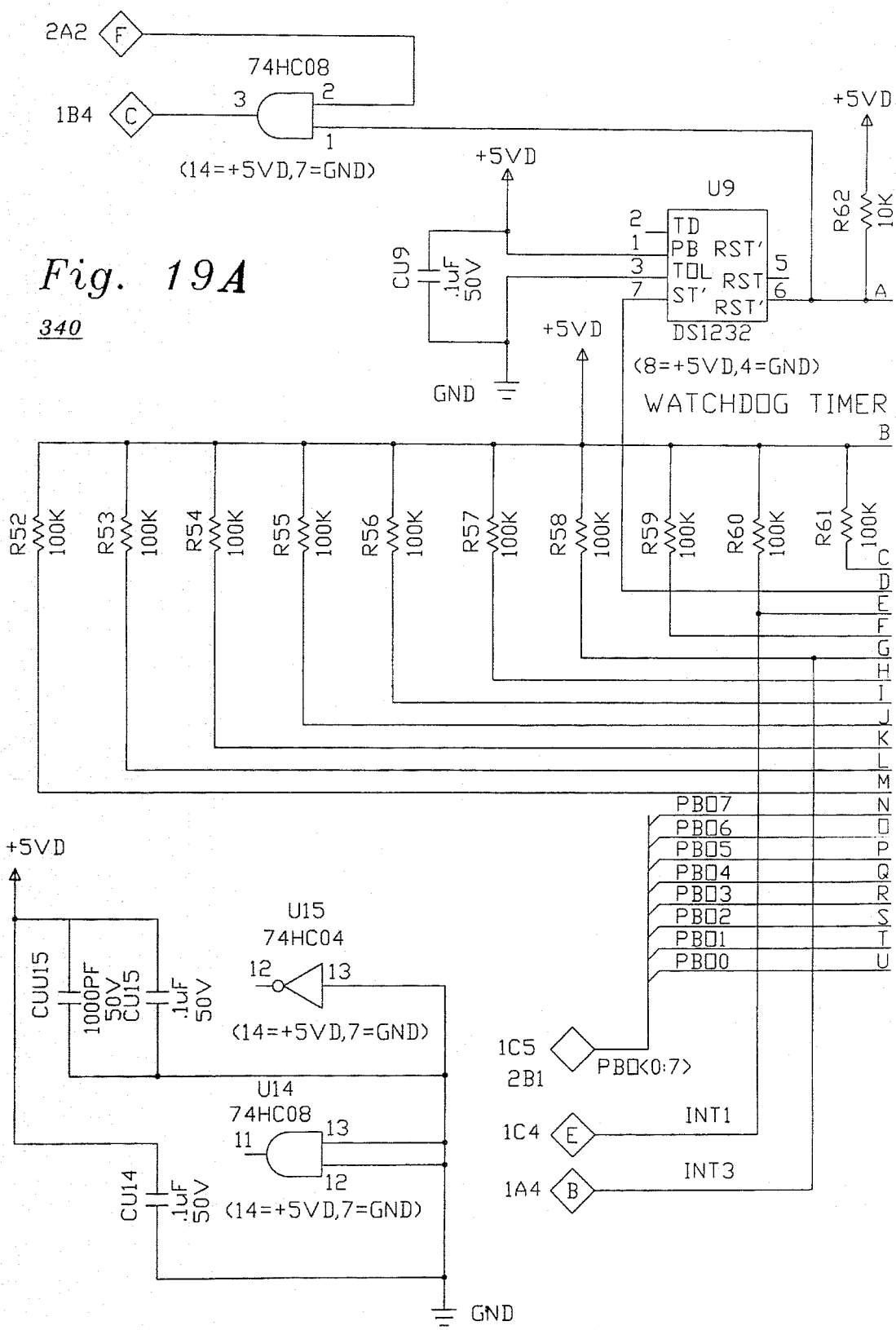

340

340

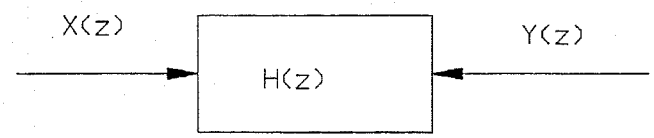
Fig. 20
Fig. 21
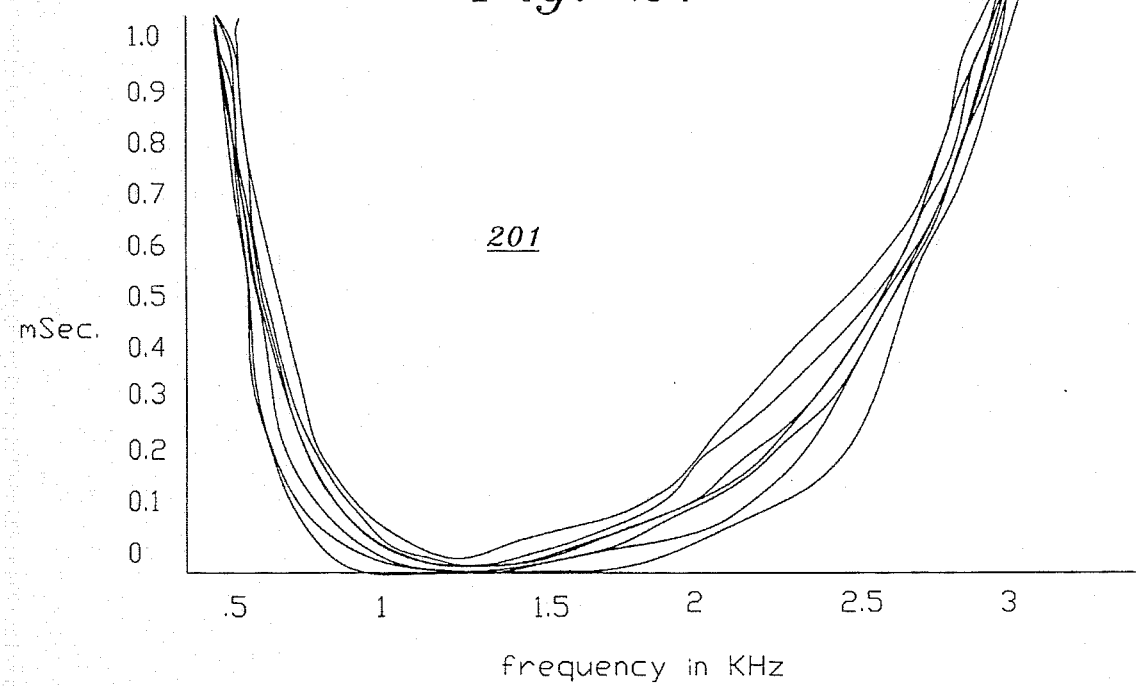

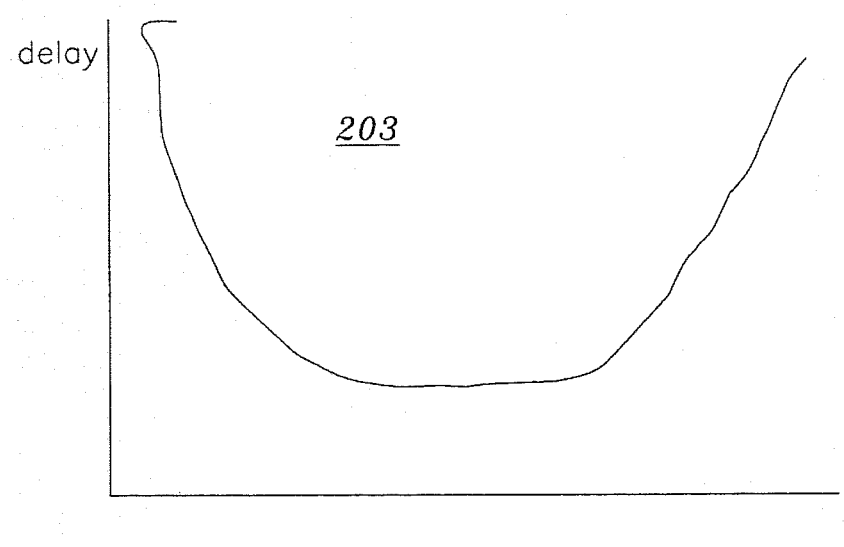
Fig. 22A
Fig. 22B
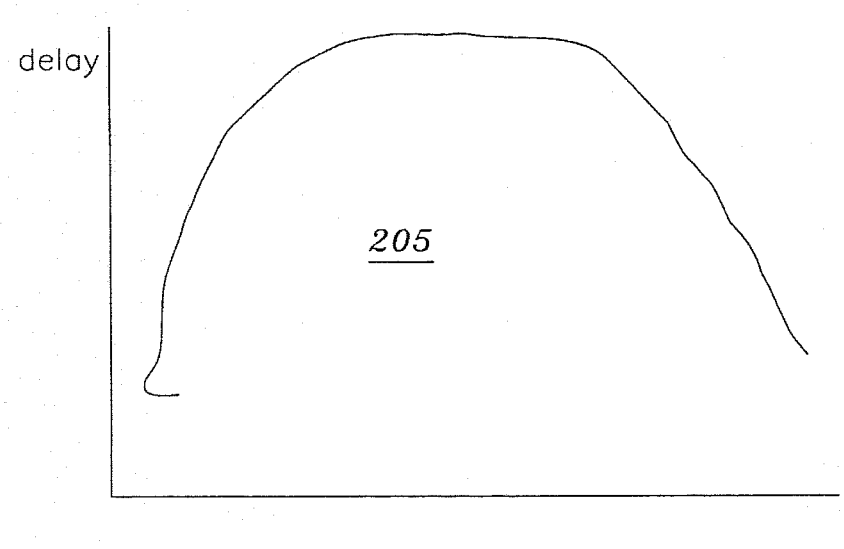

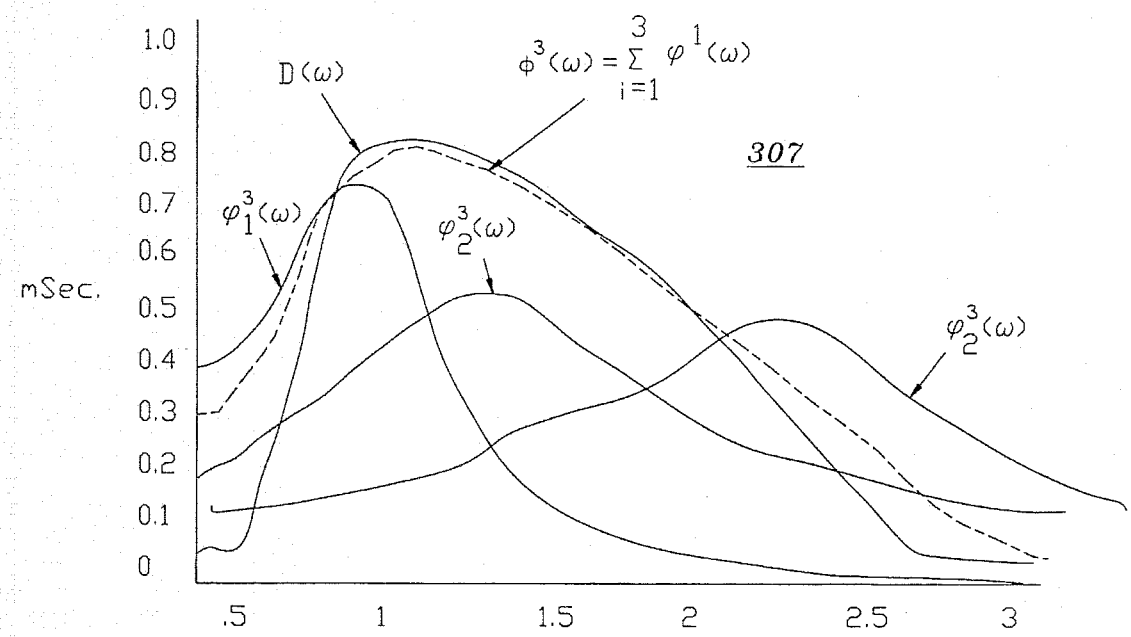
Fig. 24  Frequency in KHz
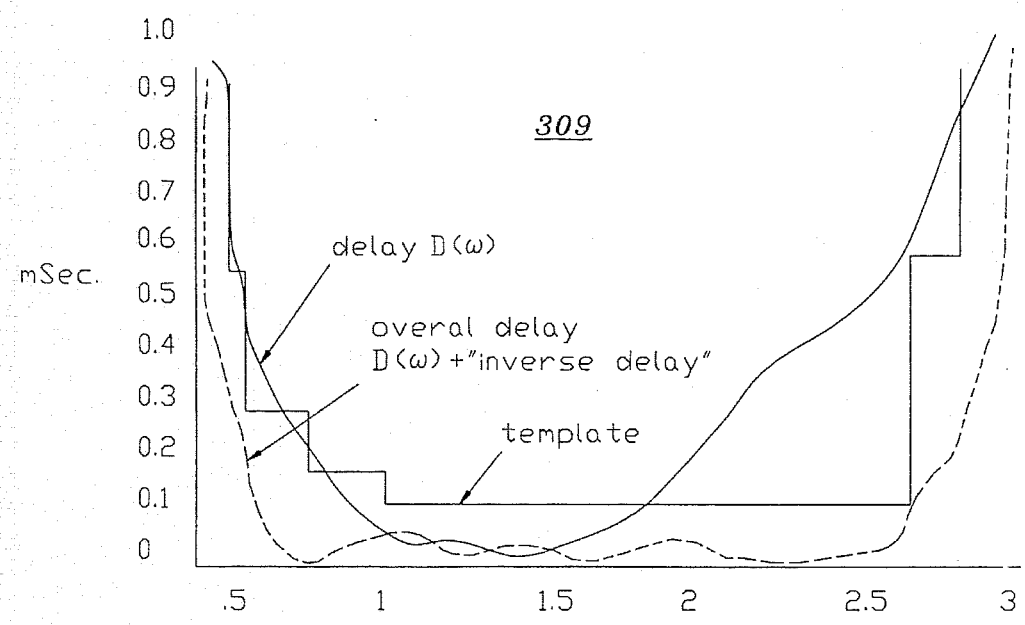
Fig. 25  Frequency in KHz pattern for 'low end': difference between the desired match and the combination of the 'middle end' and 'high end' bells.

MULTI-VARIATE SYSTEM HAVING AN INTELLIGENT TELECOMMUNICATIONS INTERFACE WITH AUTOMATIC ADAPTIVE DELAY DISTORTION EQUALIZATION (AND RELATED METHOD)

BACKGROUND OF THE INVENTION

This present invention relates to a system, including a telecommunications interface, and related method, directed to an adaptive envelope delay equalization that is used with bidirectional data communications lines in a transmission network, and more particularly, to a multi-variate system which has a microprocessor-based telecommunications interface having digital adaptive all-pass filter delay distortion equalization circuitry which is automatically variable for providing pre and post delay distortion equalization on the transmit and receive sides of dedicated telephone lines (e.g., standard 4-wire analog facility, although more than 4-wire tip and ring pairs are envisioned) and the data station termination at the customer premises equipment.

DESCRIPTION OF THE PRIOR ART

Generally, the use of a modem on the transmit and receive sides of a conventional 4-wire analog facility telephone line will, in most instances, result in a particular phenomenon commonly referred to as envelope delay distortion. The envelope delay distortion of a signal in a transmission network (or system) is the phase distortion in which the rate of change of phase shift with frequency of a circuit (or system) is not constant over the frequency range required for transmission, and is the result of the delay experienced by the differences in signal propagation speeds at different frequencies passing through the network or system resulting from the non-linear characteristics of the transmission path. Both, pre and post envelope delay distortion on the transmit and receive sides of bidirectional data lines (or dedicated telephone lines) will typically occur. The resulting envelope delay and is a measurable parameter through a transmission network and is the time required (in microseconds) for the envelope of a wave to travel between two points in a system. On a spectral basis, for the overall system the resulting delay distortion of a signal will mean that one tone will reach the other end of a signal path (i.e., the second modem at the network interface located at the customer premises equipment end of the system) before the other tone does. Accordingly, envelope delay distortion is an expected occurrence and technical problem to continually address and overcome with respect to bidirectional data transmission networks (or system). Various technical solutions to the envelope delay distortion problem are known in the art and have attempted to equalize the envelope delay distortion in some manner, albeit each unique approach having a specific shortcoming or disadvantage.

For example, one approach at solving this problem is shown by U.S. Pat. No. 4,663,583 (LUDWICK et al.) which is directed to an "Automatically Variable Phase Characteristic All-Pass Circuit" in which an automatically variable all-pass circuit includes a variable impedance circuit for changing the shape of the phase characteristic of the output signal of the all-pass circuit as a function of the amplitude of the output signal of the circuit is disclosed. This invention automatically changes the phase response of the all-pass filter, while leaving attenuation unchanged, while compensating the phase by adding an all-pass filter with both complementary and opposing phases. This particular approach, which uses a single element all-pass filter, will out of necessity result in very limited phase control (i.e., phase control cannot be achieved for the voice frequency band that is associated with conventional 4-wire telephone lines); to automatically change the phase response, a JFET is controlled in a way that the impedance will change the phase response of the all-pass filter (with the current that controls the JFET being inversely proportional to the length of the cable); and the impedance change (which controls the change in the phase response) is effective only in the high frequency range (100 KHz to 10 MHz). A second approach at solving this problem is shown by U.S. Pat. No. 5,061,925 (SOOCH et al.) which is directed to a "Phase Equalization System For A Digital-To-Analog Converter Utilizing Separate Digital And Analog Sections" in which a phase equalization system for a digital-to-analog converter is disclosed. In operation, this invention provides phase compensation by adding a digital filter with complementary and opposing phases, but this approach is limited to a very finite frequency range of between 30–60 KHz; the expected amplitude response will compensate the magnitude response of the associated analog circuitry, while the targeted phase response will compensate for the phase deviation of the associated analog filter; and the resulting phase control will be effective for only the lower frequency range (DC to 30 Hz), but phase control cannot be effectively achieved for the voice frequency band that is associated with conventional 4-wire telephone lines. A third approach at solving this problem is shown by U.S. Pat. No. 5,181,228 (TAKATORI) which is directed to a "System And Method For Phase Equalization" in which a phase equalizer for a bidirectional communications system for reducing precursor intersymbol interference without any substantial degradation in signal to noise ratio is disclosed. In operation, this invention provides phase compensation by adding a digital filter with complementary and opposing phases, and utilizes a switched capacitor filter, but not an all-pass filter, which also means that the amplitude response will be accordingly affected; the opening and closing of switches at particular frequencies are used to change the expected phase response, as the coefficients of the filter can be changed accordingly; and the phase control achieved is effective at a higher frequency range (1 KHz to 100 KHz) than the voice frequency band necessary for telecommunications equipment. Lastly, each of the prior art references noted above, in a technical sense, is limited to a single-variable approach, rather than a more sophisticated multi-variable technical approach.

Currently, the process used to achieve delay equalization of telephone lines is a tedious, time consuming, manual process typically involving two technicians (e.g., one at each end for the receive and the transmit paths of the conventional 4wire bidirectional telephone line), and various associated test equipment, adjusting, aligning, and tuning (and in some instances retuning and/or fine-tuning) individual frequency-sensitive band-pass filters over a particular predetermined frequency range of the voice band to achieve the precise delay equalization for each transmit and receive paths of the associated telephone line. Generally, this approach requires approximately 30–70 man-hours to complete and is quite costly. It would be a big advantage to the service provider of telephone lines to be able to provide for delay equalization of any particular telephone line in a more dynamic manner so as to minimize the burdensome costs currently associated with delay equalization approaches presently utilized, by having a portable, microprocessor-based telecommunications interface that would automatically achieve delay equalization of a specified telephone line over particular frequencies intervals of the voice frequency range. Another advantage would be that software to operate the associated microprocessor and/or digital signal processors could be routinely updated, or modified, on a regular or "as needed" basis as things change over time. Presently, such a system, related telecommunications apparatus, or general approach are lacking in the art.

SUMMARY OF THE INVENTION

Accordingly, a general object of the present invention is to provide a multi-variate system that has a microprocessor-based telecommunications interface which has automatically variable delay distortion equalization circuitry and which provides both pre and post delay distortion equalization on the transmit and receive sides of bidirectional data lines (or dedicated telephone lines).

It is a further object of the present invention to provide a microprocessor-based telecommunications interface which has automatically variable delay distortion equalization circuitry and which provides both pre and post delay distortion equalization on the transmit and receive sides of bidirectional data lines (or dedicated telephone lines) and which interfaces a conventional 4-wire analog facility and a data station termination at the customer premises equipment.

Another object of the present invention is to provide a multi-variate system that has a microprocessor-based telecommunications interface which has a digital adaptive all-pass filter and automatically variable delay distortion equalization circuitry, which in combination provides both pre and post delay distortion equalization on the transmit and receive sides of bidirectional data lines (or dedicated telephone lines).

Another object of the present invention is to provide a microprocessor-based telecommunications interface which has a digital adaptive all-pass filter and automatically variable delay distortion equalization circuitry, which provides both pre and post delay distortion equalization on the transmit and receive sides of bidirectional data lines (or dedicated telephone lines) and which interfaces a conventional 4-wire analog facility and a data station termination at the customer premises equipment.

It is still a further object of the present invention to provide a method to automate both pre and post delay distortion equalization of the transmit and receive paths for a conventional telephone line.

This invention is directed to solving these and other disadvantages of the prior art.

In accordance with an illustrative embodiment of the present invention there is provided a multi-variate system for the automatic delay distortion equalization of an associated receive and/or transmit signal path of an associated analog communications channel, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination: an analog transmission facility and associated transmission medium comprising in combination: means for originating a analog signal from a predetermined location over a plurality of analog communications channels, the analog transmission facility having an originating first end and a terminating second end, the first end and the second end being operatively coupled by a plurality of analog transmission spans of predetermined lengths; means for transmitting an analog signal over the communications channel including any predetermined transmission span to the end-user location selected from a plurality of end-user locations; and means for receiving the analog signal from the communications channel by the end-user location selected from a plurality of end-user locations; means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising: means for operatively locating the interface at a predetermined location within the transmit signal path and/or the receive signal path of the communications channel, the predetermined location selected from a plurality of available locations positioned between the end-user location and the telecommunications network; in response to a predetermined test actuated by the interface, means for aligning the interface in the signal path, the aligning means including associated processor means, the processor means having associated logic operatively coupled thereto, thereafter the processor means acquires information directed to determine the actual envelope delay distortion present for predetermined frequency ranges of the communications channel, thereafter the processor means determines variables with respect to the predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means; digital signal processing means for the signal processing of the signal in a predetermined manner, the signal processing means having associated logic operatively coupled thereto, the signal processing means determines the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for the telephone line.

In accordance with another illustrative embodiment of the present invention there is provided an intelligent envelope delay distortion equalization telecommunications interface for an associated analog communications channel, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising: means for operatively locating the interface at a predetermined location within the transmit signal path and/or the receive signal path of the communications channel, the predetermined location selected from a plurality of available locations positioned between the end-user location and the telecommunications network; in response to a predetermined test actuated by the interface, means for aligning the interface in the signal path, the aligning means including associated processor means, the processor means having associated logic operatively coupled thereto, thereafter the processor means acquires information directed to determine the actual envelope delay distortion present for predetermined frequency ranges of the communications channel, thereafter the processor means determines variables with respect to the predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means; digital signal processing means for the signal processing of the signal in a predetermined manner, the signal processing means having associated logic operatively coupled thereto, the signal processing means determines the requisite phase shift of the signal for the predetermined frequency ranges to compensate for the envelope delay distortion for the communications channel, the signal processing means operatively coupled to an associated digital adaptive all-pass filter means; and digital adaptive all-pass filter means, the filter means having associated logic operatively coupled thereto, the filter means having an automatically variable center all pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for the telephone line.

Briefly, according to one embodiment of the present invention, a method is further provided for the envelope delay distortion equalization of a transmit and/or receive signal path of an associated analog communications channel, the communications channel selected from a plurality of available communications channels, the communications channel having an associated analog signal having an associated frequency and an associated phase, comprising the steps of: operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network; originating a predetermined test in response to a command from a predetermined location, the predetermined location selected from a plurality of available locations positioned between the end-user location and the telecommunications network; aligning the interface means in the signal path, thereafter, in response to a predetermined test actuated by the interface, the interface means including associated processor means, the processor means having associated logic operatively coupled thereto, thereafter the processor means acquires information directed to determine the actual envelope delay distortion present for predetermined frequency ranges of the communications channel, thereafter the processor means determines variables with respect to the predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means; digital signal processing the signal in a predetermined manner, the interface means including digital signal processing means having associated logic operatively coupled thereto, the signal processing means determines the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges for the telephone line.

Other objects, features, and advantages of this invention will become apparent from the following detailed description of the preferred embodiment of this invention, as illustrated in the accompanying drawings.

BRIEF DESCRIPTION OF THE DRAWINGS

The foregoing summary, and other objects, features, and advantages of the present invention, its organization, construction and operation, together with further objects and advantages thereof, will be best understood from an examination of the following description of the preferred embodiment of the invention will be better understood when read in connection with the accompanying drawings. For the purpose of illustrating the invention, there is shown in the drawings an embodiment which is presently preferred, it being understood, that the invention is not limited to the specific methods and apparatus disclosed.

FIG. 1 is a diagrammatic representation illustrating the prior art of a telecommunications system for a conventional analog facility which contains a quantifiable envelope delay distortion of a signal with respect to the transmission or reception signal paths of the system.

FIG. 2 is a graph which depicts the overall delay distortion with respect to transmission and reception of the signal in the telecommunications system illustrated in FIG. 1.

FIG. 3 is a diagrammatic representation illustrating a system for the automatic delay distortion equalization for the receive and/or transmit signal paths, the system utilizing an intelligent telecommunications interface having automatic adaptive delay distortion equalization built in accordance to the present invention.

FIG. 4 is a diagrammatic representation illustrating a part of the system depicted in FIG. 3 for the automatic delay distortion equalization for the receive and/or transmit signal paths, the system utilizing an intelligent telecommunications interface having automatic adaptive delay distortion equalization built in accordance to the present invention.

FIGS. 19A–D are a detailed electrical schematic circuit diagram of the digital signal processing integrated circuit (receive side) and electronic circuitry which is used to implement a particular embodiment of the intelligent telecommunications interface having automatic adaptive delay distortion equalization built in accordance with the present invention.

FIG. 20 is a diagrammatic representation of an all pass filter which is used to implement a particular embodiment of the intelligent telecommunications interface having automatic adaptive delay distortion equalization built in accordance with the present invention.

FIG. 21 is a graph illustrating the delay from nine different circuits depicting a common pattern for all the curves with respect to a particular embodiment of the intelligent telecommunications interface having automatic adaptive delay distortion equalization built in accordance with the present invention.

FIGS. 22A and 22B are respective graphs illustrating the delay curve and the resulting compensating inverse delay curve pattern with respect to a particular embodiment of the intelligent telecommunications interface having automatic adaptive delay distortion equalization built in accordance with the present invention.

FIG. 24 is a graph illustrating the combination of three different second order all pass filter delay stages to match the inverse delay curve pattern with respect to a particular embodiment of the intelligent telecommunications interface having automatic adaptive delay distortion equalization built in accordance with the present invention.

FIG. 25 is a graph illustrating the use of a specific inverse delay digital filter for a particular embodiment of the intelligent telecommunications interface having automatic adaptive delay distortion equalization built in accordance with the present invention.

DETAILED DESCRIPTION OF THE PREFERRED EMBODIMENT

Figure 5A:
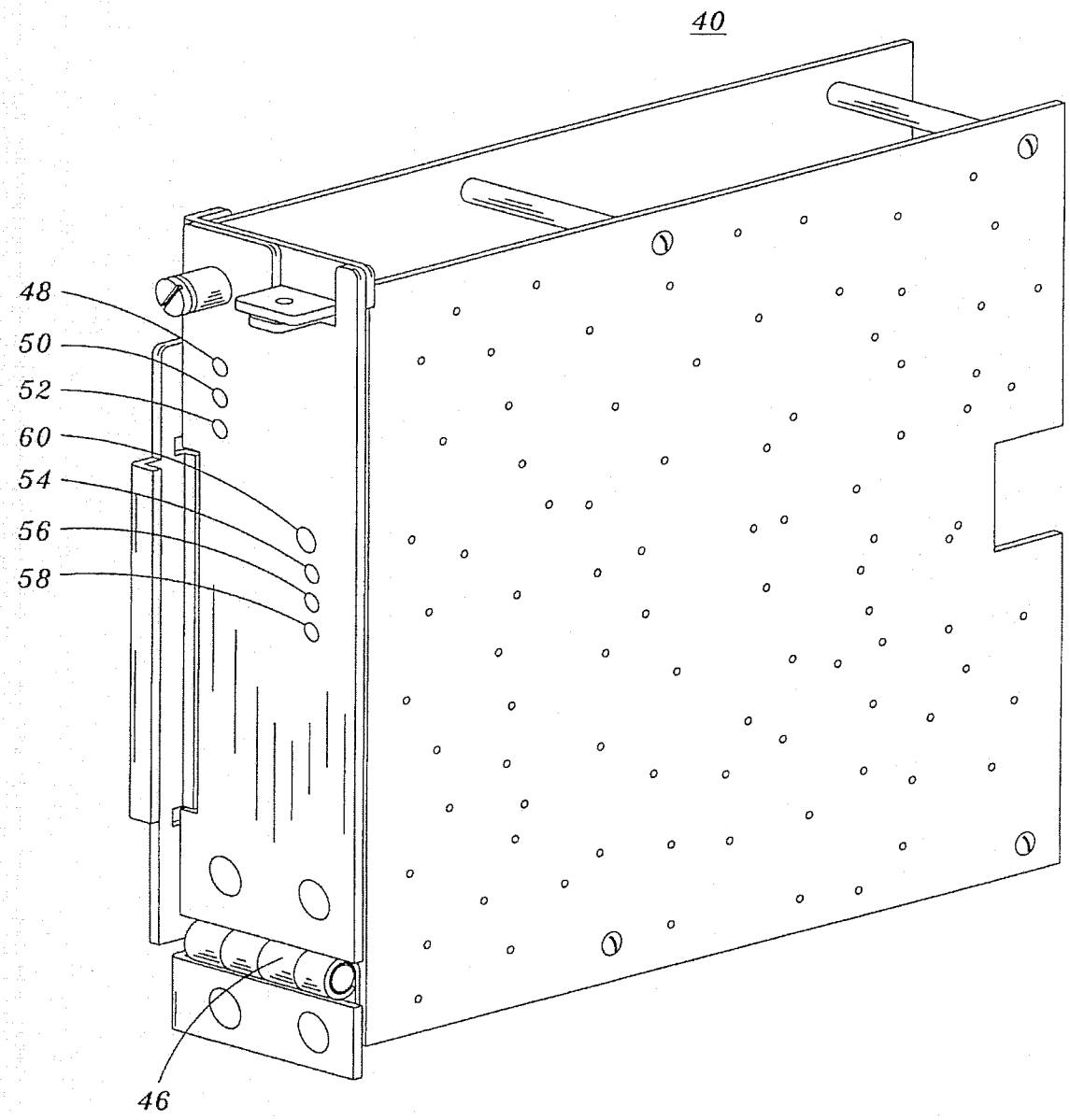
FIGS. 5A and 5B are perspective views (front and rear) of the intelligent telecommunications interface having automatic adaptive delay distortion equalization depicted in FIGS. 3 and 4 built in accordance with the present invention.

Referring to the drawings wherein like-referenced numerals indicate like elements throughout, there is shown in FIG. 1 a diagrammatic representation illustrating the prior art of a telecommunications system 10 for a conventional analog facility (or dedicated telephone line) which contains a determinable and quantifiable envelope delay distortion of a signal with respect to the transmission or reception signal paths (or circuits) of the telecommunications system. Referring to FIG. 1, the arrows show the direction of signal flows for the transmission and/or reception signal paths for the transmit and receive sides of the conventional full-duplex 4-wire analog facility (or the equivalent) for that part of the telecommunications system illustrated. A modem 12 is located at each end of a telephone line (only one of which is shown) is used to convert binary digital information to audio tone signals suitable for transmission over the line, and vice versa, and with a 4-wire line facilitates the simultaneous transmission in both directions (full duplex) with a modem at each end. The analog transmission path will eventually end-up at a central office 14 of a service provider where the signal will be converted to a digital signal, and be reconverted to an analog signal at the other end of the telecommunications system, where the analog signal will reach the other modem at the user location or network interface. The transmission path is composed of cable transmission spans and intelligent ETO and ETO, where the signal is converted from analog-to-digital, and from digital-to-analog. The data signal termination (DST) 16 which is the device that is located at customer premises to compensate for amplitude losses on the reception signal path and to terminate analog telephone line. At the central office of the local carrier, the equalized transmission only channel unit (ETO) 18 which is where the amplitude of the telephone line is equalized for frequency at the central office (i.e., equalization is provided on the transmission path side to compensate for amplitude losses and analog-to-digital conversion). At the central office of the local carrier, the transmission only channel unit (TO) 18 which is where the non-equalized amplitude of the telephone line is converted. The minimum point of presence (MPOP) 20 which is the point of connection between the local carrier and the long-distance carrier. Delay distortion of the signal for either the transmit and/or receive paths means that on a spectral basis, one tone will reach the other end of the telecommunications system before the other does.

Certain test equipment that is common to the industry (i.e., Ameritec AM5XT transmission test equipment 22, or its equivalent) is located at each end of a particular signal path are used to facilitate routine and standardized tests procedures in order to calculate the envelope delay distortion that actually exists at various frequency ranges for a particular signal path (transmit and/or receive). Presently, delay equalization of an individual signal path, either for transmission and/or reception, in the telecommunications system is manually accomplished by a couple of technicians in conjunction with certain test equipment and test procedures that are common to the telecommunications industry (e.g., Ameritec AM5XT transmission test equipment, or its equivalent). As previously stated, this process is time and labor intensive, and is prone to less than ideal results over the entire voice band spectrum to achieve delay equalization for each respective pair of transmission and reception signal paths for each telephone line in the system, and takes on the order of 60–70 manhours to complete involving up to 40 separate switches to manually adjust, resulting in up to 13 discrete band-pass filters to tune and re-tune (for each two-pair receive and transmit combinations).

In FIG. 2, there is shown a graph 30 which depicts the typical overall delay distortion 32 present with respect to transmission and/or reception signal paths in the telecommunications system illustrated in FIG. 1. Envelope delay distortion is a result of the non-linear characteristics of the transmission path. Referring to FIG. 2, the typical total delay distortion is measured in milliseconds (Ms) with different types of delay distortion occurring at various frequency ranges for different underlying reasons. The overall delay is composed of separate individual delays (on a system-wide basis) contained in the system which are inserted (i) by the multiple A/D and D/A conversions (i.e., A/D and D/A conversion is done on the codecs so a DST is able to perform an amplitude equalization and A/D conversion is made to interface with the transmission spans to and from the central office of a digital carrier service provider [e.g., T1, T3, ISDN, etc.]); (ii) by the occurrence of low band-pass filtering (i.e., a typical phone line is band-limited to 300 Hz to 3.3 KHz by the use of band-pass filters); (iii) by the cable used for the transmission and reception paths (i.e., different cable configurations offset a variety of phase distortions, adding ripple to the delay in the 300 Hz to 3.3 KHz band); and (iv) the more A/D or D/A conversions there are in the system, the greater will be the signal delay at the high end (i.e., to provide the system with anti-aliasing each A/D and D/A conversion associated with the low band-pass filter used for the anti-aliasing results in a low pass filter having an out frequency at 4 KHz).

In FIG. 3, there is shown a diagrammatic representation illustrating a system 36 for the automatic delay distortion equalization for the receive and/or transmit signal paths, the system utilizing an envelope delay distortion equalization telecommunications interface 40 having automatic adaptive delay distortion equalization built in accordance to the present invention. Referring to FIG. 3, the arrows show the direction of signal flows for the transmission and/or reception signal paths for the transmit and receive sides of the conventional full-duplex 4-wire analog facility for that part of the telecommunications system illustrated. The envelope delay distortion equalization telecommunications interface 40 (also, hereafter referred to as the "interface" or the "intelligent telecommunications interface" or the "delay equalization interface") automatically provides software filters for both receive (i.e., pre-delay distortion equalization) and/or transmit (i.e., post-delay distortion equalization) delay distortion equalization for a conventional bi-directional telephone line of the telecommunications system of up to 3000 us delay from 300 to 3200 Hz. Suitable transmission test equipment (i.e., Ameritec AM5XT transmission test equipment, or its equivalent) is located at each end of a particular signal path and is used the delay equalization interface to facilitate its alignment sequence and in order to calculate the actual envelope delay distortion that currently exists at various frequency ranges for a particular signal path (transmit and/or receive). For purposes of operation of the delay equalization interface, following the delay equalization interface's proper alignment in the respective signal path, and after the determination of the actual envelope delay present for a respective signal path (transmit and/or receive), the transmission test equipment is no longer required by the interface to properly operate and could be removed from the telecommunications system, that is, until the next time the delay equalization interface has to re-align itself for a respective signal path for whatever reason by re-initiating its alignment sequence and by re-calculating the actual envelope delay distortion present for a respective signal path.

In FIG. 4, there is shown a diagrammatic representation illustrating a portion of the system 36 depicted in FIG. 3 for the automatic delay distortion equalization for the receive and/or transmit signal paths, the system utilizing an intelligent telecommunications interface 40 having automatic adaptive delay distortion equalization built in accordance to the present invention. Referring to FIG. 4, the arrows show the direction of signal flows for the transmission and/or reception signal paths for the transmit and receive sides of the conventional full-duplex 4-wire analog facility for that part of the telecommunications system illustrated. The delay equalization interface has a RS-232 serial port 42 to effectuate communications with the transmission test equipment 22 for the receive and/or transmit signal path. With respect to the receive and/or transmit signal paths, there is a near end 44 and a far end 46, each of which has corresponding transmission test equipment 22, with the delay equalization interface 40 positioned in a respective transmit and/or receive signal path near the conventional network interface 38 (or its equivalent) at the near end. The connection of the delay equalization interface 40 to the transmission test equipment 22 is accomplished through RS-232 serial port 42.

Figure 5B:
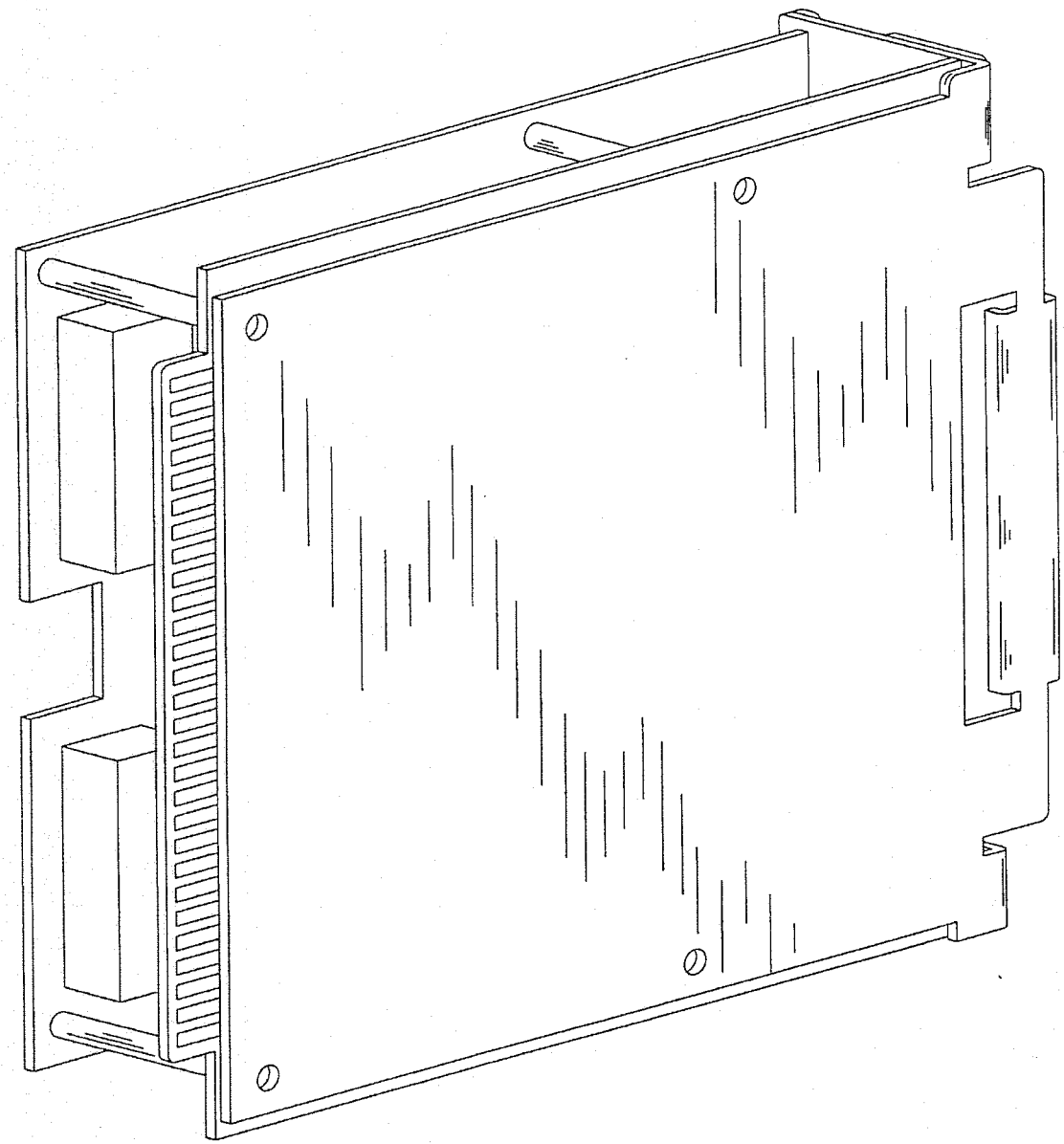

In FIGS. 5A and 5B, there is shown perspective front and rear views of the intelligent telecommunications interface 40 having automatic adaptive delay distortion equalization depicted in FIGS. 3 and 4 built in accordance with the present invention. Referring to FIGS. 5A and 5B, the interface 40 (dimensions: 5.6" high by 6.0" long by 1.4" wide; operating voltage: input −42 to −56 Vdc (−48 Vdc typical) at 40 mA typical) connects a 4-wire analog facility (or the equivalent) for a dedicated bi-directional telephone line, and a data station termination (DST) at the location of the customer premises location (or the equivalent location for non-public communications networks) to provide pre-delay and post-delay distortion equalization of each respective receive and/or transmit signal paths of up to 3000 us delay from 300 to 3200 Hz. The delay equalization interface installs in a modular 400-type shelf mounting which makes a conventional card-edge pin-out electrical connection for the interface and which is used to connect the interface with the telecommunications system. See TABLE I hereafter for the specific pin-out definitions for the delay equalization interface. The delay equalization interface 40 is equipped with a RS-232 asynchronous serial communication port (i.e., this serial port is 9600 baud, no parity, one stop bit, 8 data bits). This communication port is used solely during the delay equalization interface's alignment sequence for the purpose of communicating with an Ameritec AM5XT transmission test equipment (or the equivalent) and is not required during normal operation of the interface.

The delay equalization interface has a return loss equal to 22 dB minimum ERL facility side vs. 600 ohms; has longitudinal balance equal to 60 dB minimum from 300 to 3200 Hz; has total loss (Transmit and Receive) equal to 0 dB (±0.25 dB); and has a frequency response equal to 0.1 dB referenced at 1004 Hz.

The delay equalization interface has a hinged front panel 46 with certain LED status indicators, namely, (i) POWER: a green LED 48 lights when power is applied; (ii) R DATA: a yellow LED 50 lights when data/tone is being received from the DST; (iii) X DATA: a yellow LED 52 lights when data/tone is being transmitted toward the DST; (iv) READY: a yellow LED 54 flashes during self-test and lights steady when delay equalization interface is ready for alignment; (v) R ALIGN: a green LED 56 lights when receive path is aligned and equalization is set; (vi) X ALIGN: green LED 58 lights when transmit path is aligned and equalization is set. The RS-232 port is located behind the front panel of the interface and is used for interfacing an Ameritec AM5XT transmission test equipment (or the equivalent test equipment) during alignment of the interface.

The front panel of the interface has a push-button type switch 60 (CLEAR/ALIGN) which functions to clear the delay equalization interface of delay equalization settings during installation and initiates the alignment sequence of the interface in the signal path. This switch serves a dual function by allowing the user to reset the delay equalization to zero, or to activate the delay equalization interface's alignment sequence from on-site, as follows: (i) Delay Equalizer Clear: Pressing and releasing the front-panel CLEAR/ALIGN push-button switch for five seconds causes the delay equalization to automatically reset to zero. Should a new installation be involved, the delay equalization interface must be reset to zero delay equalization in both the receive and transmit directions. When the delay equalization interface is reset to zero, the READY LED will light steady. A READY LED indicates the delay equalization interface is ready to be aligned. (ii) Alignment: Pressing the CLEAR/ALIGN push-button switch a second time for five seconds, subsequently releasing the switch, causes the delay equalization interface alignment sequence to begin. The front-panel R ALIGN and X ALIGN LEDs, when lit, indicate that both the receive and transmit paths are aligned. During the alignment sequence, the R ALIGN and X ALIGN LED will flash. Alignment for the delay equalization interface consists of aligning the receive path followed by aligning the transmit path. Please note that during the alignment sequence, two AM5XT transmission test equipment sets (or the equivalent) are required.

The Alignment Sequence: (i) Response Tones: the FAR END AM5XT transmission test equipment sends a set of delay equalization sweep tones. These tones are amplitude modulated and start at 63 Hz and increase in 100 Hz increments to 3263 Hz. Each tone output by the transmission test equipment lasts approximately four seconds. The NEAR END transmission test equipment receives these tones and determines the delay (in microseconds) for each tone sent. The resulting information is then forwarded to the delay equalization interface by the RS-232 communications port. The delay equalization interface uses this information to adjust its associated delay equalization circuitry. The R DATA and X DATA LEDs, when lit, indicate tone activity. (ii) Alignment—Receive: the NEAR END starts the alignment sequence. This is accomplished by pressing the front panel CLEAR/ALIGN button for greater than five seconds. The receive path alignment sequence is in progress as indicated by a flashing R ALIGN LED. Completion of receive path alignment is indicated by a steadily lit R ALIGN LED. (iii) Alignment—Transmit: transmit equalization is essentially the same as that described for the receive path. The NEAR END starts the transmit path alignment by sending DTMF signals to the FAR END transmission test equipment. The transmit path alignment is progress as indicated by a flashing X ALIGN LED. Completion of transmit path alignment is indicated by a steadily lit X ALIGN LED. Alignment of the delay equalization interface will occur in less than 20 minutes.

Figure 6:
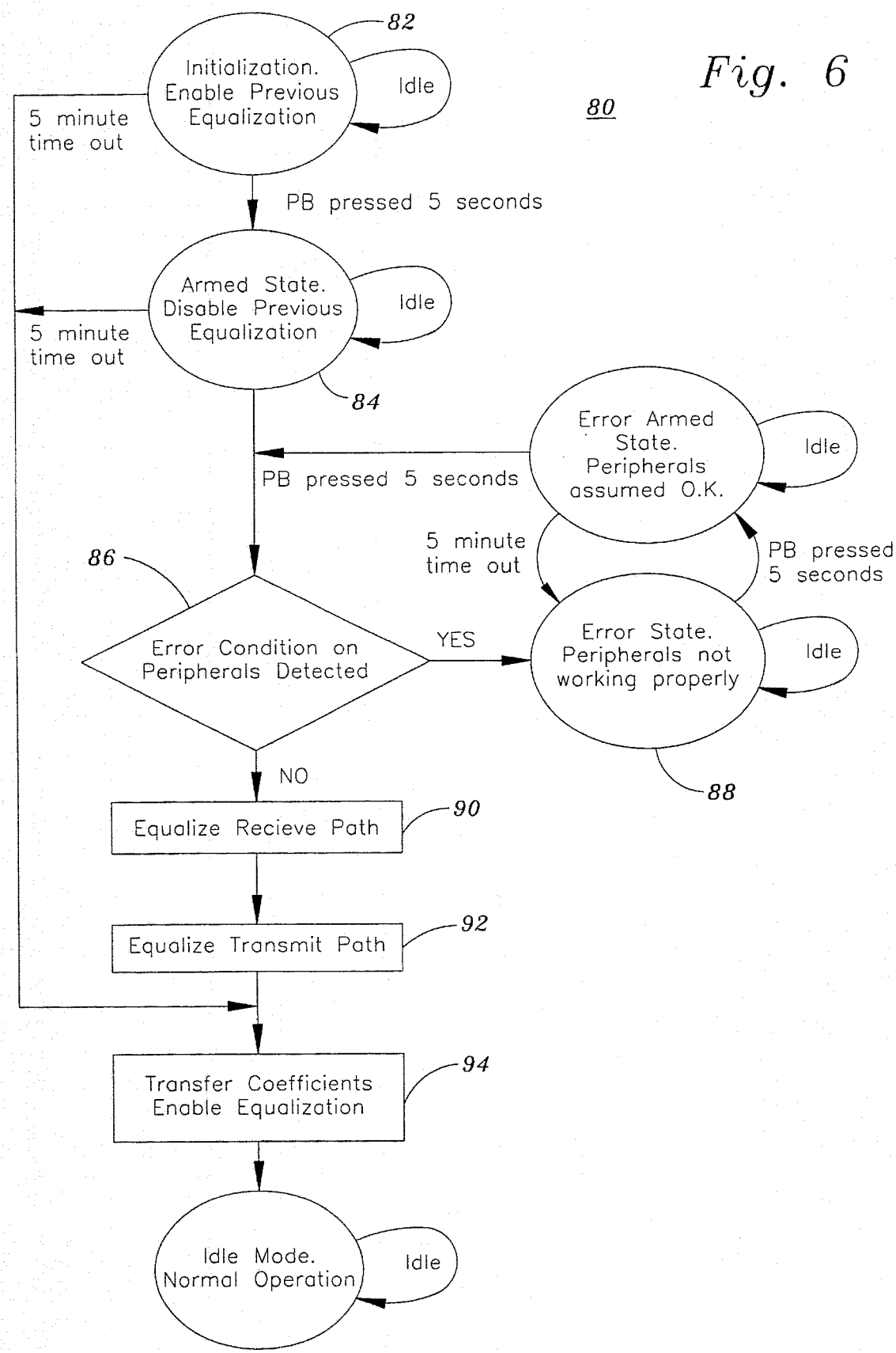
FIG. 6 is a flowchart illustrating the specific sequence of operations performed for the basic overall operation of the intelligent telecommunications interface of FIGS. 3 and 4 in accordance with the present invention.

In FIG. 6 there is shown a flowchart 80 illustrating the specific sequence of operations performed for the basic overall operation of the intelligent telecommunications interface 40 of FIGS. 3 and 4 in accordance with the present invention. Referring to FIG. 6, upon power-up the delay equalization interface will enter the "start-up state" cycle 82, begin a 5 minute time-out cycle, load the previous compensation coefficients (if available), and wait for the push-button switch to be pressed. If no action is taken, or the push-button not pressed, then at the end of the 5 minute time-out cycle the delay equalization interface will enter an associated "normal operation" mode. In this mode of operation, the delay equalization interface will utilize the previously calculated compensation coefficients and not respond to any depressions of the push-button switch. Should the push-button switch be pressed for more than 5 seconds, the delay equalization interface will clear the previous coefficients (no compensation), begin another 5 minute time-out cycle, and wait for the push-button switch to be pressed for another 5 seconds. This is referred to as the "armed state" 84. If no action is taken, and the push-button switch not pressed, at the end of the 5 minute time-out cycle, the delay equalization interface will enter a "normal operation" mode. In this mode, the delay equalization interface will utilize the previous compensation coefficients and not respond to depressions of the push-button switch. If the push-button switch is pressed for more than 5 seconds while in the "armed state", the delay equalization interface will start an equalization process. If a peripheral error is detected 86, such as the test set does not respond properly, the delay equalization interface will enter an "error state" 88. In the "error state", the delay equalization interface will flash appropriate LEDs to indicate the error status with respect to what the peripheral problem is related to. To exit the "error state", and re-enter the "armed state" the push-button switch must be depressed for 5 seconds. From the "armed state", another equalization cycle can be started by depressing the push-button switch for 5 seconds. If no errors were detected, the receive path is tested and a set of compensating coefficients are calculated by the interface. After the receive path is equalized 90, the same process is done on the transmit path 92. When both paths have be equalized, the new compensation coefficients are utilized and saved for future use 94 at a new power-up of the interface. The delay equalization interface then enters the "normal operation" mode as previously described.

Figure 7:
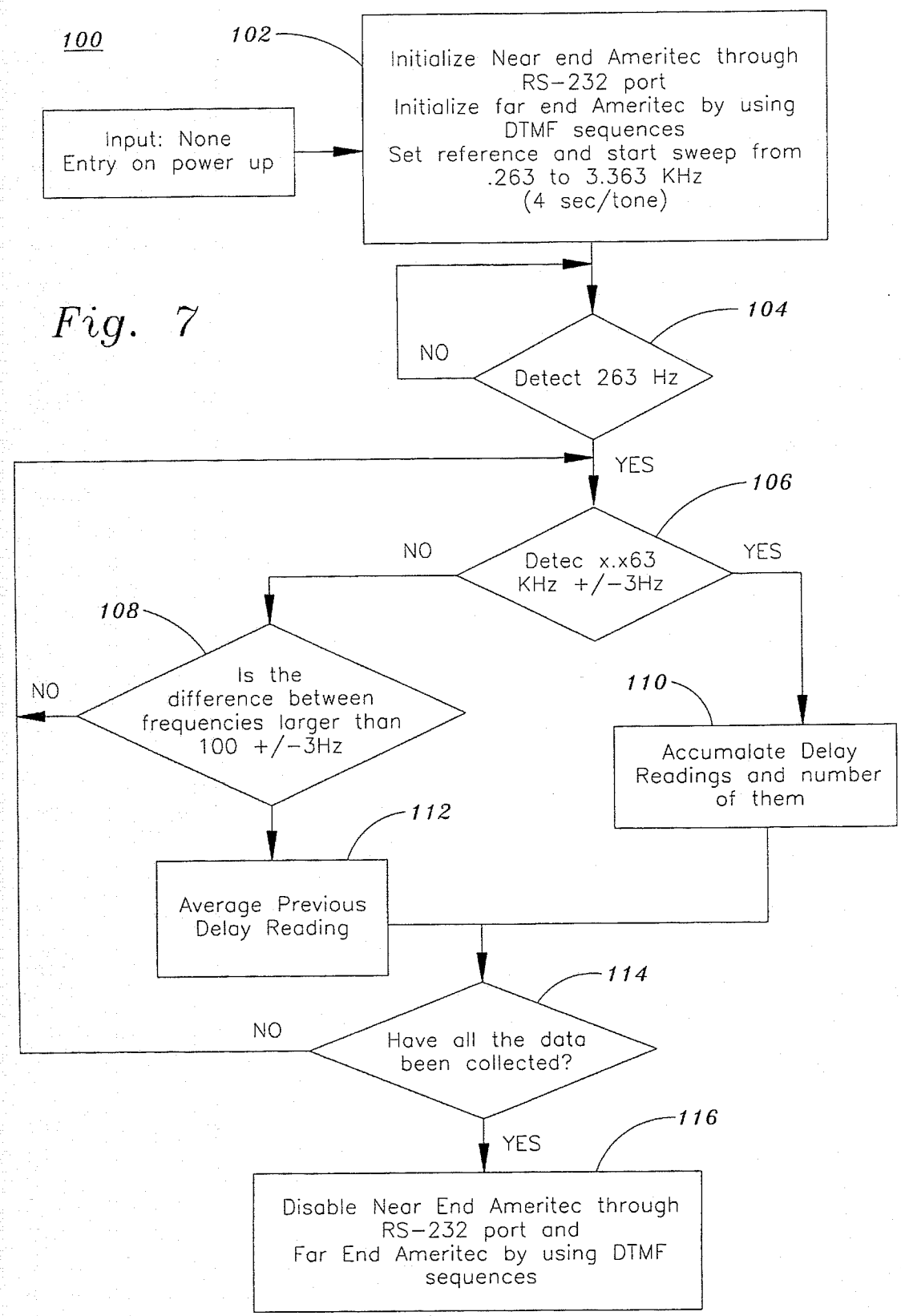
FIG. 7 is a flowchart illustrating the specific sequence of operations performed for the data test equipment communications pertaining to the test sequence and data collection with respect to the frequency received and the resulting delay from a reference time by the intelligent telecommunications interface depicted in FIGS. 3 and 4 in accordance with the present invention.

In FIG. 7 there is shown a flowchart 100 illustrating the specific sequence of operations performed for the data transmission test equipment communications pertaining to the test sequence and data collection with respect to the frequency received and the resulting delay from a reference time by the intelligent telecommunications interface 40 depicted in FIGS. 3 and 4 in accordance with the present invention. Referring to FIG. 7, communications with the remote transmission test equipment is started by sending data to the transmission test equipment through the RS-232 serial port on the delay equalization interface. The near-end and far-end transmission test equipment are initialized 102 by the delay equalization interface. The reference is set and the start of the frequency sweep is set to 263 Hertz, with the end of the frequency sweep at 3363 Hertz at 4 seconds per tone. The sweep is then started. Test data is sent from the transmission test equipment to the delay equalization interface by the RS-232 port. The data consists of the frequency received and the delay from the reference time. The delay equalization interface then waits until the transmission test equipment sends data that the tone received is 263 Hertz 104. This data is then stored for later use. The delay equalization interface then waits until the next tone is detected 106. If it is on a 63 Hertz boundary, it is stored; if not, it is tested 108 to see if it is at least 100 Hertz greater than the last tone received. If so, it is stored 110, otherwise the delay equalization interface wait until these above requirements are fulfilled. Once the data is stored 112, a check is made to check if all frequencies have been received 114. If not the delay equalization interface will wait for the next detected tone, as described above. Once all the frequencies are received 114, the transmission test equipment are turned-off 116 by data through the RS-232 port on the delay equalization interface.

Figure 8:
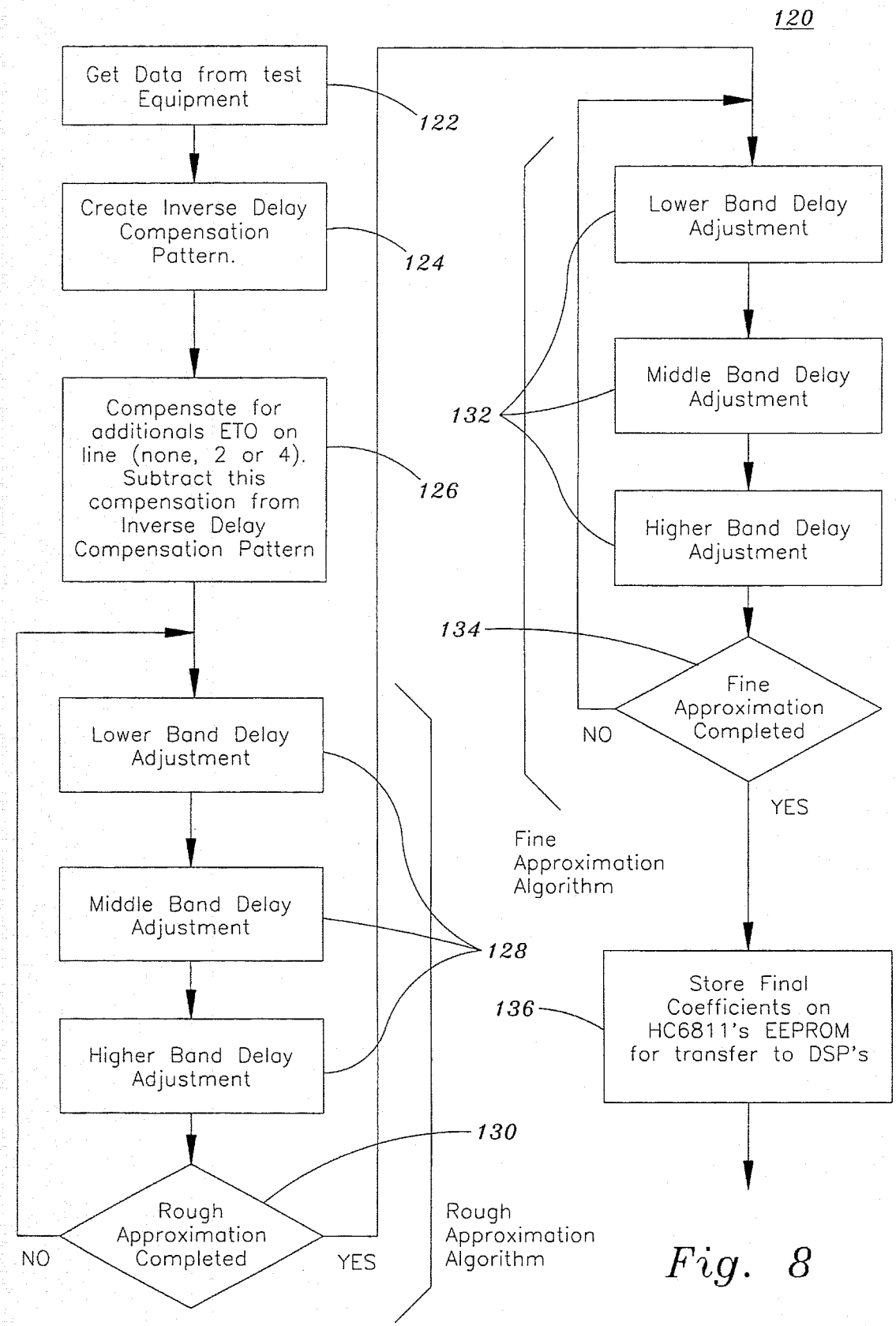
FIG. 8 is a flowchart illustrating the specific sequence of operations performed for the equalization procedure and the calculation of the actual envelope delay distortion present for the receive and/or transmit signal paths by the intelligent telecommunications interface depicted in FIGS. 3 and 4 in accordance with the present invention.

In FIG. 8 there is shown a flowchart 120 illustrating the specific sequence of operations performed for the equalization procedure and the calculation of the actual envelope delay distortion present for the receive and/or transmit signal paths by the intelligent telecommunications interface 40 depicted in FIGS. 3 and 4 in accordance with the present invention. Referring to FIG. 8, the data used for the equalization process is obtained from the transmission test equipment 122. From this data an actual present delay curve is calculated 124. An inverse of this curve in then calculated, which is used for the following equalization process and the three bands of filters are adjusted to adapt a resulting combined filter to produce the inverse curve. From the original delay curve, the upper-end is examined to determine the added compensation 126 required for the multiple ETOs in the circuit (i.e., as previously discussed, each ETO introduces delay at the upper-end due to the multiple A/D and D/A conversions). Each of the band filters 128 (a,b,c) and 132 (a,b,c) are adjusted in series to create a resulting curve that is close to the calculated inverse curve. The adjustment is of a course or nature to converge on the inverse curve in a timely fashion. This operation is continued until further adjustment produces no further increase in the curve matching 130 and 134. The above process is then repeated utilizing a smaller adjustment on each pass to produce a closer fit to the inverse curve. Once no further decrease in the curve matching error is obtained, the resulting coefficients are stored in nonvolatile memory 136 and are transferred to the digital signal processor (DSP) in the adjusted circuit. The same procedure is followed for the other signal path or circuit (receive and/or transmit).

Figure 9:
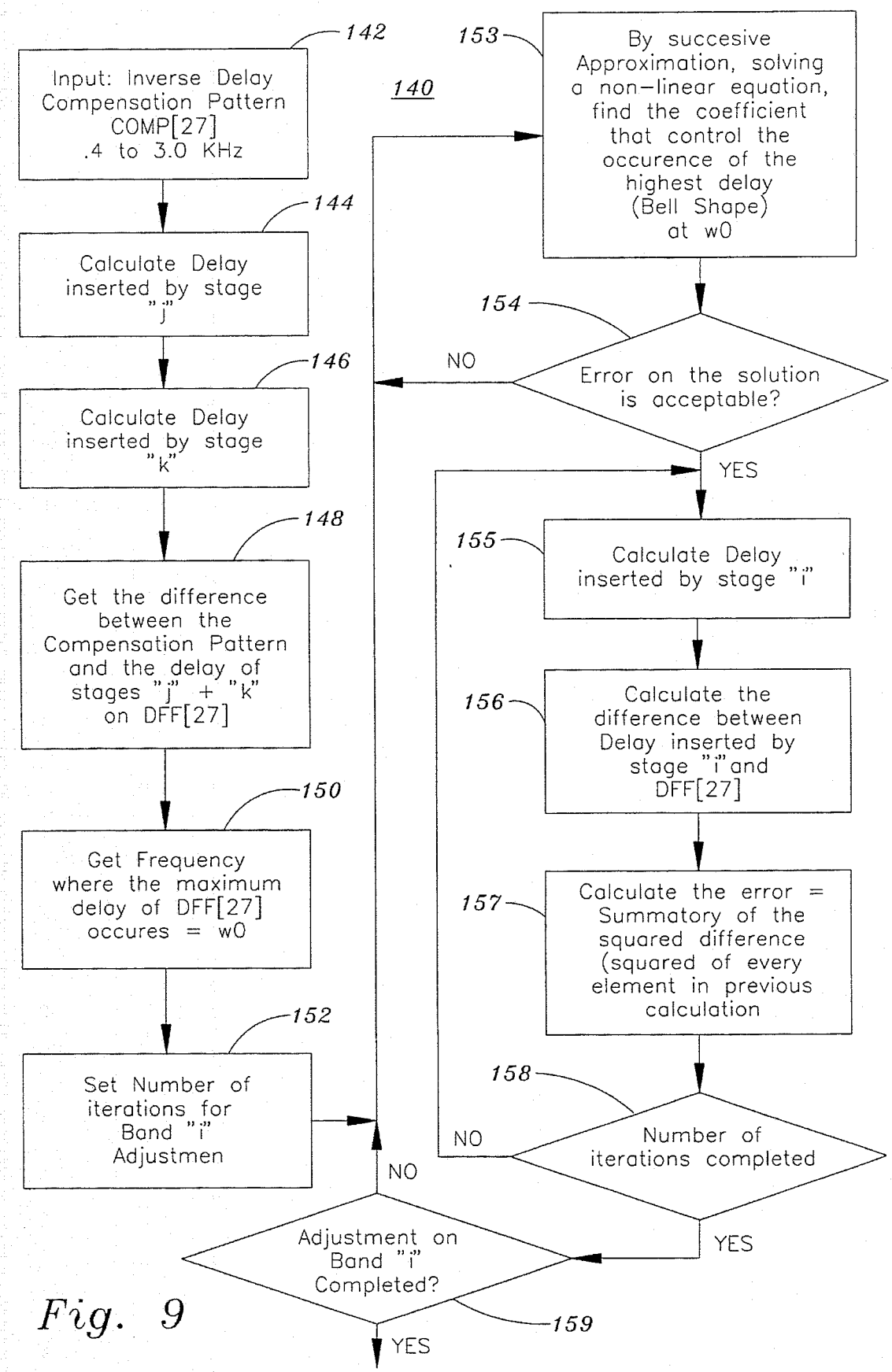
FIG. 9 is a flowchart illustrating the specific sequence of operations performed by successive approximation in a manner to minimize the difference between the combined filters and in inverse curve is minimized with respect to band "i" rough delay adjustment for each of three filters (lower, middle and upper) by the intelligent telecommunications interface depicted in FIGS. 3 and 4 in accordance with the present invention.

In FIG. 9 there is shown a flowchart 140 illustrating the specific sequence of operations performed by successive approximation in a manner to minimize the difference between the combined filters and an inverse curve is minimized with respect to band "i" rough delay adjustment (63 Hz to 3.363 KHz) for each of three filters (lower, middle and upper) by the intelligent telecommunications interface 40 depicted in FIGS. 3 and 4 in accordance with the present invention. Referring to FIG. 9, the band "i" rough delay adjustment algorithm uses a delay adjustment which will use the inverse curve of the measured delay as a reference. This curve covers the entire frequency band of 400 Hz to 3000 Hz 142. The delay inserted by the band filter "j" is calculated 144. The delay inserted by the band filter "k" is calculated 146. The difference between in delay is calculated between the combined filters j and k and the inverse curve 148. Determine the frequency of the maximum delay of above difference curve 150. Set the number of tries that the adjustment is to use 152. By successive approximation, find the coefficient that determines the maximum delay on the difference curve 153. Continue this process until the coefficient is producing the least error (minimum delay difference) 154. The delay inserted by the band filter "i" is calculated 155. The difference between in delay is calculated between the filter "i" and the inverse curve 156. Determine the frequency of the maximum delay of above difference curve. By successive approximation, find the coefficient that determines the maximum delay on the difference curve 157. Continue this process until the coefficient is producing the least error (minimum delay difference). This calculation of delay and then adjustment is continued for the number of iterations calculated 158. The operation of finding the frequency and then adjusting the lower band filter coefficients is continued until the difference in delay between the combined three filters and the inverse curve is minimized. This same operation is done on each of the three filters (lower, middle and upper) 159.

Figure 10:
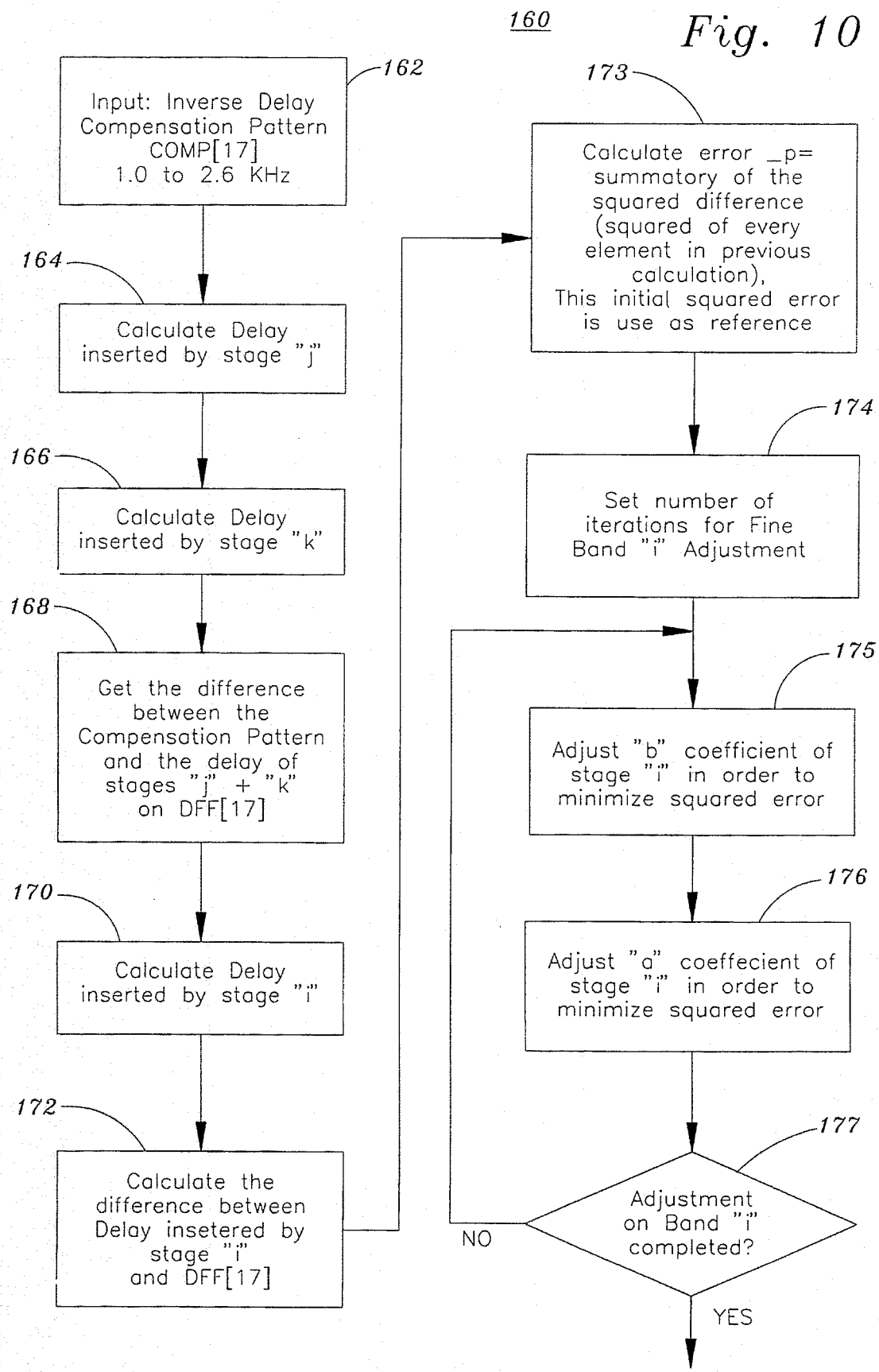
FIG. 10 is a flowchart illustrating the specific sequence of operations performed by successive approximation in a manner to minimize the difference in delay between the combined filters and the inverse curve with respect to band "i" fine delay adjustment for each of three filters (lower, middle and upper) by the intelligent telecommunications interface depicted in FIGS. 3 and 4 in accordance with the present invention.

In FIG. 10 there is shown a flowchart 160 illustrating the specific sequence of operations performed by successive approximation in a manner to minimize the difference in delay between the combined filters and the inverse curve with respect to band "i" fine delay adjustment (1.063 KHz to 2.663 KHz) for each of three filters (lower, middle and upper) by the intelligent telecommunications interface 40 depicted in FIGS. 3 and 4 in accordance with the present invention. Referring to FIG. 10, the band "i" fine adjustment algorithm uses a delay adjustment which will use the inverse curve of the measured delay as a reference. This curve covers the entire band of 100 Hz to 2600 Hz 162. The delay inserted by the band filter "j" is calculated 164. The delay inserted by the band filter "k" is calculated 166. The difference between in delay is calculated between the combined filters "j" and "k" and inverse curve 168. The delay inserted by the band filter "i" is calculated 170. The squared difference between in delay is calculated between the combined three filters and inverse curve 172. This difference is used as a reference 173. The number of iterations to be completed is then set 174. The "b" coefficient of the "i" is adjusted to minimize the above squared difference 175. The coefficient "a" of the "i" is adjusted to minimize the above squared difference 176. The operation of minimizing the difference in delay between the combined three filters and the inverse curve is continued until the difference is minimized. This same operation is done on each of the three filters (lower, middle and upper) 177.

Figure 11:
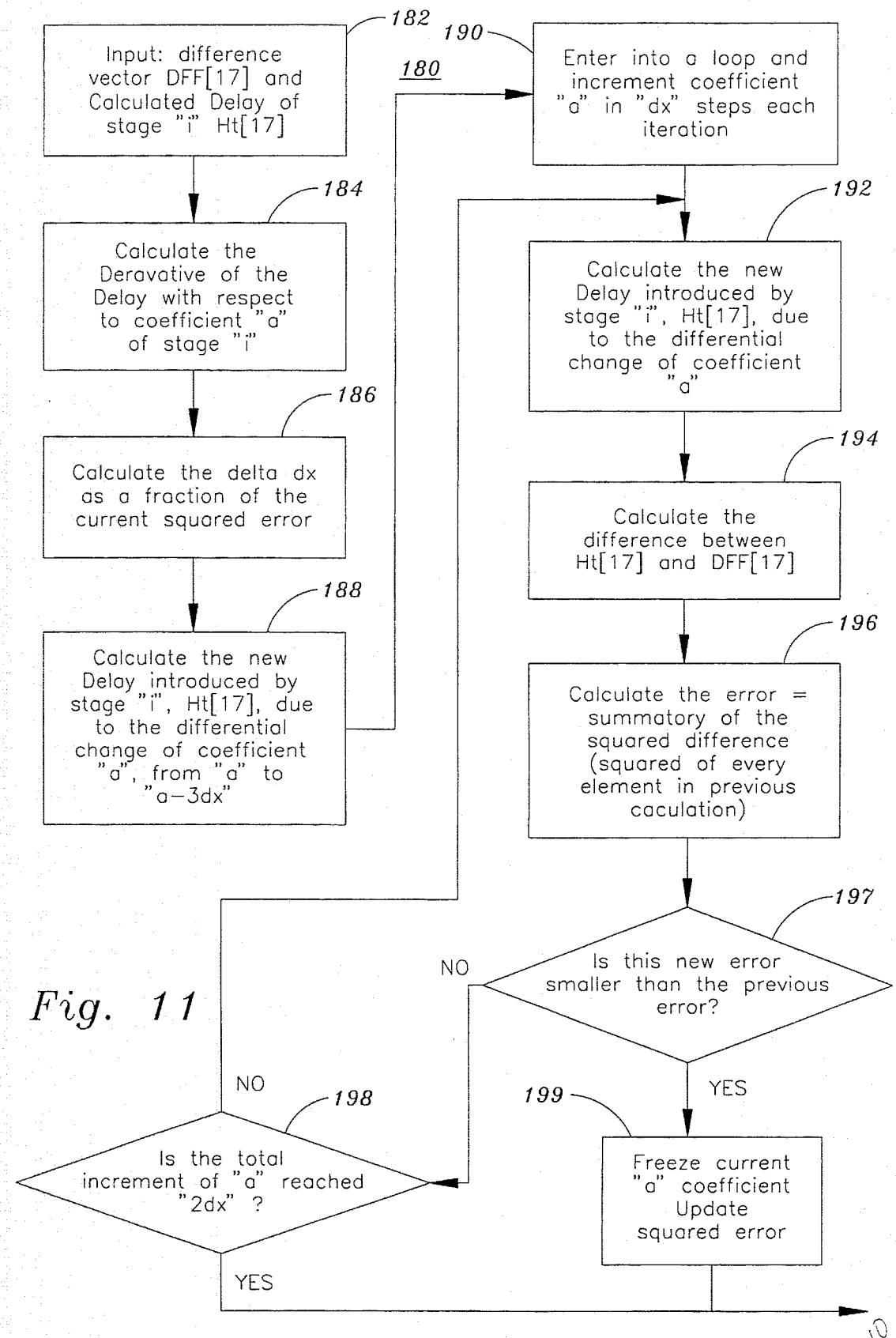
FIG. 11 is a flowchart illustrating the specific sequence of operations performed to calculate coefficient "a" with respect to band "i" fine adjustment by the intelligent telecommunications interface depicted in FIGS. 3 and 4 in accordance with the present invention.

In FIG. 11 there is shown a flowchart 180 illustrating the specific sequence of operations performed to calculate coefficient "a" with respect to band "i" fine adjustment algorithm by the intelligent telecommunications interface 40 depicted in FIGS. 3 and 4 in accordance with the present invention. Referring to FIG. 11, the band "i" fine adjustment involves the determination of coefficient "a". The data used for the calculation adjustment of coefficient "a" is the difference curve and the calculated curve of the filter "i" 182. The derivative of the lower filter is calculated with respect to coefficient "a" of the lower stage "i" 184. The calculation of delta dx as a fraction of the current squared error is made 186. The calculation of the new delay curve of the filter "i" due to the differential change of coefficient "a" to "a-3 dx" 188. Setup to do multiple calculations with coefficient "a" increased in dx steps 190. The calculation of the new delay curve of the filter "i" due to the differential change of coefficient "a" 192. The calculation of the new difference between this curve and the inverse curve 194. Calculate the new summation of the squared error 196. If the new error summation is less than the previous determination, then save the present coefficient "a" and update squared error 197. Otherwise check to see if coefficient "a" has been incremented to "2 dx" 198. If so, end the adjustment; otherwise adjust coefficient "a" and repeat above calculations 199.

Figure 12:
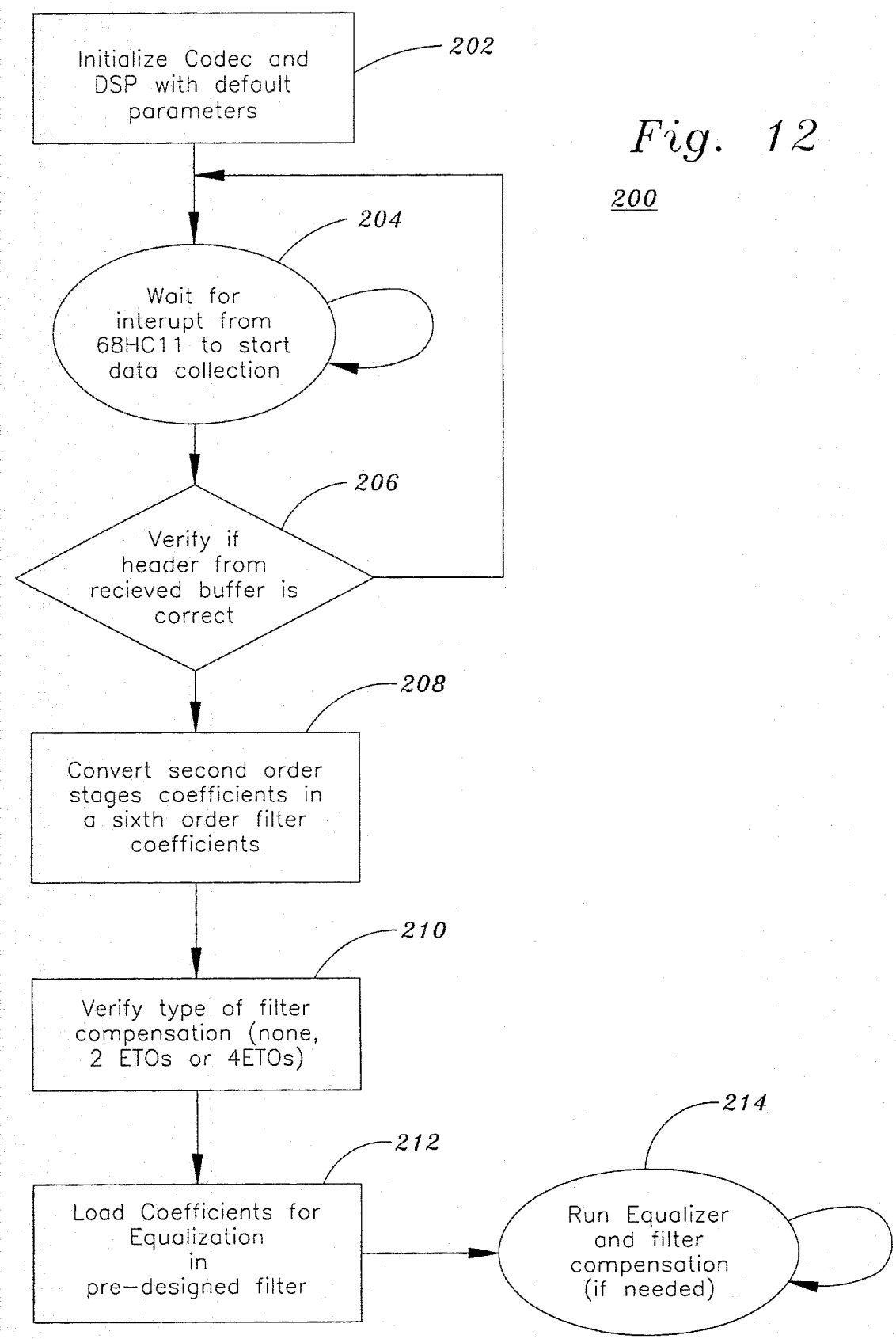
FIG. 12 is a flowchart illustrating the specific sequence of operations performed with respect to digital signal processing of the signal for purposes of achieving equalization by the intelligent telecommunications interface depicted in FIGS. 3 and 4 in accordance with the present invention.

In FIG. 12 there is shown a flowchart 200 illustrating the specific sequence of operations performed with respect to digital signal processing of the signal for purposes of achieving equalization by the intelligent telecommunications interface 40 depicted in FIGS. 3 and 4 in accordance with the present invention. Referring to FIG. 12, the parameters for the coefficients of the all-pass filter are set to default values 202. The associated digital signal processing microprocessor then waits for the data to be presented from the delay equalization interface's microprocessor 204. The data is checked for correct header information 206. If the header data is not correct, the digital signal processing microprocessor waits for the correct new data. The data for the coefficients are converted to the correct order 208. The type of additional compensation is determined for the data received from the delay equalization interface's microprocessor and the coefficients are adjusted accordingly 210. New coefficients are loaded into the three all-pass filters 212. The delay equalization interface is then adjusted for the data passing through it using the new coefficients 214.

Figure 13:
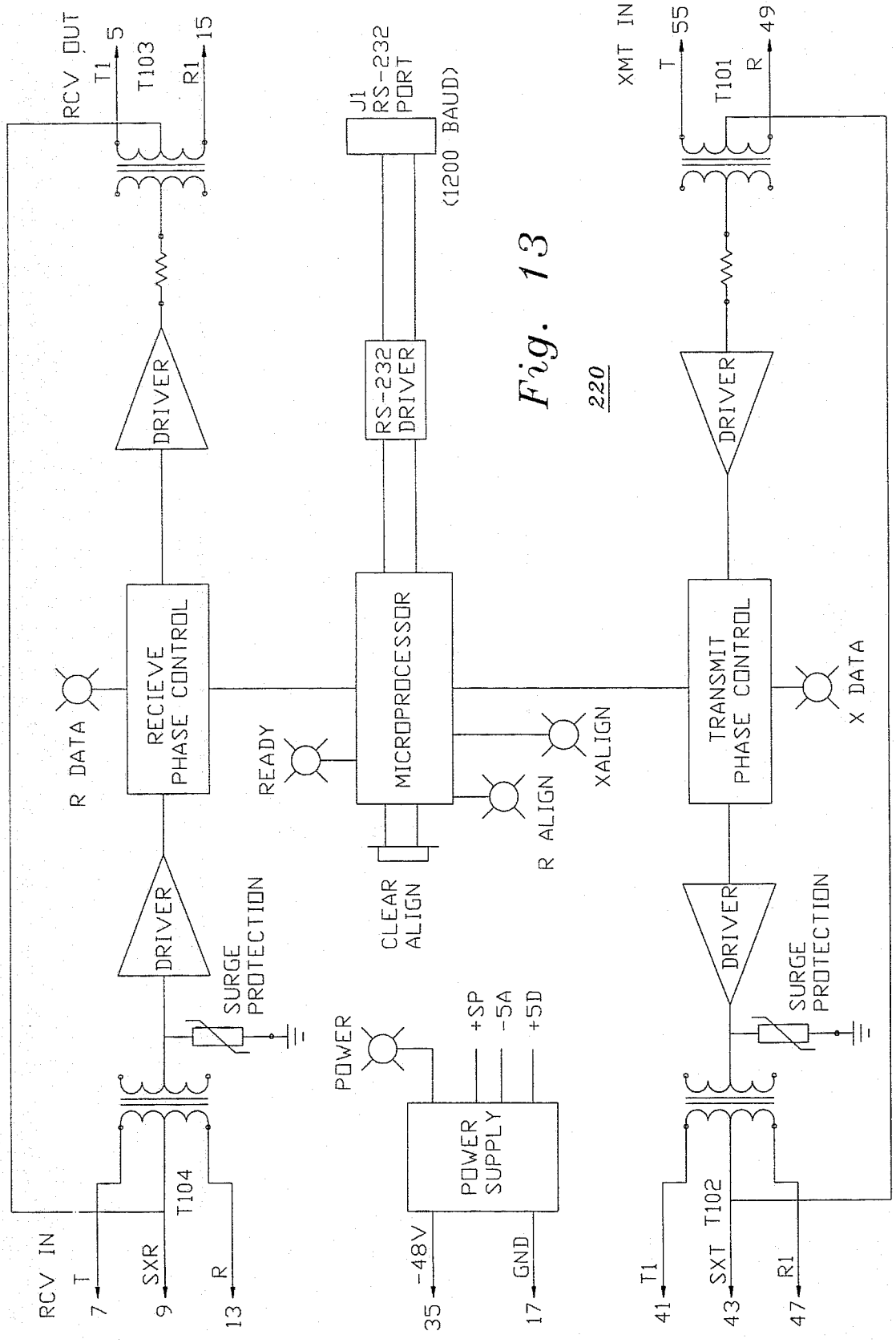
FIG. 13 is a general block diagram of the intelligent telecommunications interface having automatic adaptive delay distortion equalization built in accordance with the present invention.

In FIG. 13 there is shown a general block diagram 220 of the intelligent telecommunications interface having automatic adaptive delay distortion equalization built in accordance with the present invention. Referring to FIG. 13, the delay equalization interface is installed between the cable entry point (primary protection) and a data station termination (DST) at the customer premises. The delay equalization interface is installed on the customer premises (or the equivalent) and is intended to be used behind devices that provide primary lightning protection. The interface is transformer-coupled on facility-side and terminal-side delay equalization interface ports. The signal is then sent through the XMT delay equalization interface to the output amplifier. The output of this amplifier is transformer-coupled (600 Ohms) toward the facility by the XMT OUT port (pins 41 and 47). The transformer provides impedance matching, lightening and over voltage protection.

Generally, with respect to the reception signal path, incoming signals from the 4-wire analog facility, applied to the RCV IN port (pins 7 and 13), are routed through a 600 ohm transformer to a protected solid-state amplifier. Facility-side terminating impedance of 600 Ohms, fixed. This incoming signal is coupled to the internal circuitry by transformer T104. The RCV IN port will accept standard TLP (+5 to −10 dBm) or DLP (−8 to −23 dBm) levels. The receive path provides a zero dB signal path for the incoming signal. The driver elements provide impedance and level matching and adjustments. The signal is operated on by the receive phase control which provides the phase adjustment to the incoming signal. The signal is then passed to the output driver circuit, which amplifies the signal and passes the signal to output transformer T103. The signal is then sent through the RCV Delay Equalizer to the output amplifier. The output of this amplifier is transformer-coupled (600 Ohms) toward the facility by the RCV OUT port (pins 5 and 15). The transformer provides impedance matching, lightning and over voltage protection. The output transformer is connected to output pins 5 and 15. The receive phase controller also controls interface LED (R DATA) to indicate the presence of receive data. Data enters the receive signal path by pins 7 and 13.

Generally, with respect to the transmission signal path, data enters the transmit signal path by pins 55 and 49; signals from the DST are applied to the delay equalization interface by the XMT IN port (pins 55 and 49). The transmit path provides a fixed gain of zero dB signal path. This zero dB of gain allows the delay equalization interface to accept an input level of +5 dBm (TLP) or −8 dBm (DLP) from the DST and provide an output of the same level with no signal loss through the interface. This signal is coupled to the internal circuitry by transformer T101. The driver elements provide impedance and level matching and adjustments. The signal is operated upon by the transmit phase control which provides the phase adjustment to the signal. The signal is then passed to the output driver circuit which amplifies the signal and passes it to output transformer T102. The transformer is connected to output pins 41 and 47. The transmit phase controller also controls interface LED (T DATA) to indicate the presence of transmit data.

Generally, with respect to the microprocessor circuitry, the microprocessor provides the functionality to monitor the Clear/Align push-button switch and provides outputs to the interface LEDs for R ALIGN, T ALIGN and READY. The microprocessor also is interfaced to a RS-232 transceiver which is connected to the RS-232 serial port at J1, which provides the functionality to communicate with external equipment, including external transmission test equipment, and then take the input data from this external equipment, and provide new output data to the receive phase controller and transmit phase controller to facilitate compensation of each for the phase distortion in the external data paths.

Generally, with respect to the power supply, a power supply is provided to convert −48 volts DC to the internally required voltages for the interface, namely, −5 A, +5 D and +5 P. The −48 volt DC source is connected to pin 35, and the GND reference is connected to pin 17 of the delay equalization interface. A LED (POWER) is connected to the power supply and is illuminated when the power supply is operating.

Generally, with respect to sealing current, the delay equalization interface provides a path for sealing current supplied from the near end. By connecting the SX leads of T101 to T102 and T103 to T104, the simplex path is connected so sealing current passes through the delay equalization interface.

See TABLE I hereafter for the specific pin-out definitions for the delay equalization interface.

TABLE I

| LEAD | DESIGNATION | PIN |
|---|---|---|
| T | RCV IN Tip | 7 |
| R | RCV IN Ring | 13 |
| T1 | RCV OUT Tip | 5 |
| R1 | RCV OUT Ring | 15 |
| SXR | Simplex RCV | 9 |
| SXT | Simplex XMT | 43 |
| T | XMT IN Tip | 49 |
| R | XMT IN Ring | 55 |
| T1 | XMT OUT Tip | 41 |
| R1 | XMT OUT Ring | 47 |
| −48 V | −48 Vdc Power | 35 |
| GND | Ground | 17 |

Figure 14A:
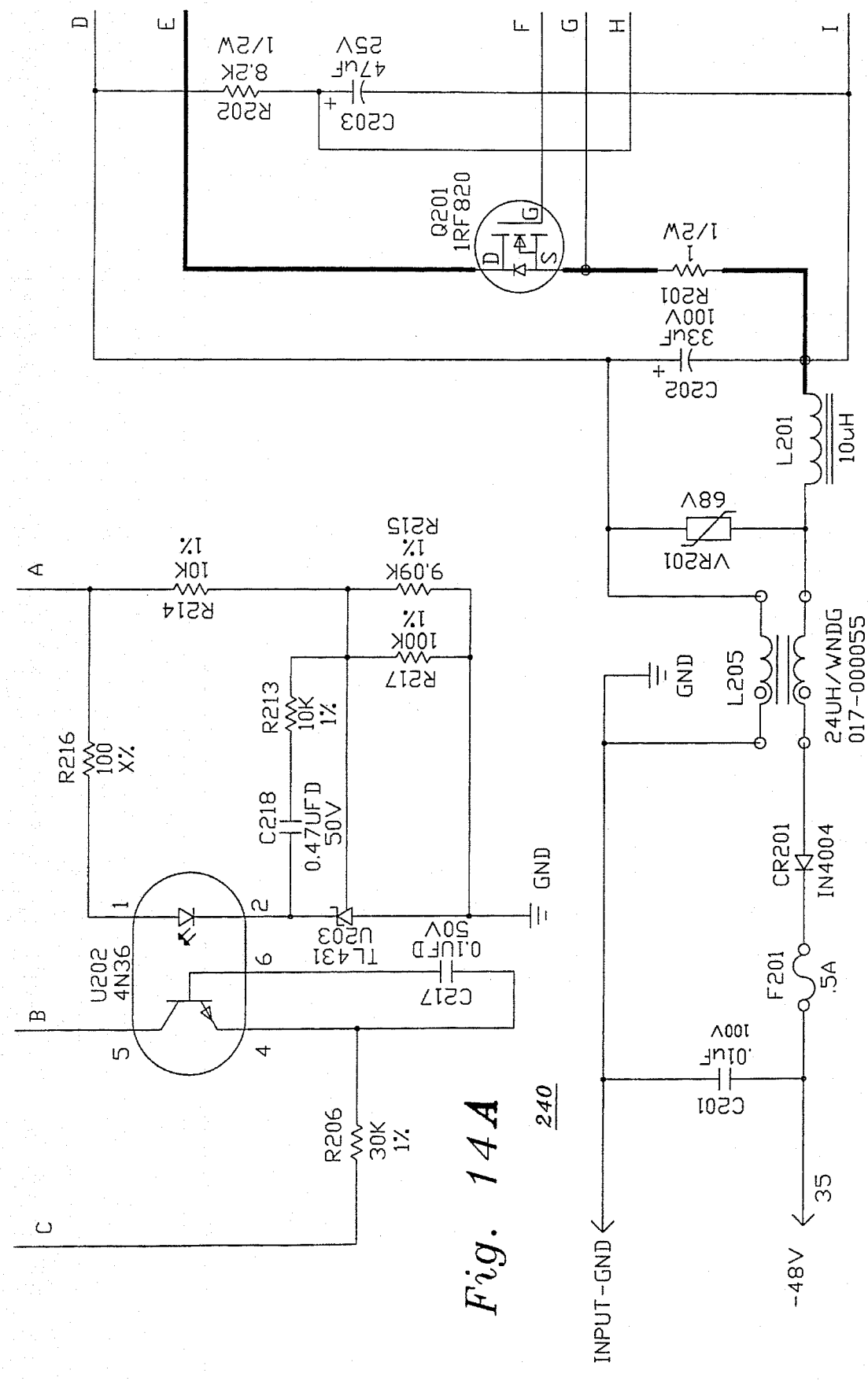
FIGS. 14A and B are a detailed electrical schematic circuit diagram of the specific power supply circuitry which is used to implement a particular embodiment of the intelligent telecommunications interface having automatic adaptive delay distortion equalization built in accordance with the present invention.
Figure 14B:
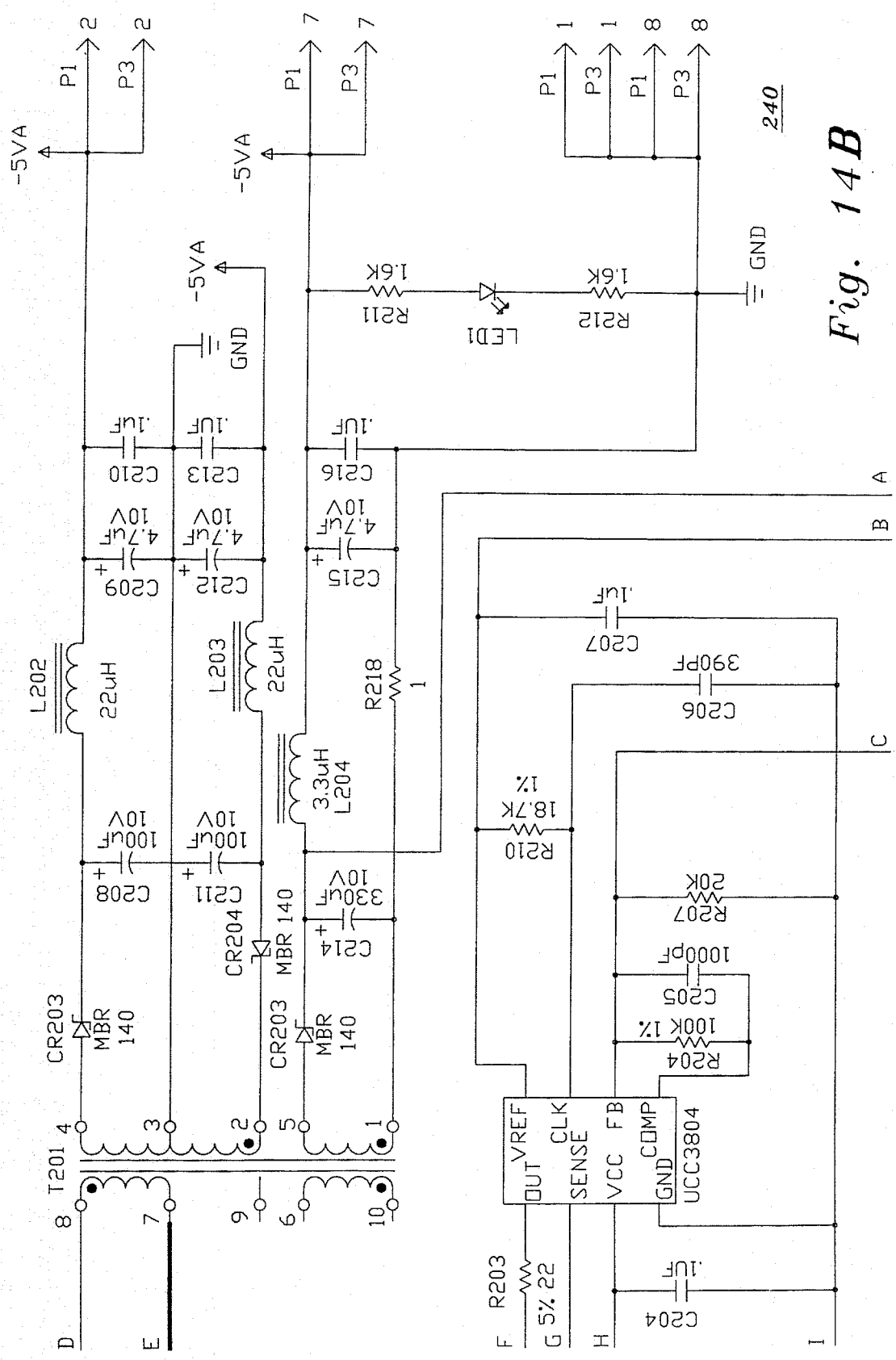
Figure 15A:
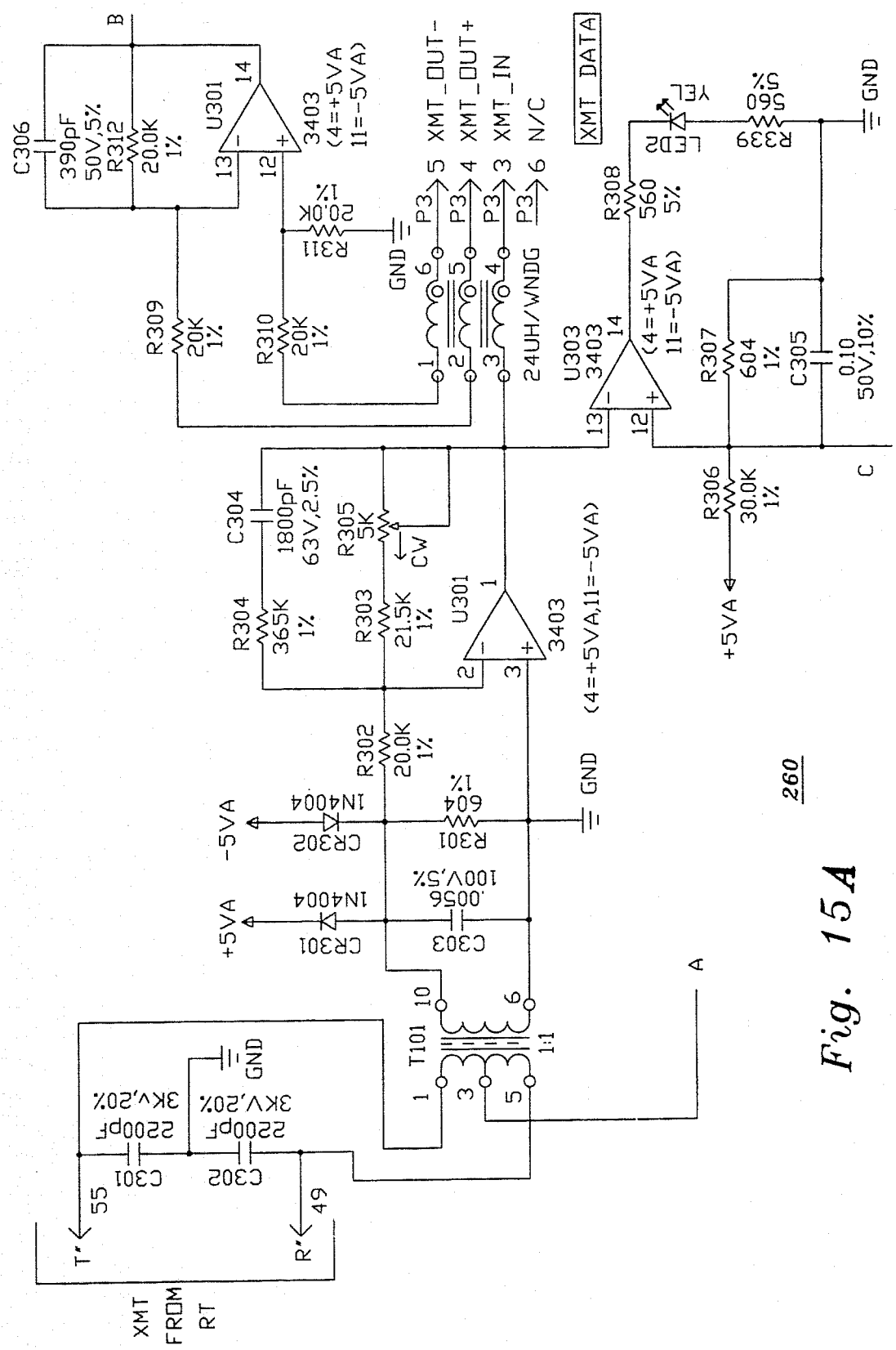
FIGS. 15A–D are a detailed electrical schematic circuit diagram of the line interface circuitry which is used to implement a particular embodiment of the intelligent telecommunications interface having automatic adaptive delay distortion equalization built in accordance with the present invention.
Figure 15B:
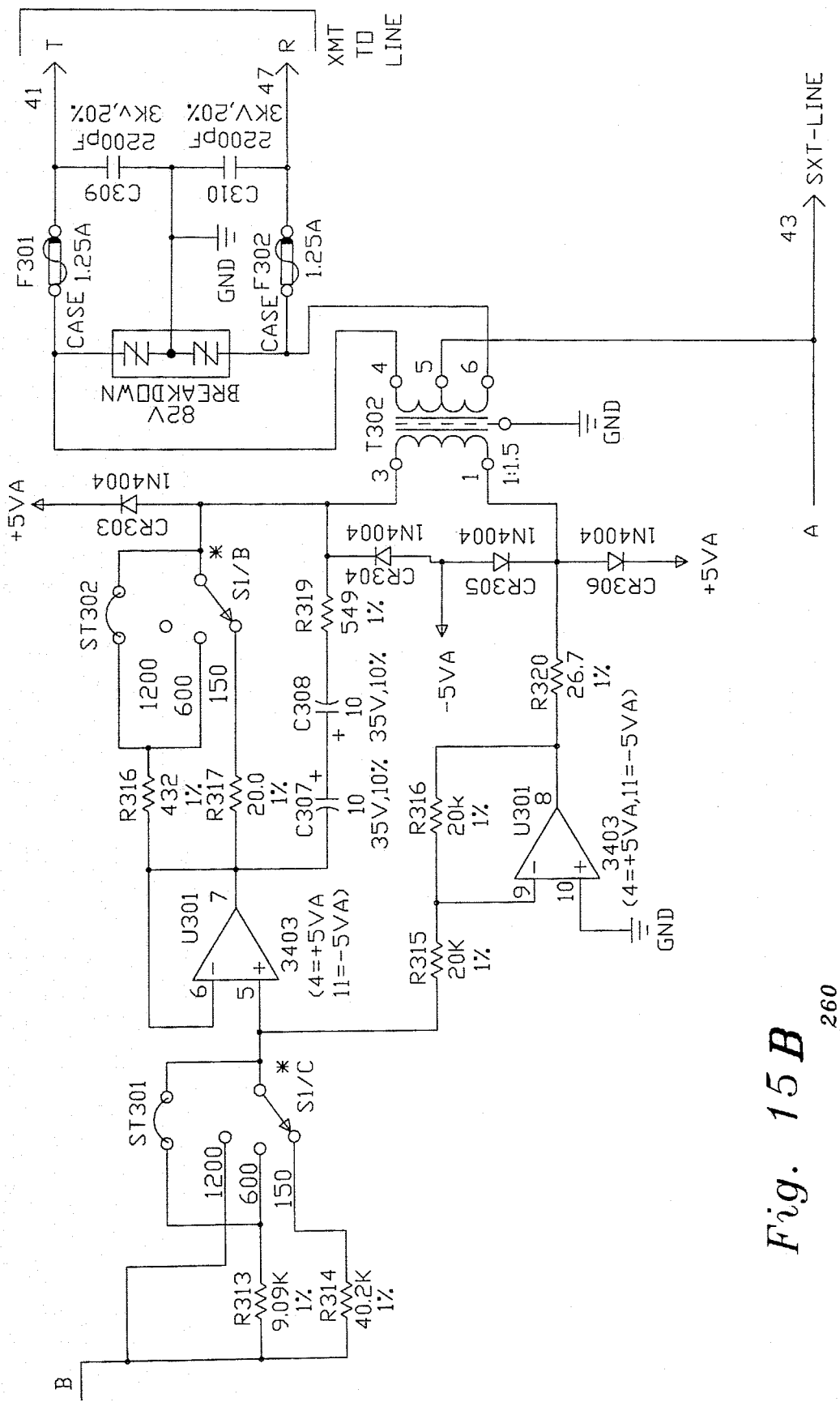
Figure 15C:
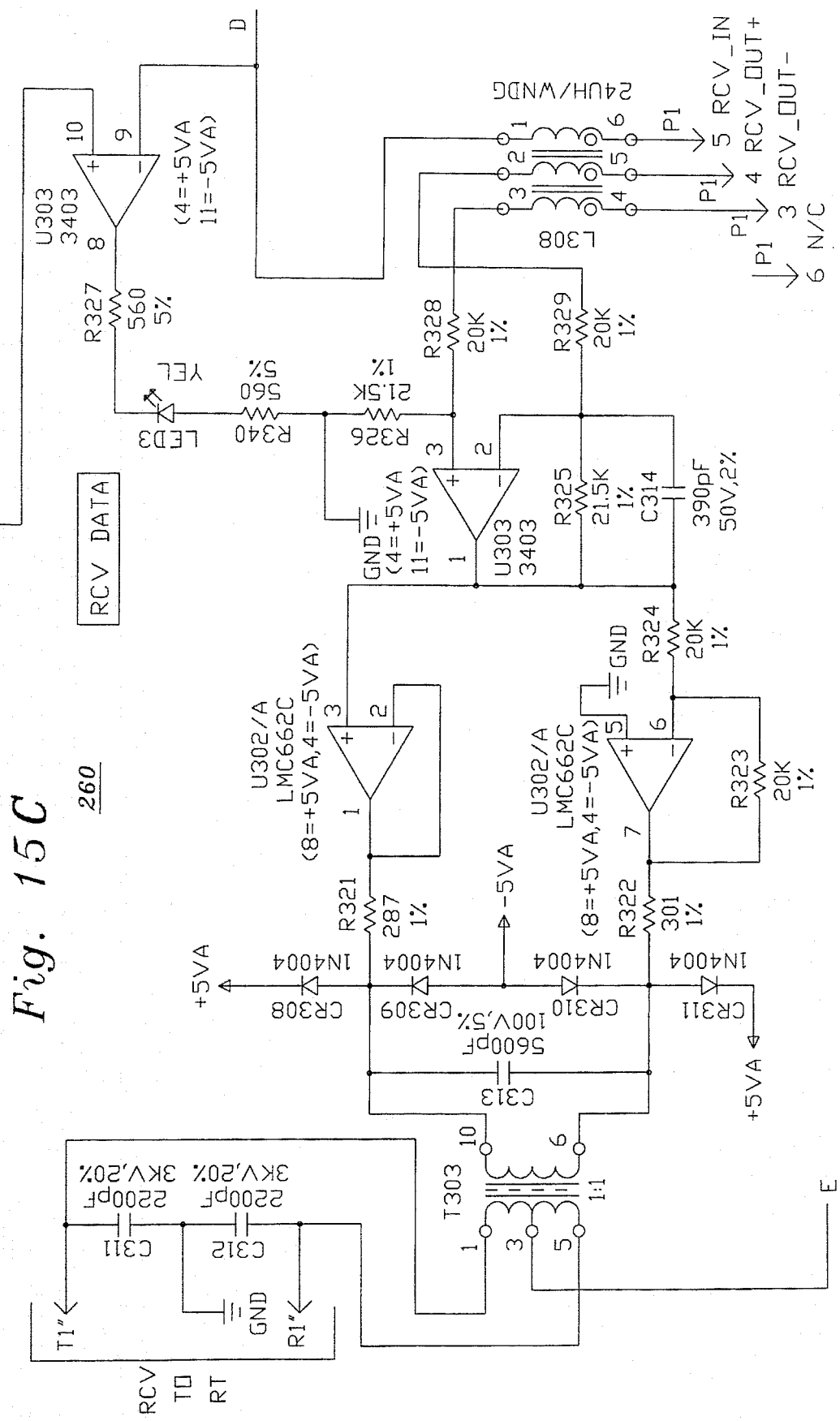
Figure 15D:
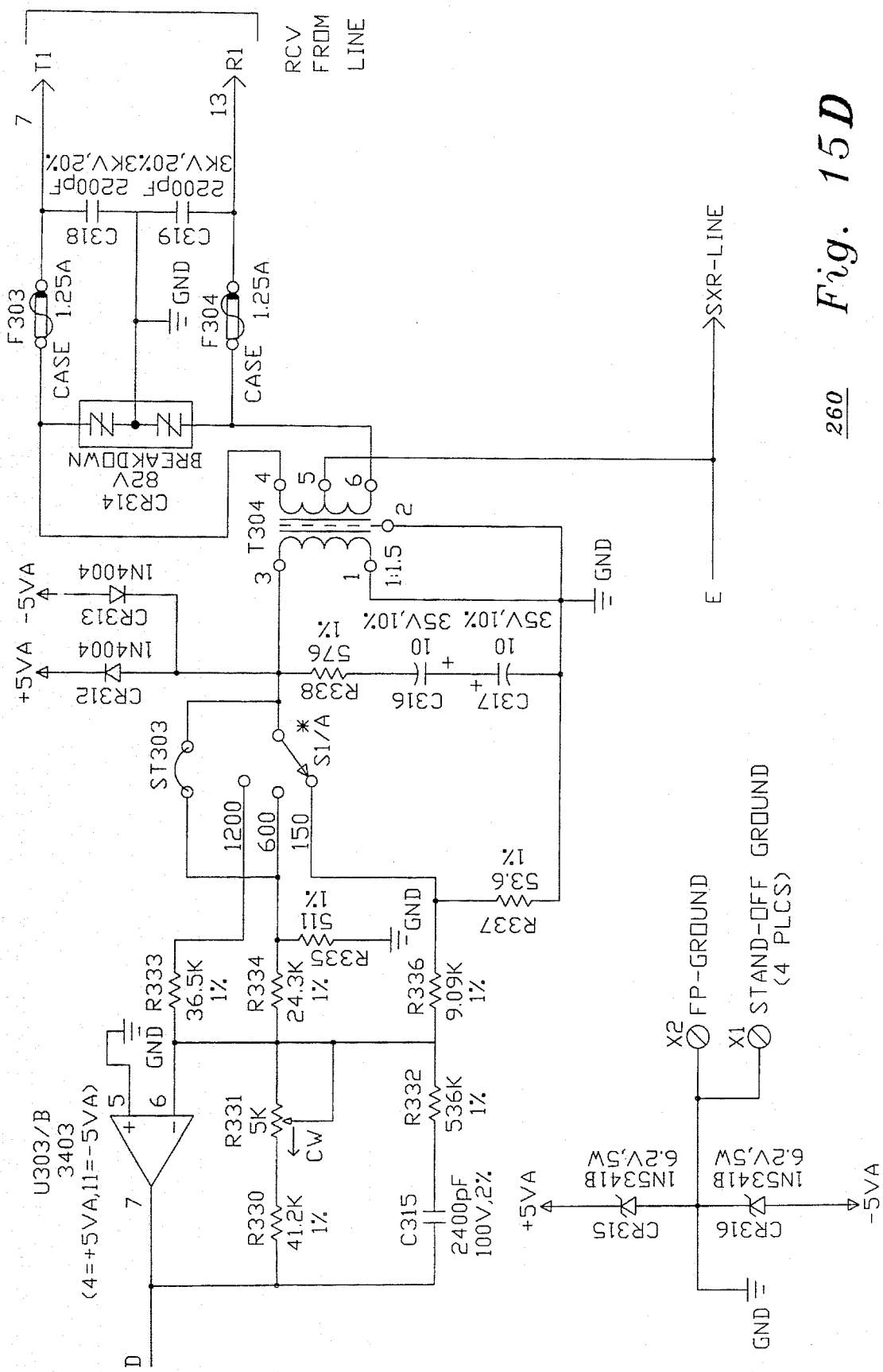

In FIG. 14 there is shown a detailed electrical schematic circuit diagram of the specific switching power supply circuitry 240 which is used to implement a particular embodiment of the intelligent telecommunications interface having automatic adaptive delay distortion equalization built in accordance with the present invention. Referring to FIG. 14, the power supply is a conventional flyback topology. Energy is stored in the primary of transformer, T201 and then transferred to the secondary at a rate of 100 KHz. The controlling integrated circuit, U201, is a UCC3804 current mode pulse with modulator. The clock is set by R210 and C206 with respect to the oscillator in U201. The switching field effect transistor is an IRF820. Current through this FET is sensed by R201 and fed back to U201 for current mode control and pulse by pulse current limiting. The output of the transformer is rectified by diodes CR203, CR204, and CR205 and filtered with a "pie" filter configuration. This produces a +5 volt output capable of 0.3 amps and +5 volts and −5 volts capable of 0.1 amps each. The higher current +5 volt output is fed back to U201 through and opto-coupler, U202, using a precision voltage reference, U203, to control the transfer. This closes the loop. The power supply will operate with and input voltage of −42 volts to −60 volts and produce 2.5 watts.

Referring to FIG. 15, there is shown a detailed electrical schematic circuit diagram of the line interface circuitry 260 which is used to implement a particular embodiment of the intelligent telecommunications interface having automatic adaptive delay distortion equalization built in accordance with the present invention. Referring to FIG. 15, the line interface circuitry 260 consists of two very similar transmission paths. The transmit path enters the delay equalization interface on edge connector pins 55 and 49; and leaves on edge connector pins 41 and 47. The receive path enters on edge connector pins 7 and 13; and leaves on edge connector pins 5 and 15.

Transmit path (edge pins 55 and 49 to P3-3): filter caps C301 and C302 are used to attenuate conducted RF noise from the delay equalization interface. Transformer T301 provides an interface between the balanced (balance to ground) line and the imbalance internal circuitry (transformer pins 6–10). Diodes CR301 and 302 provide protection for internal circuitry from voltage surges on the line (edge pins 55 and 49). C303 & R301 provide the terminating impedance for T301 to reflect a 600 ohm impedance onto the line (edge pins 55 and 49). Collectively, R302, 303, 305 and U301 provide a fixed gain transfer between T301 (pins 6–10) and connector P3-3. R305 is used to adjust for the cumulative component tolerances of the entire transmit path. R304 and C304 provide a slight high audio band attenuation to flatten the frequency response of the transmit path. The RF common mode filter coil (L303) provides an attenuation of RF common mode noise generated from the digital circuitry located on the associated daughter board. Network R306, R307 and C305 provide a reference voltage used by Op-Amp U303 on pins 10 and 12. Components U303, R308, R339 & LED2 provide a visual indication of voice or data on the transmit path. R308 and R339 required for ESD protection. Transmit, P3-4 and 5 to Edge Pins 41 and 47: collectively, R309–312 and U301 provide a balanced differential input, fixed gain amplifier to imbalance out, to interface the output from associated daughter board to the driver section. C306 and U301 provide a low-pass audio band filter to attenuate unwanted higher frequency signal energy. Components R313, R315, R318, ST301 and U301 collectively provide a fixed gain push-pull drive amplifier to the line (edge pins 41 and 47). R314 and S1/C are not used. Components ST302, R316, C307, C308, R319 and R320 collectively provide the termination for transformer T302 to reflect a 600 ohm impedance to the line (edge pins 41 and 47). R317 and S1/B are not used. Diodes CR303–CR306 provide protection from voltage surge that originate on the line (edge pins 41 and 47) and couple through transformer T302. Transformer T302 provides a means of interfacing the imbalance circuit (transformer pins 3 and 1) to the balanced line (edge pins 41 and 47). Components CR307, F301, and F302 collectively provide a fail safe circuit protection against the accidental application of high AC voltage to the line (edge pins 41 and 47) commonly called "Power-Cross". Filter caps C309 and C310 attenuate conducted RF noise from delay equalization interface.

Receive path (edge pins 7 and 13 to P1-5): Filter caps C318, C319 attenuate conducted RF noise from delay equalization interface. Components F303, F304, CR314 collectively provide a fail safe circuit protection against the accidental application of high AC voltage to the line (edge pins 41 and 47) commonly called "Power-Cross". Transformer T304 provides a means of interfacing the balanced line (edge pins 7 and 13) to the imbalance circuit (transformer pins 3 and 1). Diodes CR312, CR313 provide protection from voltage surge that originate on the line (edge pins 7 and 13) and couple through transformer T304. Components R338, R335, C316, ST303, C317 collectively provide the termination for transformer T304 to reflect 600 ohm impedance to the line (edge pins 7 and 13). R336, R337, R333 S1/A are not used. Components R330, R331, R334, R335, U303/B collectively form a fixed gain amplifier. R331 is used to compensate for the accumulative component tolerances of the receive path. Components C315 and R332 provide a slight high audio band attenuation to flatten the frequency response of the receive path. Components U303, R327, R340, LED3 collectively provide a visual indication of voice or data on the receive path. R327 and R340 required for ESD protection. RF common mode filter coil L308 provides attenuation of RF common mode noise generated from the digital circuitry located on the associated daughter board. Connector P1-3, 4, 5 between mother and daughter boards. Receive (P1-3 and 4 to edge pins 5 and 15): U303, R325, R326, R328, R329: collectively these parts provide a balanced differential input, fixed gain amplifier to imbalance out, to interface between the output from daughter board and the driver section. C314 provides a low-pass audio band filter to attenuate unwanted higher frequency signal energy. Components U302/A,B, R323, R324 collectively provide a fixed gain push-pull drive amplifier to the line (edge pins 5 and 15). Components R321, R322, C313 collectively provide the terminating impedance for T303 to reflect a 600 ohm impedance onto the line (edge pins 5 and 15). Diodes CR308–CR311 provide protection for internal circuitry from voltage surges on the line (edge pins 5 and 15) that couple through T305. Transformer T303 provides a means of interfacing the imbalance circuit (transformer pins 6 and 10) to the balanced line (edge pins 5 and 15). Filter caps C311 & C312 are used to attenuate conducted noise from the delay equalization interface. CR315 and CR316 provides power supply surge protection to prevent over voltage on the ±5 V supplies and provide a place to attenuate the voltage surge current from the lines coupled through the transformers to the suppression diodes (CR301–CR306, CR308–CR313).

Figure 16:
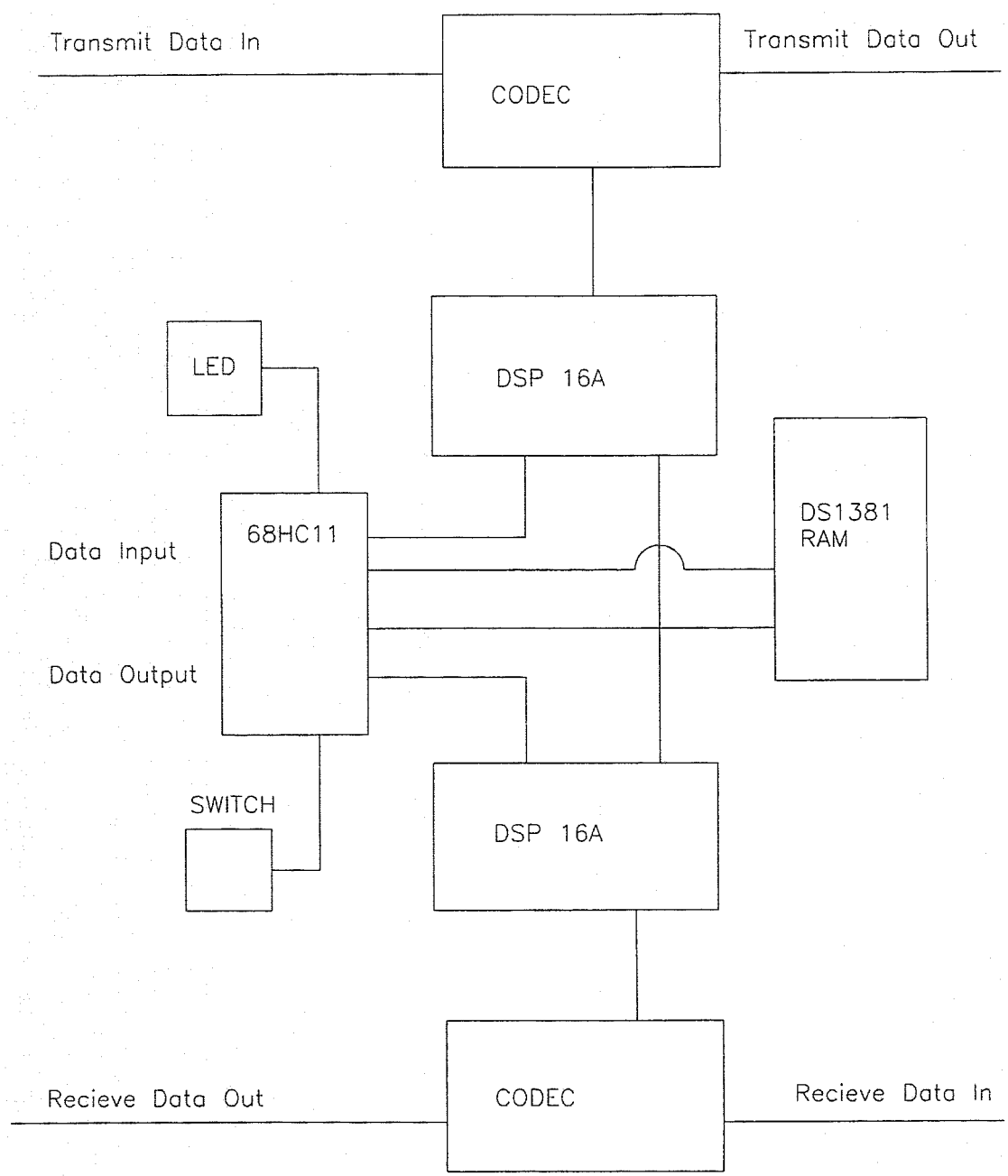
FIG. 16 is a general block diagram of the microprocessor and digital signal processing integrated circuits which is used to implement a particular embodiment of the intelligent telecommunications interface having automatic adaptive delay distortion equalization built in accordance with the present invention.

Referring to FIG. 16, there is shown a general block diagram 280 of the microprocessor 68HC11, digital signal processing chips 16A (one each for the transmit and receive sides), and codecs which is used to implement a particular embodiment of the intelligent telecommunications interface having automatic adaptive delay distortion equalization built in accordance with the present invention. Referring to FIG. 16, the 8-bit microprocessor 68HC11 is manufactured and made commercially available by MOTOROLA, INC., referred to as part number MC68HC711E9, is a high density complementary metal-oxide semiconductor high-performance chip with integral multiplexed bus, capable of running at up to 3 MHz. Motorola, Inc. has published certain product technical specifications pertaining to the 68HC11 (which are hereby incorporated herein by reference).

The DSP16A is manufactured and made commercially available by AT&T and is a 16-bit high speed programmable CMOS integrated circuit. It achieves high throughput and has an arithmetic unit capable of a 16×16 bit multiplication and 36-bit accumulation or a 32-bit ALU operation in one instruction cycle. Data is supplied by two independent addressing units. AT&T has published certain product technical specifications pertaining to the DSP16A (which are hereby incorporated herein by reference).

Note, while FIG. 16 depicts two DSPs (one each for the transmit and receive paths), and the associated microprocessor, it is expected that, if need be, one of ordinary skill in the art would be able to combine the DSP functionalities with the microprocessor into a larger and faster microprocessor, thereby resulting in a single unified processor chip.

A portion of the disclosure of this patent document contains material which is subject to copyright protection. The copyright owner has no objection to facsimile reproduction by anyone of the patent document as such appears in the Patent and Trademark Office file or record, but otherwise reserves all underlying pertinent copyright rights whatsoever. Accordingly, a program listing of the software program is attached as APPENDIX I and APPENDIX II hereto, and hereby incorporated as part of this specification (that is, the object code hexadecimal version) for use in the embodiment described herein and illustrated in FIGS. 3 through 17 with respect to the 8-bit microprocessor and the digital signal processors; once this software program is resident in the respective processors, the interface 40 will operate under its direction.

Figure 17A:
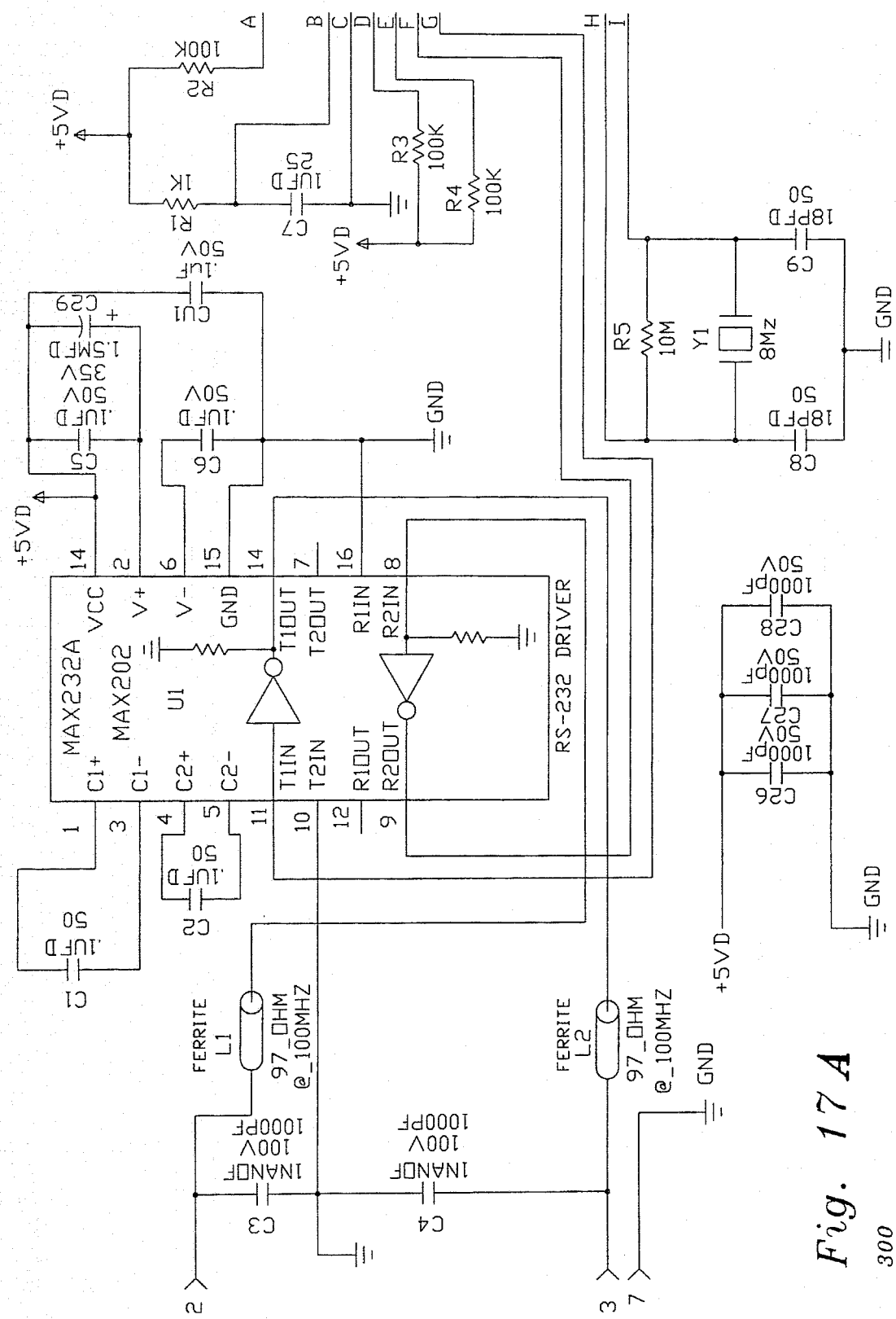
FIGS. 17A and B are a detailed electrical schematic circuit diagram of the microprocessor, and electronic circuitry which is used to implement a particular embodiment of the intelligent telecommunications interface having automatic adaptive delay distortion equalization built in accordance with the present invention.
Figure 17B:
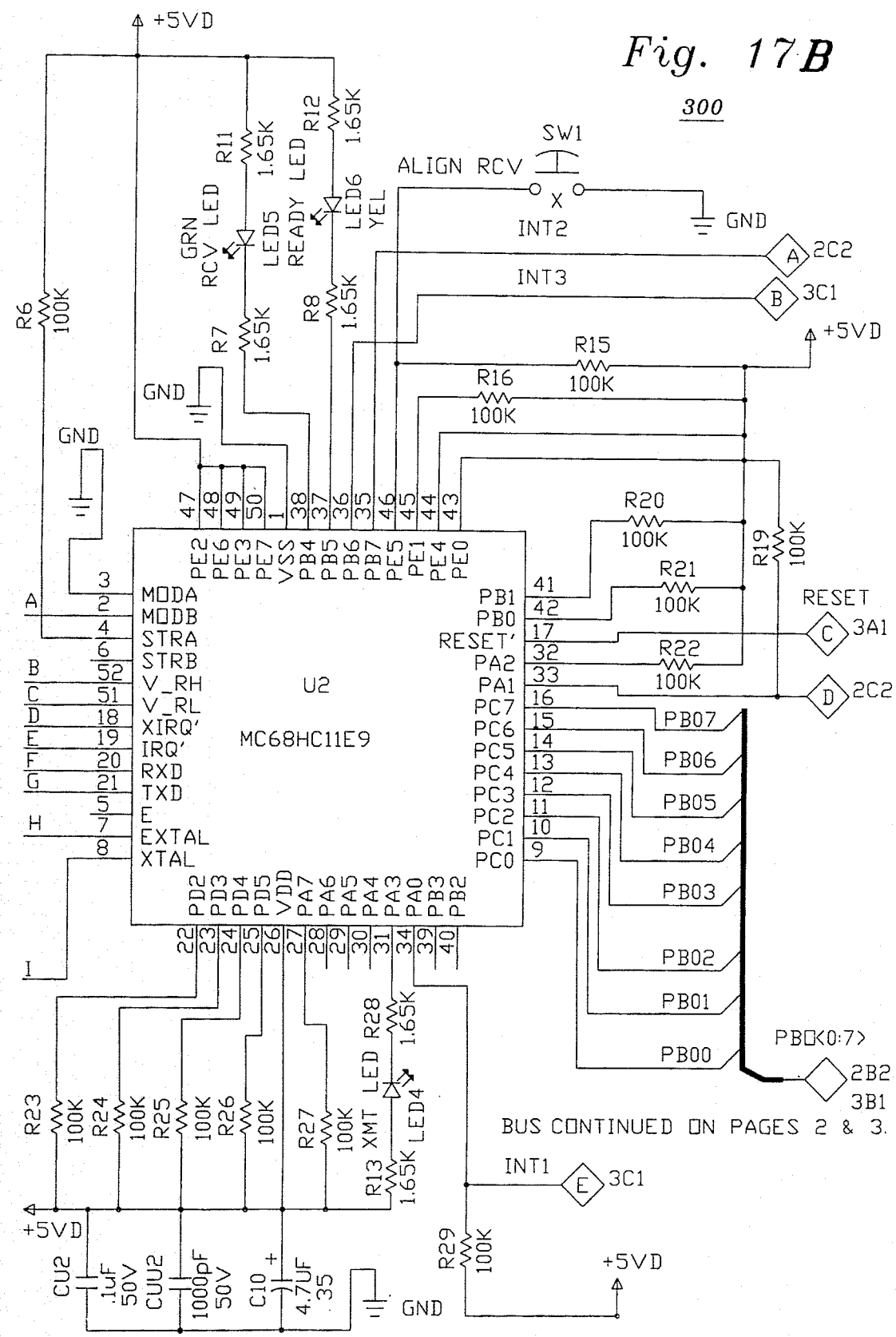
Figure 18A:
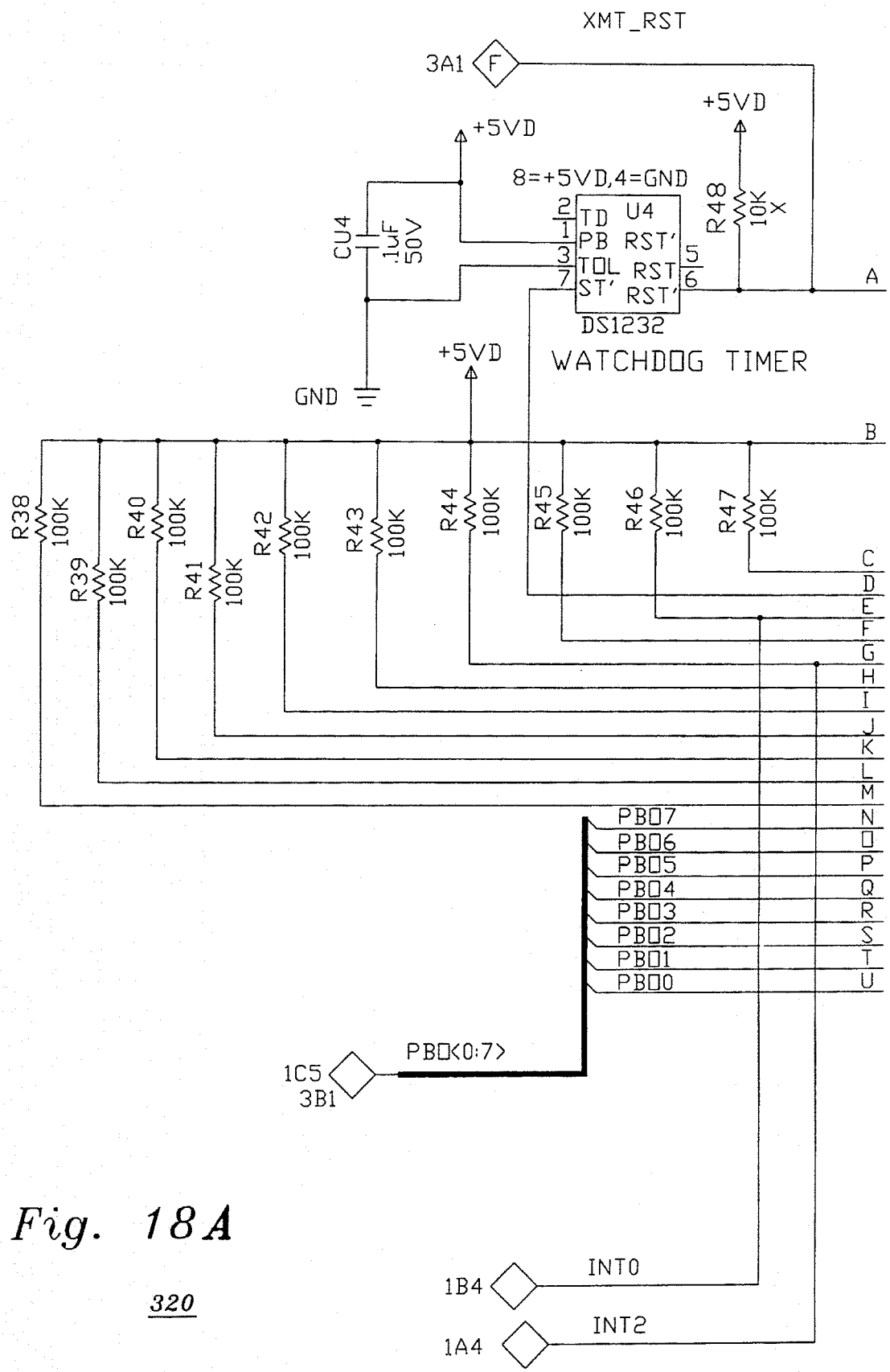
FIGS. 18A–D are a detailed electrical schematic circuit diagram of the digital signal processing integrated circuit (transmit side) and electronic circuitry which is used to implement a particular embodiment of the intelligent telecommunications interface having automatic adaptive delay distortion equalization built in accordance with the present invention.
Figure 18B:
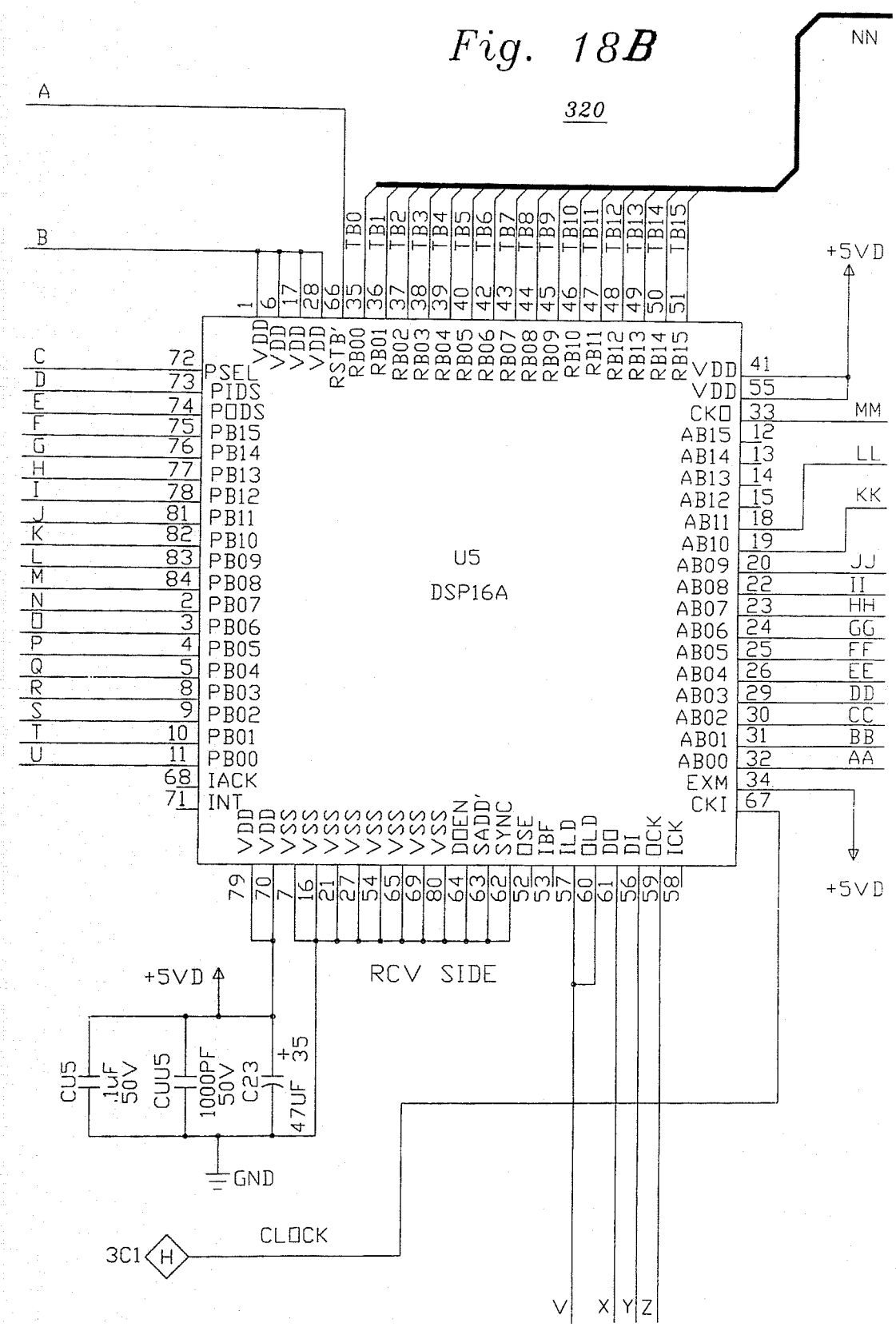
Figure 18C:
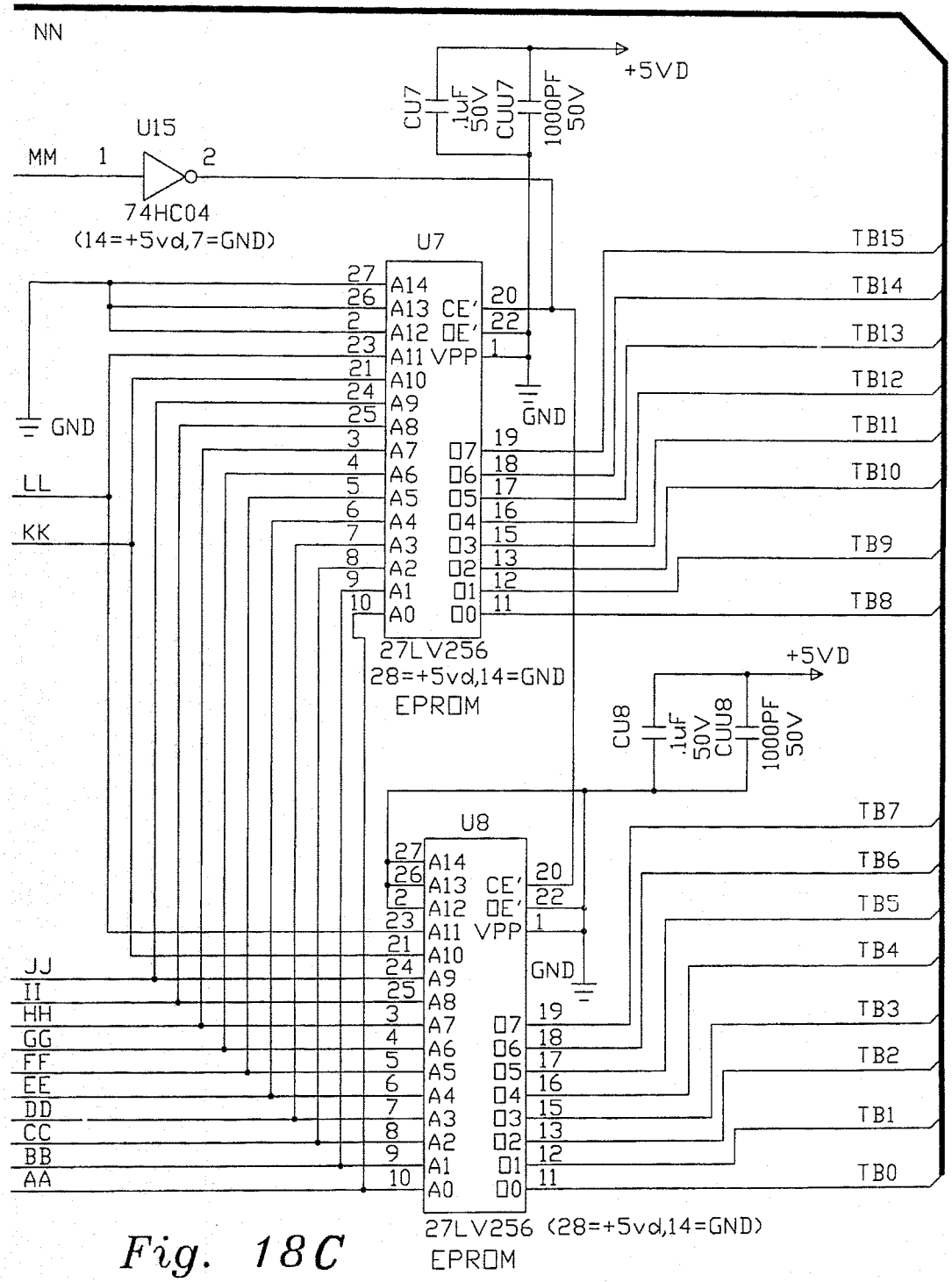
Figure 18D:
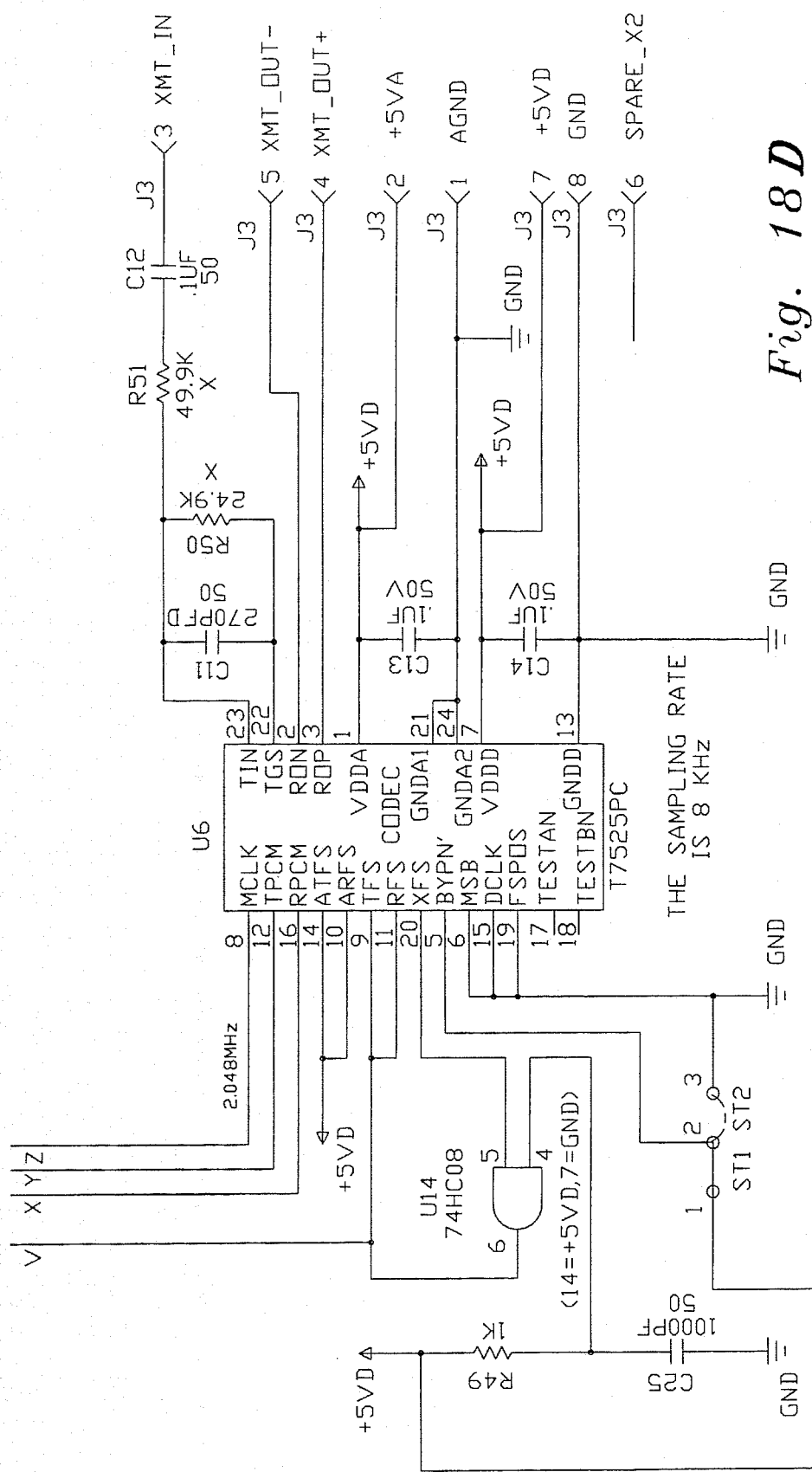

In FIG. 17, there is shown a detailed electrical schematic circuit diagram of the microprocessor, and electronic circuitry 300 which is used to implement a particular embodiment of the intelligent telecommunications interface having automatic adaptive delay distortion equalization built in accordance with the present invention. Referring to FIG. 17, the MAX232A +5 volt powered dual RS-232 transmitter/receiver (U1) circuit operates as follows: capacitor C1 (pins 1 and 3) is used by U1 to double the input +5 volts to +10 volts and C2 (pins 4 and 5) is used to invert the +10 volts to −10 volts. Capacitors C5 and C29 (pins 2 and 14) are used to filter the +10 volt supply. Capacitor C6 (pins 6 and 15 ) is used to filter the −10 volt supply. The input +5 volts is filtered by capacitor CU1 (pins 15 and 16). These voltages are used to power the RS-232 transmitters within U1. Ferrite beads L1 and L2 and capacitors C3 and C4 are used to filter noise into and out of the circuit. RS-232 data is passed to U1 by J2-2 to U1-8. U1 converts the RS-232 levels to TTL levels and passes this signal by U1-9 to the UART input (U2-20) of the MC68HC11E9 microprocessor. TTL data from the U2 UART (U221) is connected to U1 input (U1-11) and converted to RS-232 levels. This signal is then connected to J2-3 by U1-14. Crystal Y1, resistor R5, and capacitors C8 and C9 provide the external parts of the MC68HC711E9 internal clock generator circuit. Resistors R3 and R4 provide pull-ups for the interrupt and non-maskable interrupt request lines. Resistor R1 and capacitor C7 provide the input references for the inter A/D converters of U1. U1-51 is referenced to ground and U1-52 is referenced to +5 volts. Resistors R6, R16, R20, R21, R22, R23, R24, R25, R26 and R27 are used to pull-up unused input and output lines of U1. Resistor R15 is used as a pull-up resistor for U1-46, which is used to sense the condition (open or closed) of switch SW1. Circuits U1-38 to resistor R7, LED5 and R11 provide and output circuit to the U1 microprocessor for illuminating an LED to provide signaling to the unit user. Circuits U1-37 to resistor R8, LED6 and R12 provide and output circuit to the U1 microprocessor for illuminating an LED to provide signaling to the unit user. Circuits U1-31 to resistor R28, LED4 and R13 provide and output circuit to the U1 microprocessor for illuminating an LED to provide signaling to the unit user. The circuit associated with U133 to U5-74 with pull-up resistor R46 provide a means for U1 to interrupt U5's operation. Likewise, the circuit associated with U1-34 to U10-74 with pull-up resistor R60 provide a means for U1 to interrupt U10's operation. This provides a means for data to be transferred to U5 and U10 by U1-9, 10, 11, 12, 13, 14, 15, 16, U5-2, 3, 4, 5, 6, 7, 8, 9, 10, 11, U10-2, 3, 4, 5, 6, 7, 8, 9, 10, 11 which makeup an 8 bit data bus. Acknowledgement of receipt and action on the data bus U5 or U10 is accomplished by the connection of U1-35 to U5-76 with pull-up resistor R44 or by the connection of U1-36 to U10-76 with pull-up resistor R58. U1 reset (U1-17) is provided by U4 watchdog timer.

In FIG. 18 there is shown a detailed electrical schematic circuit diagram of the digital signal processing integrated circuit (transmit side) and electronic circuitry 320 which is used to implement a particular embodiment of the intelligent telecommunications interface having automatic adaptive delay distortion equalization built in accordance with the present invention. Referring to FIG. 18, watchdog timer U4 with capacitor CU4 and the connection of U4-7 to U5-73 provides a reset to U5 and U1 if U5 does not pulse U4-7 or if U4-3 fall below 4.75 volts. Resistor R48 is used as a pull-up to U5-66 (reset). Resistors R38, R39, R40, R41, R42, R44, R45, R47 provide pull-ups to the unused input/output pins of U5. Capacitors CU5, CUU5, C23 are filter capacitors for the +5 volts power input to U5. The clock input to U5 (U5-67) is provided by buffer U15 and resistor R63. The memory address bus lines U5-32, 31, 30, 29, 26, 25, 24, 23, 22, 20, 19, 18 to U7 and 8-10, 9, 8, 7, 6, 5, 4, 3, 25, 24, 23 provides the connections to address the first 8K of memory stored in the 27Lv256 (U7 and 8). The addressing is restricted to the first 8K as U7 and 8-2, 26, 27 are pulled low. The output of U7 and 8 are enable by U5-33 by U1-5 pins 1 and 2 and connections to U7 and 8 pin 20. U7 and 8 data outputs (U7 and 8-11, 12, 13, 14, 15, 16, 17, 18, 19) to U5 35, 36, 37, 38, 39, 40, 42, 43, 44, 45, 46, 47, 46, 49, 50, 51 provides a 16 bit data bus. CU7, CUU7, CU8 and CUU8 are +5 volts filter capacitors for U7 and 8. Codec U6 (T7525) provides the A/D and D/A conversion of analog signals to digital signals and vice versa so that U5 can operate on the digital data. Resistors R50, R51 and capacitors Cll, C12 provide filters for the analog input to U6. Circuit U14, C25 and R49 provides a means to reset the codec U6 upon power up. Capacitors C13 and 14 are power filters for U6. A 2,048 MHz clock is provided to U6 by the connection of U5-59 to U6-8. Input analog signals are connected to U6 by pins 22 and 23. They are converted to digital serial data by U6 and sent to U5-56 by U6-12. Serial digital signals from U5 are connected to U6 by the connection of U5-61 to U6-16. Timing signal between U5 and U6 are provided by connections U5-57, 60 to U6-9, 11.

Figure 19B:
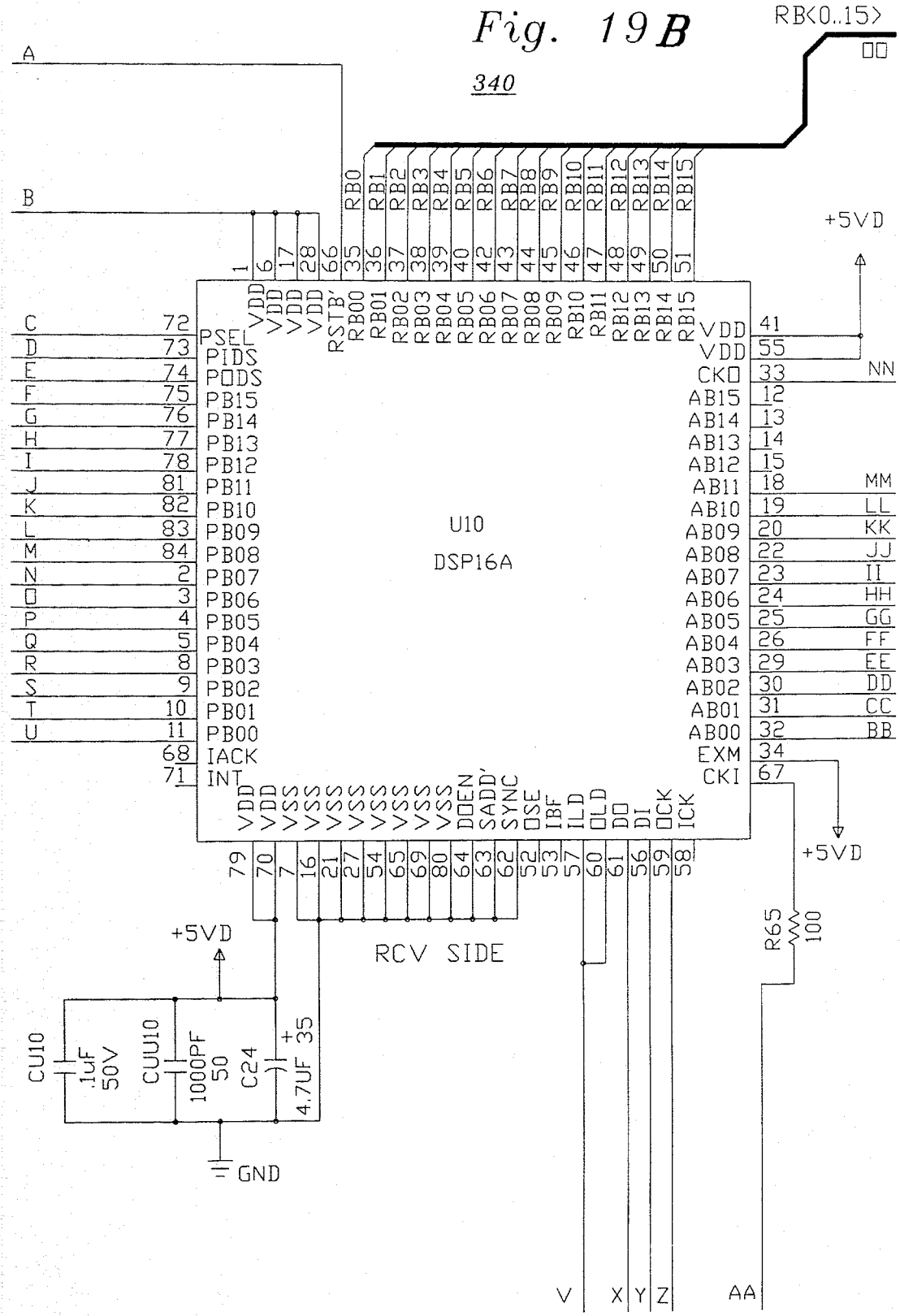
Figure 19C:
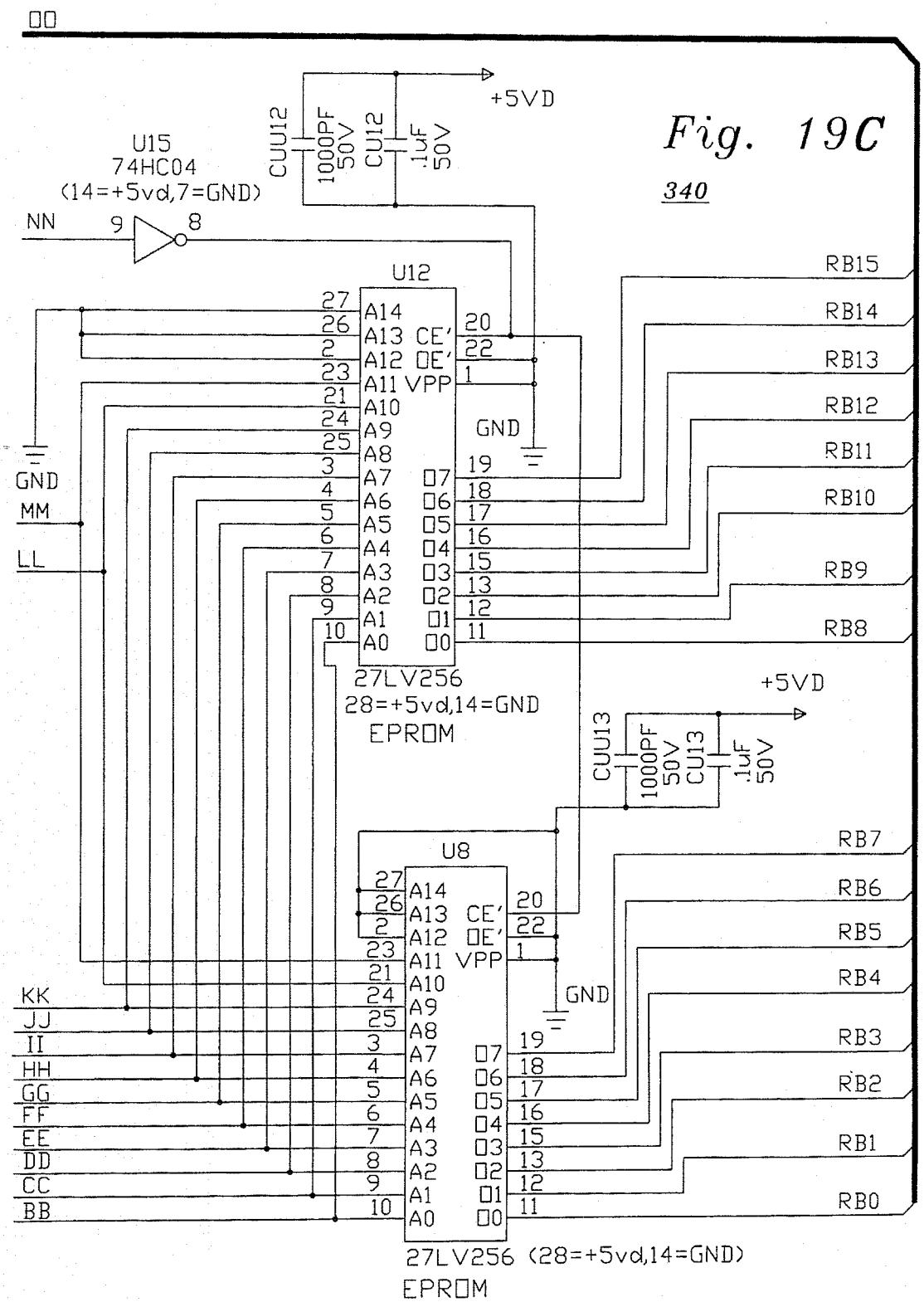
Figure 19D:
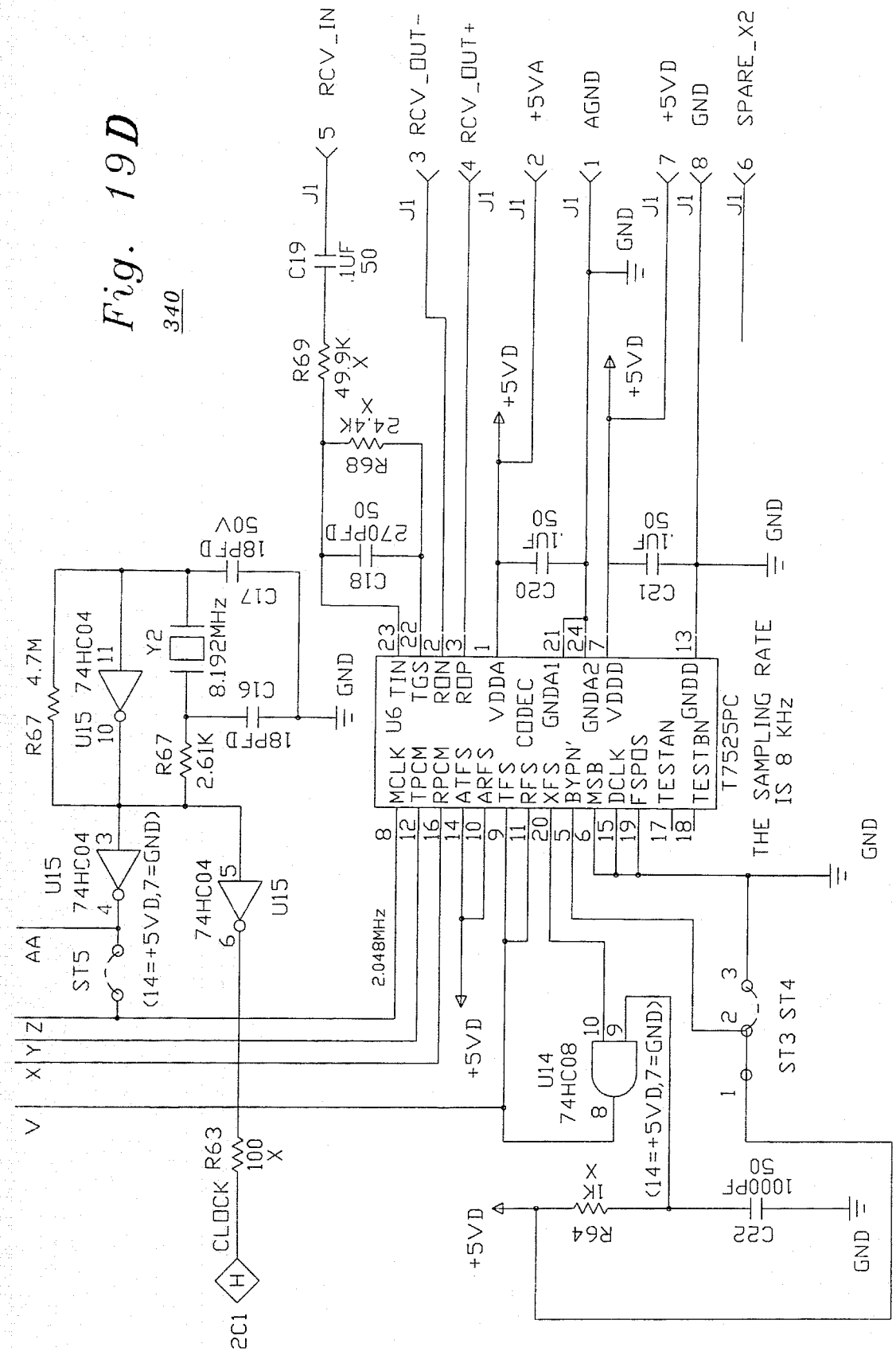

In FIG. 19 there is shown a detailed electrical schematic circuit diagram of the digital signal processing integrated circuit (receive side) and electronic circuitry 340 which is used to implement a particular embodiment of the intelligent telecommunications interface having automatic adaptive delay distortion equalization built in accordance with the present invention. Referring to FIG. 19, watchdog timer U9 with capacitor CU9 and the connection of U9-7 to U10-73 provides a reset to U10 and U1 if U10 does not pulse U9-7 or if U9-3 fall below 4.75 volts. Resistor R62 is used as a pull-up to U10-66 (reset). Resistors R52, R53, R54, R55, R56, R57, R59, R61 provide pull-ups to the unused input/output pins of U10. Capacitors CU10, CUU10, C24 are filter capacitors for the +5 volts power input to U10. The clock input to U10 (U10-67) is provided by buffer U15 and resistor R63. The memory address bus lines U10-32, 31, 30, 29, 26, 25, 24, 23, 22, 20, 19, 18 to U12 and 13-10, 9, 8, 7, 6, 5, 4, 3, 25, 24, 23 provides the connections to address the first 8K of memory stored in the 27Lv256 (U12 and 13). The addressing is restricted to the first 8K as U12 and 132, 26, 27 are pulled low. The output of U12 and 13 are enable by U10-33 by U1-5 pins 1 and 2 and connections to U12 and 13 pin 20. U12 and 13 data outputs (U12 13 8-11, 12, 13, 14, 15, 16, 17, 18, 19) to U10 35, 36, 37, 38, 39, 40, 42, 43, 44, 45, 46, 47, 46, 49, 50, 51 provides a 16 bit data bus. CU12, CUU12, CU13 and CUU13 are +5 volts filter capacitors for U12 & 13. Codec U11 (T7525) provides the A/D and D/A conversion of analog signals to digital signals and vice versa so that U10 can operate on the digital data. Resistors R68, R69 and capacitors C18, C19 provide filters for the analog input to U11. Circuit U14, C22 and R64 provides a means to reset the codec U11 upon power up. Capacitors C20 and 21 are power filters for U11. A 2.048 MHz clock is provided to U11 by the connection of U10-59 to U11-8. Input analog signals are connected to U11 by pins 22 and 23. They are converted to digital serial data by U11 and sent to U10-56 by U11-12. Serial digital signals from U10 are connected to U11 by the connection of U10-61 to U11-16. Timing signal between U10 and U11 are provided by connections U10-57, 60 to U11-9, 11. A CMOS crystal control oscillator consisting of U15-3, 4, 5, 6, 10, 11 Resistors R63, 65, 66, 67 Capacitors C16 and 17 and Crystal Y2 provides an 8.192 MHz clock to U5 and U10 by U5-67 and U10-67.

Referring to FIGS. 3 to 19 inclusive, with respect to the mathematical and theoritical underpinnings of the delay equalization interface and system for adaptive evelope delay distortion equalization of the present invention, the delay equalization interface will not interact or will not have any effect in the amplitude response of the overall circuit (e.g., the transmit and/or receive signal path). The amplitude equalization is performed by a DST and IETO, so the delay equalization interface will take care of the delay without introducing a significant effect on the amplitude. The nature of the problem implies the use of an adaptive system, whose delay response will match what is called the inverse delay of the specific circuit (i.e., receive and/or transmit signal path). Given that the solution implies an adaptive filter, its implementation requires a digital filter.

Equation 1 shows a recursive difference equation, y(n) is the output of the equation, x(n−k) is the input sample at time n−k, y(n−k) is the output sample at time n−k, "ak" is the feedback coefficient of order "k" where 1<="k"<="M", "M" is the number of "ak" coefficients, "bk" is the feed forward coefficient of order "k", where 0<="k"<="N", and "N+1" is the number of "bk" coefficients.

Start with the formula for a general digital filter:

$$y(n) = \sum_{k=0}^{N} b_k x(n-k) + \sum_{k=1}^{M} a_k y(n-k) \quad (1)$$

Whose frequency response is:

$$H(w) = \frac{Y(w)}{X(w)} \sum_{k=0}^{N} b_k e^{-jwk} + \sum_{k=1}^{M} a_k H(w) e^{-jwk} \quad (2)$$

Equation 2 shows the transfer function in the frequency response H(w) as the quotient between the output, Y(w) and the input X(w); here, e^(−jwk) is the complex exponential representing a phasor, where "j" is sqrt(−1), "w" is the angular frequency and "k" the coefficient index.

Equation 3 represents the expression obtained by minimizing Equation 2 with respect to the coefficient "bk"; N+1 equations (each symbolically represented by index l) resulted from the minimization. The equations are evaluated over P equally spaced divisions between w=0 and w=pi (3.1415). Using the mean squared error criteria you get the equation:

$$\sum_{i=0}^{P} R_e\{H(-\omega_i)e^{-j\omega_i P}\} = \sum_{k=0}^{n} b_r \sum_{i=0}^{P} R_e\{e^{-j\omega_i(k-1)}\} + \quad (3)$$

$$\sum_{k=1}^{M} a_k \sum_{i=0}^{P} R_e\{H(\omega_i)e^{-j\omega_i(k-1)}\}$$

$l = 0, 1, \ldots N$

Equation 4 represents the expression obtained by minimizing Equation 2 with respect to the coefficient "ak"; M equations (each symbolically represented by index l) resulted from the minimization. The equations are evaluated over P equally spaced divisions between w=0 and w=pi (3.1415), where the mean squared error is minimized over P points in the frequency spectrum from "w"=0 to "w"=P.

$$\sum_{i=0}^{P} |H(\omega_i)|^2 R_e\{e^{-j\omega_i l}\} = \sum_{k=0}^{N} b_k \sum_{i=0}^{P} R_e\{H(-\omega_i)e^{-j\omega_i(k-1)}\} + \quad (4)$$

$$\sum_{k=1}^{M} a_r \sum_{i=0}^{P} |H(\omega_i)|^2 R_e\{e^{-j\omega_i(k-1)}\}$$

$l = 1, 2, \ldots M$

By using these equations you can get the coefficients "$b_r$" and "$a_r$" that match the pattern you are looking for.

Equation 5 split the frequency response H(wi) at frequency wi as the product of the amplitude times the phase or containing phase information. $H(w_i)$ is the frequency response of the filter at the frequency $w_i$ and it can be represented as:

$$H(\omega_i) = |H(\omega_i)| e^{-j\phi(\omega_i)} \quad (5)$$

Equation 6 indicates that the Delay response D(w) in the frequency domain, as the derivative of the phase $\phi(\omega)$ [phi(w)]. Knowing that there should not be any effect on the amplitude |H(w_i)| must be set to equal 1. Also, you know the delay D(w), in the equation, you need the phase:

$$D(\omega) = d\phi(\omega)/d\omega \text{ then the phase } \phi(\omega) = \int D(\omega) d\omega \quad (6)$$

So a numeric integration of the delay will provide us the phase $\phi(\omega)$.

The main problem with this particular approach is that the equations provide the mathematical solution to the problem but this solution most of the time was not practical to implement (i.e., the digital filter will get on oscillations after a few iterations and the effect on the amplitude response was not totally predictable). A further disadvantage is the order itself as a high order (as in 20) introduces a lot of delay to the final response.

FIG. 20 is a diagrammatic representation of an all pass filter 101. Referring to FIG. 20, the transfer function H(z) in the digital domain is expressed as the quotient between the input X(z) and the output Y(z). An all pass digital filter has no effect on the amplitude response.

Equation 7 shows the transfer function of an all pass filter. For N+1 coefficients the numerator and denominator share the same coefficients, being different only the order of "z". An all pass filter has the following equation.

$$H(z) = \frac{\sum_{k=0}^{N} a_k z^{-N+k}}{\sum_{k=0}^{N} a_k z^{-k}} = \quad (7)$$

$$\frac{a_N + a_{N-1}z^{-1} + \ldots + a_1 z^{-N+1} + a_0 z^{-N}}{a_0 + a_1 z^{-1} + \ldots + a_{0-1} z^{-N+1} + a_n z^{-N}}$$

Equation 8 shows a sequence of steps needed to probe that the magnitude of the transfer function of an all pass filter is always equal to 1. A(z) represents the summation of the N+1 "ak" coefficient in the z domain.

$$\text{if } A(z) = \sum_{k=0}^{N} a_k z^{-k} \rightarrow H(z) = z^{-N} \frac{A(z^{-1})}{A(z)} \rightarrow \quad (8)$$

$$|H(z)| = |z^{-N}| \frac{|A(z^{-1})|}{|A(z)|} = 1$$

Equation 9 represents the difference equation (in the time domain) of an all pass digital filter whose forward and feedback coefficients are "bk". So, by using the mean squared error criteria, you have:

$$y(n) = \sum_{k=0}^{N} b_k x(n-k) + \sum_{k=1}^{N} b_{N-k} y(n-k) \quad (9)$$

assuming $b_N = 1$

Equation 10 represents the transfer function H(w) of an all pass digital filter in the frequency domain.

$$H(\omega) = \sum_{k=0}^{N-1} b_k(e^{-J\omega k} + H(\omega)e^{-J\omega(N-k)}) + b_N e^{-J\omega N} \quad (10)$$

Equation 11 shows an expression for the error or difference between the real frequency response H(w) at frequency "w" and the response of the all pass digital filter with N "bk" coefficients. The error is:

$$\text{error} = H(\omega) - \sum_{k=0}^{N-1} b_k(e^{-J\omega k} + H(\omega)e^{-J\omega(N-k)}) - b_N e^{-J\omega N} \quad (11)$$

Equation 12 shows the summation of the squared error over P points on the frequency spectrum. Minimizing this expression call for a first order partial derivative with respect to coefficient "bk" made equal to zero. The equation really represent N equation, considering N coefficients. Over P points in the frequency spectrum.

$$\xi = \sum_{i=1}^{P} \text{error.error}^*; \text{ with this expression you minimize } \xi \quad (12)$$

$$\frac{\delta \xi}{\delta b_p} = 0 \text{ for } l = 0, \ldots N-1$$

$l$ same as $1 = 0$

Equation 13 provides N equations to calculate N "bk" coefficients of an all pass digital filter order N+1 based on the measured frequency response H(w) and the complex frequency $e^{j\omega k}$. Then you have:

$$\sum_{k=0}^{N-1} b_k \sum_{i=1}^{P} R_e\{e^{-J\omega_i(k-1)} + H(-\omega_i)e^{-J\omega_i(N-k-1)}\} = 0 \quad (13)$$

This equation has to be rearranged in order to be implemented to model the inverse delay. Suppose that the inverse delay you want to match is D(w). You want to use an all pass digital filter to do the match, H(w), you decompose H(w) into the different factors.

Equation 14 shows the transfer function of an all pass digital filter H(w) represented as the product of N all pass sections $H_i(\omega)$.

$$H(\omega) = H_1(\omega) \cdot H_2(\omega) \cdot H_3(\omega) \ldots H_N(\omega) = \prod_{I=1}^{N} H_i(\omega) \quad (14)$$

Each factor being an all pass filter; then equation 15 shows the previous transfer function as the product of the scalar magnitude and a complex phasor. Following the previous product representation, the magnitudes of $H_i(\omega)$ are multiplied and the phasors exponents added. Recalling that the magnitude of each section is one, the result is a complex exponential whose phase is a summatory of N partial phases $\phi_i(\omega)$.

$$H(\omega) = |H(\omega)|e^{J\phi(\omega)} = \prod_{i=1}^{N} |H_i(\omega)|e^{J\phi_i(\omega)} = e^{J(\Sigma \phi_i(\omega))} \quad (15)$$

then the phase: $\phi(\omega) = \sum_{i=1}^{N} \phi_i(\omega)$.

Equation 16 shows the delay D(w) in the frequency domain as the first order derivative of the resulting phase, which in turn is a summation of N partial phases; and the delay $D(\omega)$ will be:

$$D(\omega) = \frac{\delta \phi(\omega)}{\delta \omega} = \sum_{i=1}^{N} \frac{\delta \phi(\omega)}{\delta \omega} \quad (16)$$

where $\phi_i(\omega)$ is the phase response of the all pass filter "i".

Now, the all pass filter "i" could be of any order; using small order will simplify the implementation and will minimize the delay of the final response. For a 1st order all pass filter:

$$H^{(1)}(z) = \frac{a + bz^{-1}}{b + az^{-1}} \quad (17)$$

Equation 17 represents the transfer function, in the digital domain, of a first order all pass filter with coefficients "a" and "b".

$$H^{(1)}(\omega) = \frac{a + b\cos\omega - jb\sin\omega}{b + a\cos\omega - Ja\sin\omega} \quad (18)$$

Equation 18 represents the transfer function in the complex frequency domain of a first order all pass filter with coefficients "a" and "b". The expression for the phase $\phi(\omega)$ is also given.

$$\phi^{(1)}(\omega) = \tan^{-1} \frac{(-b\sin\omega)}{a + b\cos\omega} - \tan^{-1} \frac{(a\sin\omega)}{b + a\cos\omega}$$

Equation 19 shows the first order derivative of the phase (Delay) as a function of the coefficients "a" and "b" and the frequency "w". From here:

$$\frac{d\phi^{(1)}(\omega)}{d\omega} = \frac{b^2 - a^2}{a^2 + b^2} + 2ab\cos\omega \quad (19)$$

Equation 20 represents the transfer function, in the digital domain and in the complex frequency domain, of a second order all pass filter with coefficients "a", "b" and "c". For a $2^{nd}$ order all pass filter:

$$H^{(2)}(z) = \frac{a + bz^{-1} + cz^{-2}}{c + bz^{-1} + az^{-2}} \quad (20)$$

$$H^{(2)}(\omega) = \frac{a + b\cos\omega + c\cos2\omega - Jb\sin\omega - Jc\sin2\omega}{c + b\cos\omega + a\cos2\omega - Jb\sin\omega - Ja\sin2\omega}$$

Equation 21 represents the expression for the phase $\phi(\omega)$ of a second order all pass filter with coefficients "a", "b" and "c".

$$\phi^{(2)}(\omega) = \tan^{-1}\frac{(-b\sin\omega - c\sin 2\omega)}{a + b\cos\omega + c\cos 2\omega} - \tan\frac{(-b\sin\omega - a\sin 2\omega)}{c + b\cos\omega + a\cos 2\omega} \quad (21)$$

Equation 22 shows the first order derivative of the phase (Delay) as a function of the coefficients "a", "b" and "c" and the frequency "w". With equations 19 and 22 it is possible to build the delay response $D(\omega)$.

$$\frac{d\phi^{(2)}(\omega)}{d\omega} = \frac{2(c^2 - a^2) + 2b(c - a)\cos\omega}{a^2 + b^2 + c^2 + 2b(c + a)\cos\omega + 2ac\cos 2\omega} \quad (22)$$

Equation 23 shows the first order Delay as a function of the coefficient "a" and the frequency "w", given that coefficient "b"=1. For the 1st order delay:

$$D^{(1)}(\omega) = \frac{1 - a^2}{1 + a^2 + 2a\cos\omega} \quad (23)$$

Equation 24 shows the transfer function in the digital domain, of a first order all pass filter with coefficient "a", given that coefficient "b"=1. For the 1st order delay:

$$H^{(1)}(\omega) = \frac{a + z^{-1}}{1 + az^{-1}} \quad (24)$$

Equation 25 shows the second order Delay as a function of the coefficients "a", "b" and the frequency "w", given that coefficient "c"=1. For the second order delay:

$$D^{(2)}(\omega) = \frac{2(1 - a^2) + 2b(1 - a)\cos\omega}{1 + a^2 + b^2 + 2b(1 + a)\cos\omega + 2ac\cos 2\omega} \quad (25)$$

Equation 26 shows the transfer function, in the digital domain, of a second order all pass filter with coefficients "a" and "b", given that coefficient "c"=1.

$$H^{(2)}(\omega) = \frac{a + bz^{-1} + z^{-2}}{1 + bz^{-1} + az^{-2}} \quad (26)$$

FIG. 21 is a graph 201 illustrating the delay responses from nine different circuits (different cable setups) depicting a common pattern for all the curves with respect to a particular embodiment of the intelligent telecommunications interface having automatic adaptive delay equalization built in accordance with the present invention. Referring to FIG. 21, the vertical axis is in miliseconds and the horizontal axis in Khz.

FIGS. 22A and 22B are the respective graphs 203 as the Delay response as a function of frequency for a typical telecommunications system, and respective graphs 205 as the Delay response as a function of frequency for the all pass filter needed to compensate the delay depicted in FIG. 22A with respect to a particular embodiment of the intelligent telecommunications interface having automatic adaptive delay distortion equalization built in accordance with the present invention. Referring to FIG. 22B, the resulting compensating curve 205 represents an inverse delay pattern.

Figure 23A:
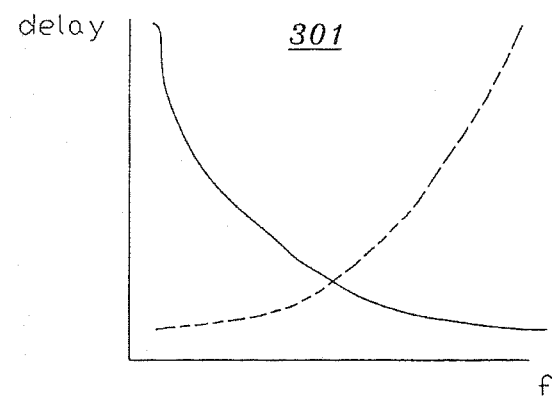
FIGS. 23A and 23B are respective graphs illustrating different delay responses of a first order and a second order all pass filters with respect to a particular embodiment of the intelligent telecommunications interface having automatic adaptive delay distortion equalization built in accordance with the present invention.
Figure 23B:
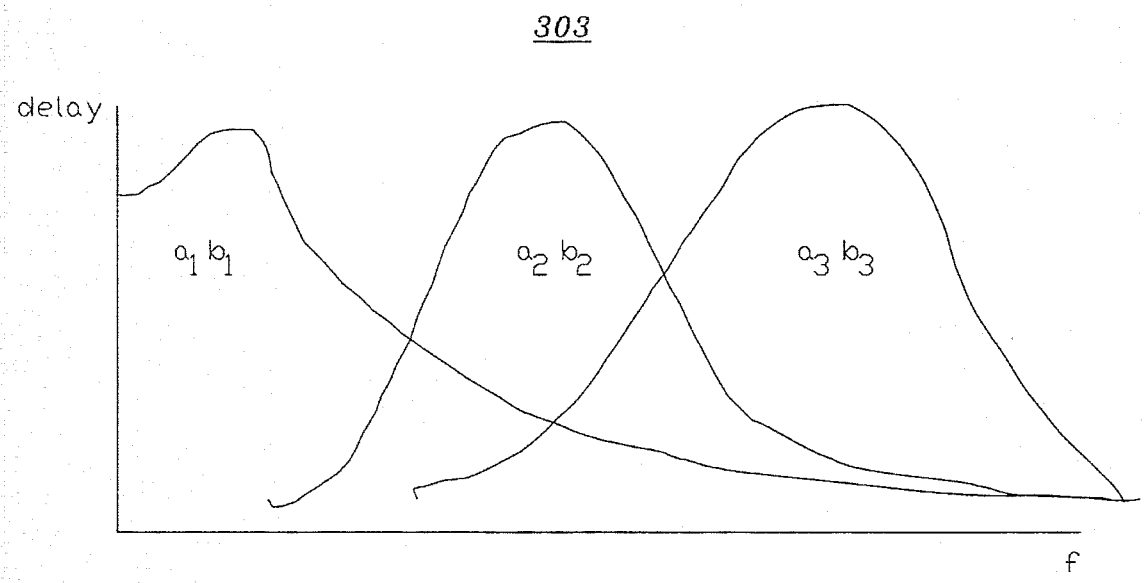

FIGS. 23A and 23B are the respective graphs 301 as the delay response for a first order all pass filter and respective graphs 303 as the delay response for a second order all pass filter with respect to a particular embodiment of the intelligent telecommunications interface having automatic adaptive delay distortion equalization built in accordance with the present invention. Referring to FIG. 23A, delay changes with coefficient "a" in the way depicted. The horizontal line is when "a"=0. Referring to FIG. 23B, delay changes with coefficient "a" and "b". The Delay response becomes very sensitive with respect to the numerical values of coefficients "a" and "b". The shape of the Delay response can change by choosing coefficients "a" and "b" in the proper ranges.

By using three second order delay stages it is possible to match the inverse delay pattern (i.e., three second order stages are enough to get the equalization you are looking for). By using only three stages, the computation process is simplified and the overall delay is minimized. By doing this manually (changing the coefficients by trial and error) you can get a close match (this implies choosing coefficients "a" and "b" properly). This is a simple solution, which is stable on all cases, has no amplitude distortion, introduces a very small delay and satisfies the template you are aiming at. More stages can be added to increase precision and improve the match, if required.

FIG. 24 is a graph 307 illustrating the use of the combination of three different second order all pass filters delay stages to match the inverse delay pattern with respect to a particular embodiment of the intelligent telecommunications interface having automatic adaptive delay distortion equalization built in accordance with the present invention. Given that this is applied in cascade, the overall Delay is the summation of the three independent effects. A comparison between the desired delay D(w) and the resulting delay $\phi'(w)$ shows a close match.

By implementing the resulting digital filter in real time, for a specific delay $D(\omega)$, you have a specific inverse delay filter that was previously calculated or designed for $D(\omega)$. The simplicity of the resulting filter, introduces small overall delay, equalize the delay $D(\omega)$ into the template, has no amplitude distortion and has a simple structure. It has been shown that three second order stages are able to equalize the delay $D(\omega)$.

FIG. 25 is a graph 309 illustrating the use of a specific inverse delay digital filter with respect to a particular embodiment of the intelligent telecommunications interface having automatic adaptive delay distortion equalization built in accordance with the present invention. Referring to FIG. 25, the solid curve illustrates the delay $D(\omega)$ for the system. The dotted line curve represents the combined effect of the system plus the inverse effect introduced by the delay equalization interface. This plot has an offset for comparison purposes. The horizontal axis is expressed in KHz and the vertical axis in Miliseconds.

Equation 27 shows the transfer function H(z) for a normalized digital all pass filter with coefficients "a" and "b". For a second order state:

$$H^{(2)}(\omega) = \frac{a + bz^{-1} + z^{-2}}{1 + bz^{-1} + az^{-2}} \quad (27)$$

Equation 28 provides the Delay $D(\omega)$ for a second order all pass digital filter with coefficients "a" and "b".

$$D^{(2)}(\omega) = \frac{2(1 - a^2) + 2b(1 - a)\cos\omega}{1 + a^2 + b^2 + 2b(1 + a)\cos\omega + 2a\cos 2\omega} \quad (28)$$

Figure 26:
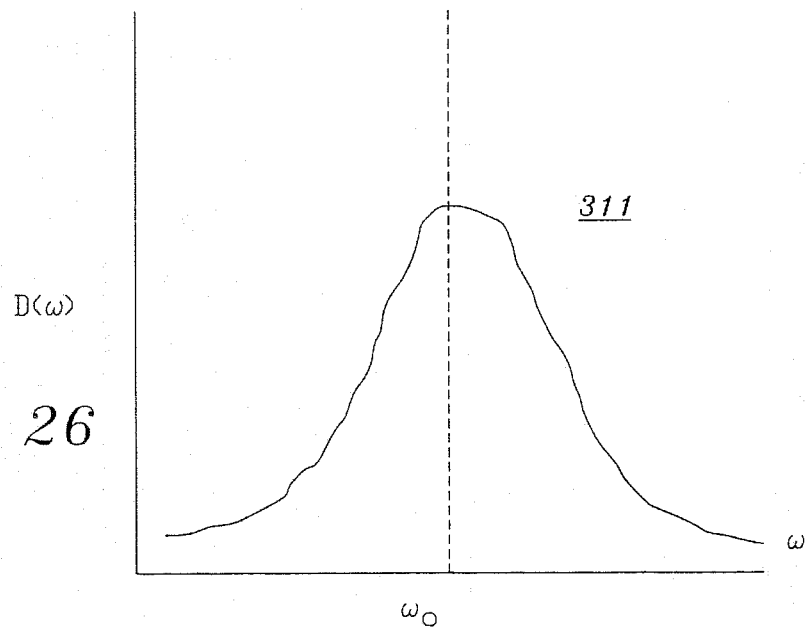
FIG. 26 is a graph illustrating the delay response for a second order all pass filter whose maximum delay occurs at the frequency Wo with respect to a particular embodiment of the intelligent telecommunications interface having automatic adaptive delay distortion equalization built in accordance with the present invention.

Equation 29 provides the a simplified expression for the Delay $D(\omega)$, where the variables $K_i$, for i=1 ... 5 have been introduced to ease the formula manipulation.

$$D(\omega) = \frac{K_1 + K_2\cos\omega}{K_3 + K_4\cos\omega + K_5\cos\omega} \quad (29)$$

where
$K_1 = 2(1 - a^2)$
$K_2 = 2b(1 - a)$
$K_3 = 1 + a^2 + b^2$
$K_4 = 2b(1 + a)$
$K_5 = 2a$ FIG. 26 is a graph 311 depicting the delay response for a second order all pass filter, where $w_0$ represent the frequency where the maximum delay $D(w_0)$ occurs. Referring to FIG. 26, to calculate the frequency $w_0$ where the peak of the "bell" shape happens, you make $$\frac{\delta D(\omega)}{\delta \omega} = 0.$$

Equation 30 shows the first order partial derivative with respect to the frequency "$\omega$" of the Delay $D(\omega)$. This is a function of the previously defined $K_i$'s and the frequency "$\omega$".

$$\frac{\delta D}{\delta \omega} = \frac{(K_3 + K_4 \cos\omega + K_5 \cos 2\omega)(-K_2 \sin\omega) - (K_1 + K_2 \cos\omega)(-K_4 \sin\omega - 2K_5 \sin(2\omega))\omega}{(K_3 + K_4 \cos\omega + K_5 \cos\omega)^2} \quad (30)$$

Equation 31 shows a simplified expression of equation 30 after this one has been made equal to 0, for $\omega=\omega_0$.

$$K_2(K_3-K_5+K_4 \cos \omega+2K_5 \cos^2 \omega)=(K_1+K_2 \cos \omega)(K_4+4K_5 \cos \omega) \quad (31)$$

Equation 32 is a second order equation for Cos ($\omega_0$) as a function of the Ki's.

$$2K_2K_5 \cos^2 \omega+4K_5K_1 \cos \omega+K_1K_4-K_2K_3+K_2 K_5=0 \quad (32)$$

Equation 33 and 34 shows the solution for $\cos(w_0)$ and how is simplified.

$$\cos\omega_0 = \quad (33)$$

$$\frac{-4K_1K_5 + \sqrt{16K_1^2K_5^2 - 8K_2K_5(K_1K_4 - K_2K_3 + K_2K_5)}}{4K_2K_5}$$

$$\cos\omega_0 = \quad (34)$$

$$\frac{-K_1}{K_2} + \sqrt{\left(\frac{K_1}{K_2}\right)^2 - \frac{1}{2}\frac{K_1K_4}{K_2K_5} + \frac{1}{2}\frac{K_3}{K_5} - \frac{1}{2}}$$

Equation 35 shows the exact expression to compute $w_0$, the frequency where the maximum delay $D(w_0)$ occurs, as a function of the coefficients "a" and "b".

$$\omega_0 = \cos^{-1}\left(-\left(\frac{1+a}{b}\right) + \sqrt{\left(\frac{1+a}{b}\right)^2 - \frac{(1+a)^2}{2a} + \frac{1+a^2+b^2}{4a} - \frac{1}{2}}\right) \quad (35)$$

Figure 27:
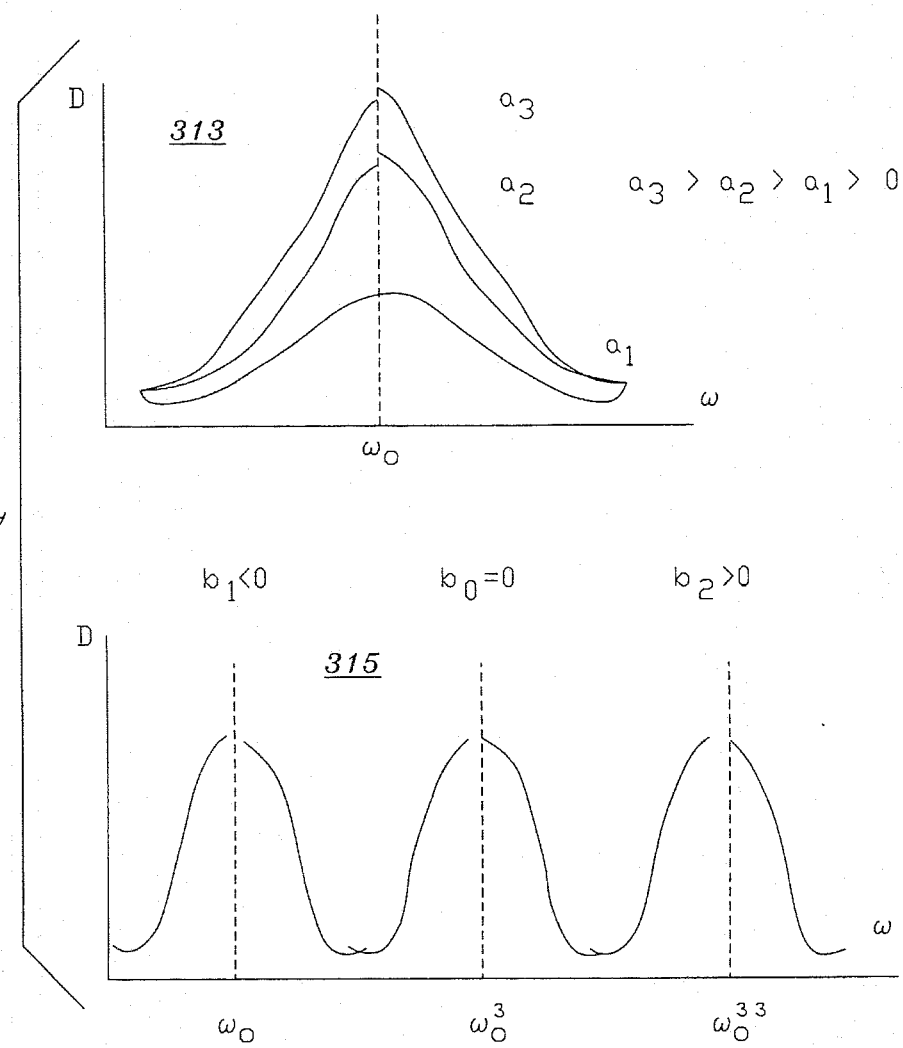
FIG. 27 shows respective graphs illustrating the resulting curves depicting the central frequency of different second order all pass filter delay curves obtained by changing coefficients "a" and "b" of the all pass filter with respect to a particular embodiment of the intelligent telecommunications interface having automatic adaptive delay distortion equalization built in accordance with the present invention.

FIGS. 27A and 27B are respective graphs 313 and 315 illustrating the resulting curves depicting the central frequency of expected delay curves by changing coefficients "a" and "b" with respect to a particular embodiment of the intelligent telecommunications interface having automatic adaptive delay distortion equalization built in accordance with the present invention. Referring to FIG. 27A, the Delay curve $D(\omega)$ as a function of the coefficients "a" and "b". It is shown that those coefficients have provided independent changes under determined numerical conditions (see FIG. 27B). The "a" coefficient affects the amount of the delay and the "b" coefficient affects where the Delay is applied. Therefore, under certain restrictions, D(w) changes with coefficient "a" and coefficient "b". Equation 36 reproduces the delay D(w) of a second order all pass filters with coefficients "a" and "b".

$$D(\omega) = \frac{2(1-a^2) + 2b(1-a)\cos\omega_0}{1+a^2+b^2+2b(1+a)\cos\omega+2a\cos 2\omega} \quad (36)$$

Figure 28A:
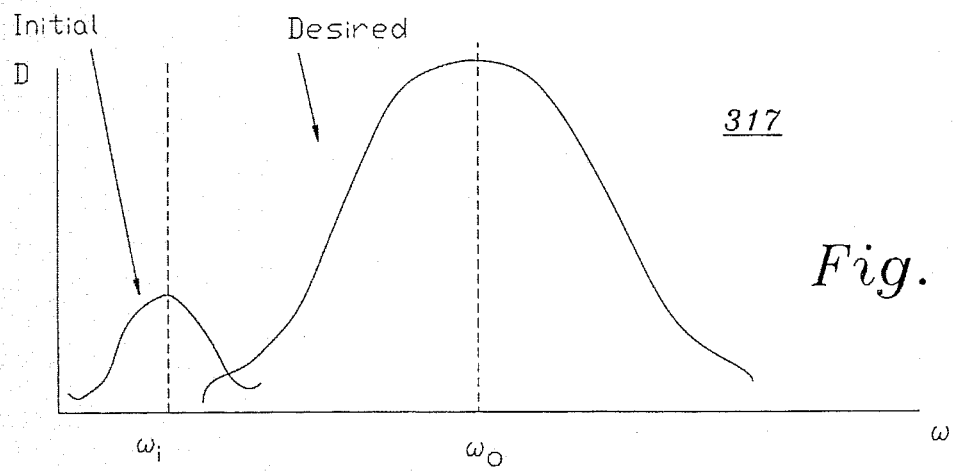
FIGS. 28A, 28B and 28C are respective graphs illustrating the initial and desired curves depicting the shape and central frequency of expected delay curves for the rough approximation algorithm with respect to a particular embodiment of the intelligent telecommunications interface having automatic adaptive delay distortion equalization built in accordance with the present invention.
Figure 28B:
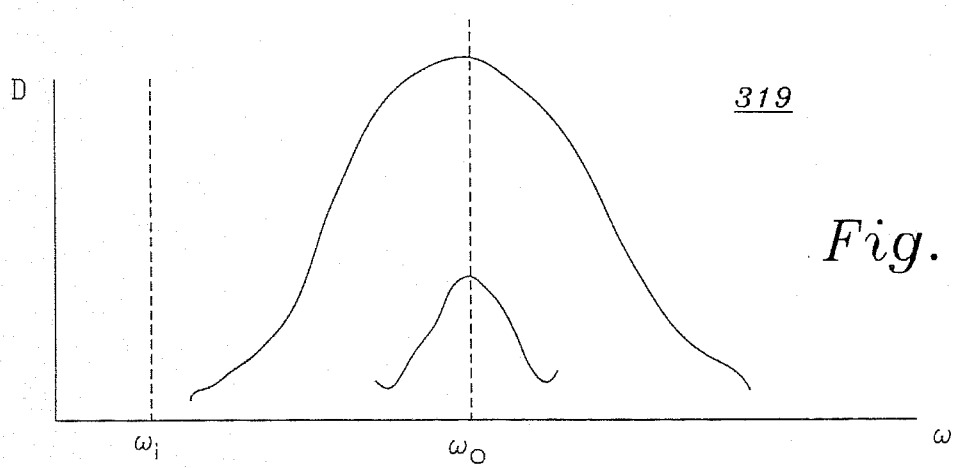
Figure 28C:
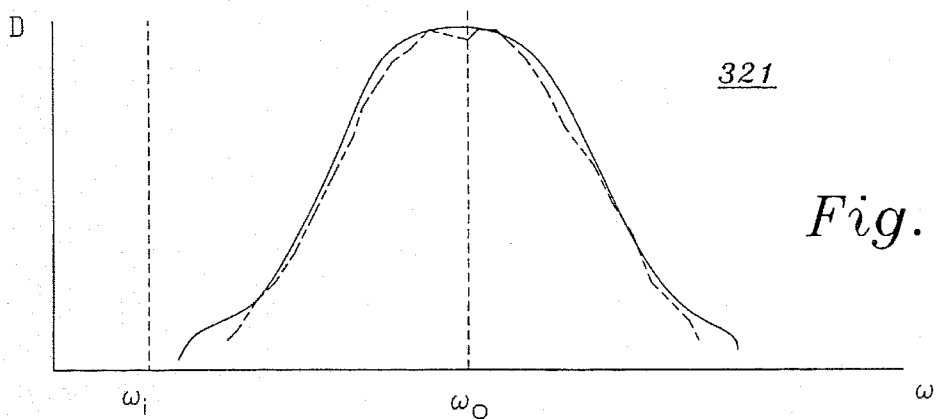

FIGS. 28A, 28B, and 28C are respective graphs 317, 319, and 321 illustrating the resulting curves depicting the shape and central frequency of expected delay curves for the "rough" approximation algorithm with respect to a particular embodiment of the intelligent telecommunications interface having automatic adaptive delay distortion equalization built in accordance with the present invention. Referring to FIG. 28A, coefficients "a" and "b" can be changed to match a desired behavior. Coefficient "b" can be changed in order to match $w_0$. Given the initial condition at frequency $\omega_i$, the desired condition has the maximum delay at $\omega_0$. Coefficient "a" controls basically the shape of the "bell" while coefficient "b" controls the central frequency. From the initial set "a" and "b", coefficient "b" is changed until $\omega_i=\omega_0$ (keeping "a" constant). Referring to FIG. 28B, the curve depicts how the initial "bell"-shaped curve has moved in frequency toward the desired response until both "bells" have the maximum at the same frequency. This is done by keeping coefficient "a" constant, but changing coefficient "b". Referring to FIG. 28B, the curve depicts how by changing coefficient "a", but keeping coefficient "b" constant, the delay magnitude can be changed until it matches the desired pattern. Once $\omega_i=\omega_0$, coefficient "a" is changed until both shapes, the initial and the desired, match as close as possible. By changing coefficient "a" and "b" independently, a "rough" match is found. Then by getting the central frequency of the desired "bell" shape, you can get a "rough" approximation of the "b" coefficient.

From the following equation for the central frequency $\omega_0$.

$$2K_2K_5 \cos^2 \omega_0+4K_1K_5 \cos \omega+K_1K_4-K_2K_3+K_2K_5=0 \quad (37)$$

Equation 38 represents a normalized second order equation for Cos (w) as a function of the coefficients "a" and "b" after all the Ki's, on Equation 37, have been replaced.

$$\cos^2\omega + \frac{2(1+a)}{b} \cos\omega + \quad (38)$$

$$\left(\frac{1+a}{b}\right)\left(\frac{b}{2}\right)\left(\frac{1+a}{a}\right) -$$

-continued $$\left(\frac{1+a^2+b^2}{4a}\right) + \left(\frac{1}{2}\right) = 0$$

Equation 39 is the same as Equation 38, but it has been expanded on terms of "a" and "b".

$$4ab \cos^2 \omega+8a(1+a) \cos \omega+b+6ab+ba^2-b^3=0 \quad (39)$$

Equation 40 is rearranged in such a way that it can be solve for "b". Two change of variables are made to simplify manipulation: K1 and K2.

$$b^3 - \underbrace{b(1 + 6a + a^2 + 4a\cos^2\omega)}_{K_1} - \underbrace{8a(1+a)\cos\omega}_{K_2} = 0 \quad (40)$$

Equation 41 shows the cubic equation on "b", which can be used to find the value of "b", given "a" and $w_0$, that procude the desired frequency match. Then you have a cubic equation:

$$b^3-bK_1-K_2=0 \quad (41)$$

Equation 42 represents the well known Newton's method to find roots, here "$x_n$" is the value of "x" at iteration "n", "$x_{n-1}$" will be "x" at iteration "n-1" (previous), $f(x_{n-1})$ is the function evaluated at "$x_{n-1}$" and $f'(x_{n-1})$ is the first order derivative. By using Newton method:

$$\chi_n = \chi_{n-1} - \frac{f(\chi_{n-1})}{f'(\chi_{n-1})} \quad (42)$$

You end up with an iterative solution.

Equation 43 was found by replacing Equation 41 with Equation 42. As a result you end up having an iterative equation to find the roots of Equation 42. K1 and K2 show the equation dependency with respect to coefficient "a" and $w_0$.

$$b_n = b_{n-1} - \frac{b_{n-1}^3 - b_{n-1}K_1 - K_2}{3b_{n-1}^2 - K_1} \quad (43)$$

$$K1 = 1 + 6a + a^2 + 4a\cos^2\omega_0$$
$$K2 = 8a(1 + a)\cos\omega_0$$

You found coefficient "b" by knowing $w_0$ first and keeping coefficient "a" constant. In order to find coefficient "a" you use a LMS adaptive approach: The previous discussion describes the method to use for a rough approach. This method will use this in this manner.

Figure 29A:
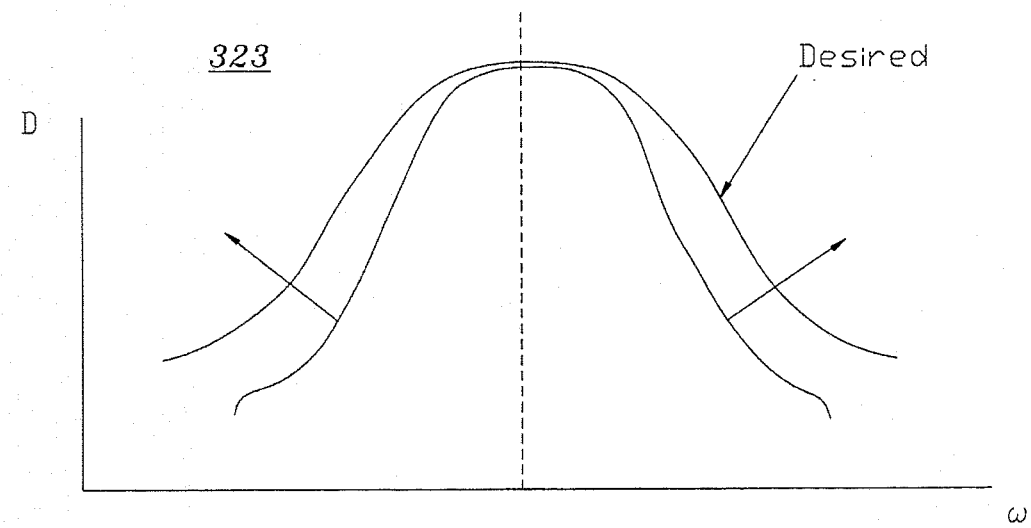
FIGS. 29A and 29B are respective graphs illustrating the resulting curves depicting the shape and central frequency of expected delay curves by increasing or decreasing coefficient "a" with respect to a particular embodiment of the intelligent telecommunications interface having automatic adaptive delay distortion equalization built in accordance with the present invention.
Figure 29B:
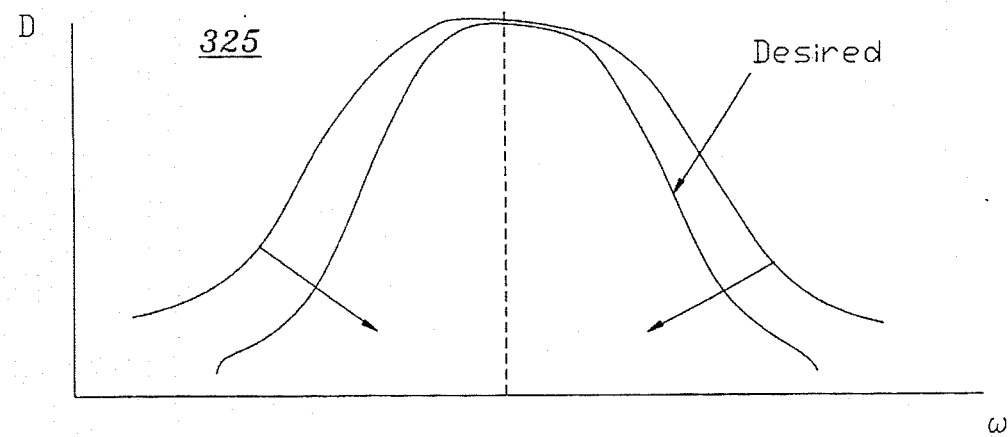

FIGS. 29A and 29B are respective graphs 323 and 324 illustrating the resulting curves depicting the shape and central frequency of expected delay curves by increasing or decreasing coefficient "a" with respect to a particular embodiment of the intelligent telecommunications interface having automatic adaptive delay distortion equalization built in accordance with the present invention. The "bell"-shaped Delay response of a second order all-pass filter can be changed by modifying coefficient "a". Referring to FIG. 29A, if delay is less than desired, then increase coefficient "a". Referring to FIG. 29B, if delay is more than desired, then decrease coefficient "a". Referring to FIGS. 29A and 29B, the figures depict how the "bell"-shaped response of the delay equalization interface of the present invention is compared to the desired response (in each respective figure). To do this, both curves have been adjusted to have the same maximum delay D(w) at $w_0$. Under these circumstances, a shape-comparison to adjust cofficient a makes sense.

Figure 30:
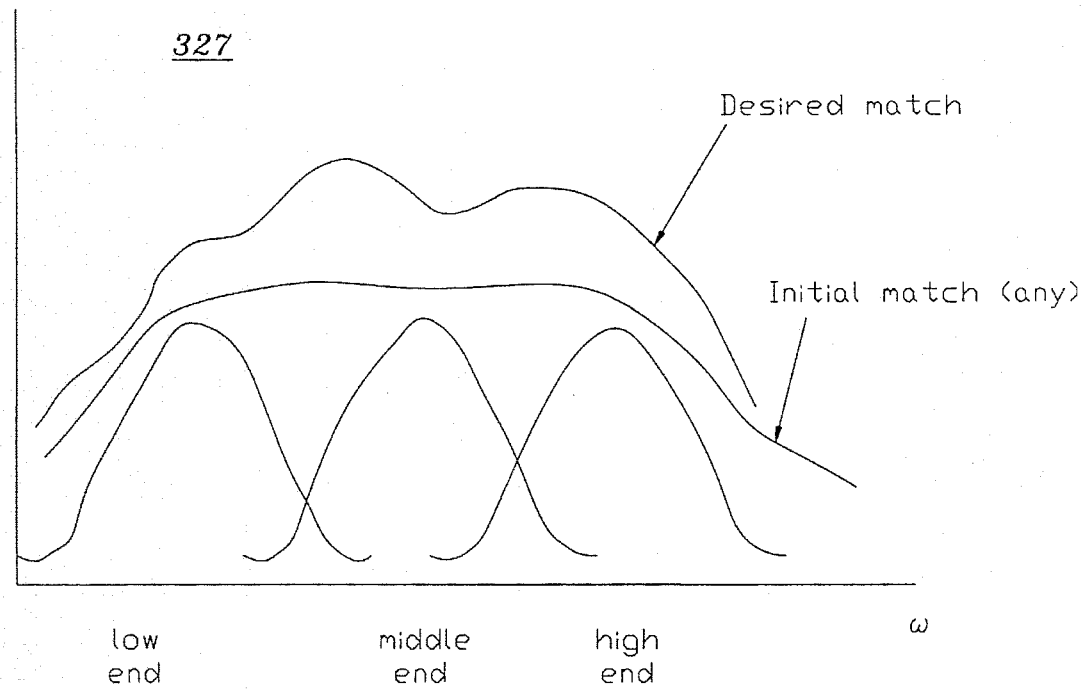
FIG. 30 is a graph illustrating the low end, the middle end and the high end filter processing used with respect to a particular embodiment of the intelligent telecommunications interface having automatic adaptive delay distortion equalization built in accordance with the present invention.

FIG. 30 is a graph 327 illustrating how the low end, the middle end, and the high end filter processing used with respect to a particular embodiment of the intelligent telecommunications interface having automatic adaptive delay distortion equalization built in accordance with the present invention. Referring to FIG. 30, the composite effect of three different second order all-pass filters, their initial combined effect is depicted, as well as the desired final match. If should be point out, that both curves will be adjusted to have the same maximum delay D(w) at the same frequency. This process needs to be repeated every time there is an adjustment to any of the coefficients.

Figure 31A:
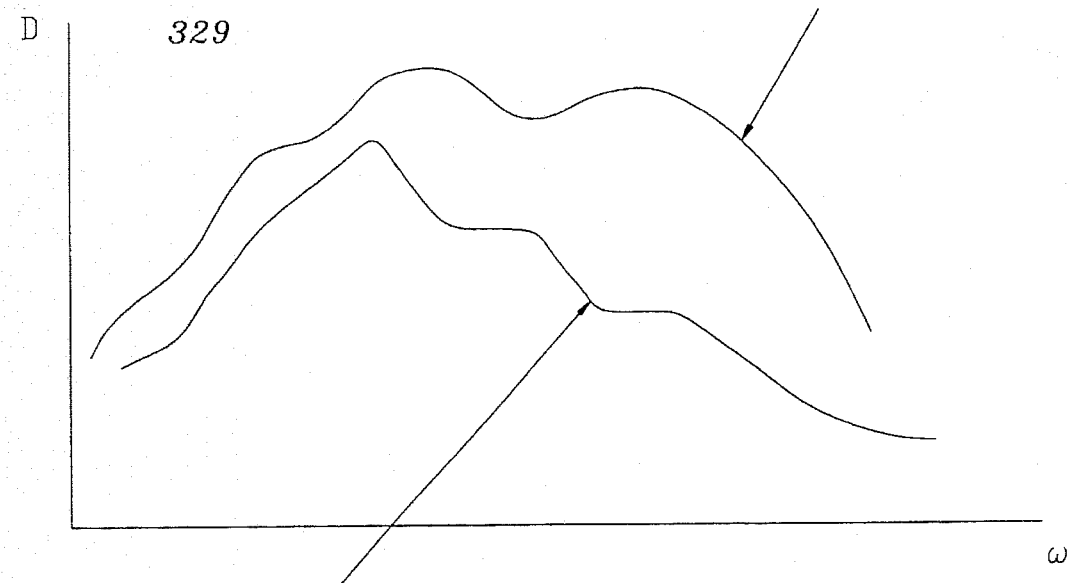
FIGS. 31A and 31B are respective graphs depicting the approach for the low end filter processing used with respect to a particular embodiment of the intelligent telecommunications interface having automatic adaptive delay distortion equalization built in accordance with the present invention.
Figure 31B:
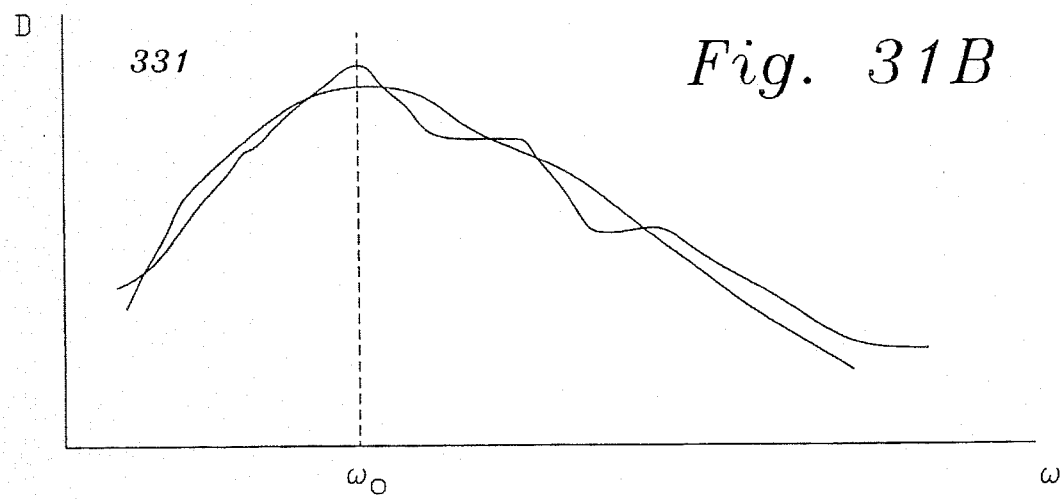

FIGS. 31A and 31B are respective graphs 329 and 331 depicting how the low end filter processing used with respect to a particular embodiment of the intelligent telecommunications interface having automatic adaptive delay distortion equalization built in accordance with the present invention. Referring to FIG. 31A, the effect of the low-end second order all-pass filter is depicted, the filter's initial delay is shown, as well as the desired partial match. The partial match is the difference between the final match and the effect of the other two second order all-pass filters, the middle-end, and the high-end. In this way, each second order all pass filter (low, middle, and high) have a different pattern to match, but added all together the overall response should be as close as the desired final match. Referring to FIG. 31B, depicted is how the adaptive process has changed the coefficient "a" in a way that the desired partial match and the response of the second order all-pass filter are almost the same. The central frequency $\omega_0$ is found first; based on $\omega_0$, you calculate b by using the iterative solution previously described. Once coefficient "b" is found, coefficient "a" is found by using the LMS algorithm previously described. The match found provides the match with the lowest squared error possible with this method. This procedure is then repeated for the middle end and the high end, and, repeated if needed. Basically is a successive approximation method.

Finding the central frequency $\omega_0$ could become a problem due to the lack of resolution, or to the shape of the delay you need to match. Accordingly, obtain the peak or maximum reading from the set of delay versus frequency table.

Figure 32:
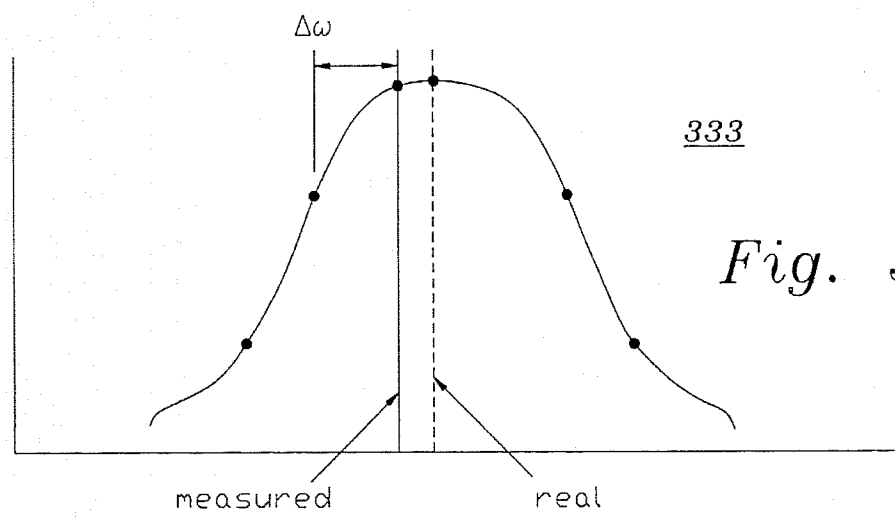
FIG. 32 is a graph depicting the difference between the measured and the real central frequency for the filter processing used with respect to a particular embodiment of the intelligent telecommunications interface having automatic adaptive delay distortion equalization built in accordance with the present invention.

FIG. 32 is a graph 333 illustrating the maximum for the central frequency for the filter processing used with respect to a particular embodiment of the intelligent telecommunications interface having automatic adaptive delay distortion equalization built in accordance with the present invention. Referring to FIG. 32, the delay equalization interface measures delay every $\Delta\omega$, if the peak of the "bell"-shaped response is not one of the frequencies where the sampling was made, a considerable approximation error could be made when $\omega_0$ is introduced into the equations, because this value is not the real one.

Figure 33:
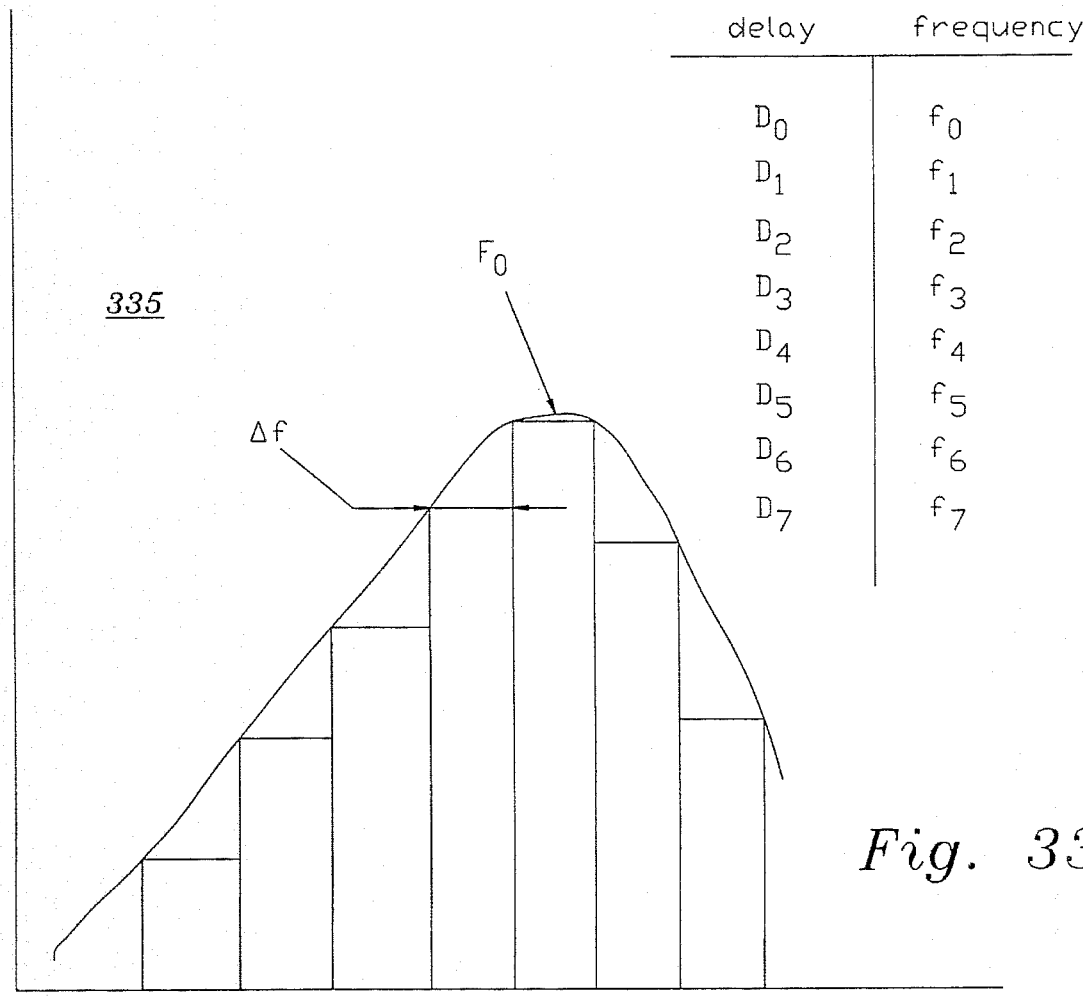
FIG. 33 is a graph depicting the general approach utilized in order to compensate for the error introduced when collecting data in order to obtain the frequency when the maximum delay occurred with respect to a particular embodiment of the intelligent telecommunications interface having automatic adaptive delay distortion equalization built in accordance with the present invention.

FIG. 33 is a graph 335 depicting the maximum and type and central frequencies of expected for the filter processing used with respect to a particular embodiment of the intelligent telecommunications interface having automatic adaptive delay distortion equalization built in accordance with the present invention. Referring to FIG. 33, along with the delay a table delay versus frequency is used. By dividing the "bell"-shaped curve as shown, a corrective factor can be found by using the gravity center criteria and numerical methods. Considering "Fo" as the real central frequency, $f_4$ is close but is not equal to "Fo", to reduce the approximation error you calculate the gravity center of the "bell"-shaped curve by using the look-up table provided.

Equation 44 takes the data from the measured delay vs. frequency response. $\Delta f$ is the frequency difference between two consecutives delay measurements, $D_i$, for $i=0,1,\ldots,7$, are the delay measured at frequency $f_i$. The "new" f4, as shown, is the corrected frequency where the peak of the "bell"-shaped response most closely happens.

$$\text{new } f_4 = f_4 + \frac{\Delta f D_5 + 2\Delta f D_6 + 3\Delta f D_7 - \Delta f D_3 - 2\Delta f D_2 - 3\Delta f D_1}{D_1 + D_2 + D_3 + D_4 + D_5 + D_6 + D_7} \quad (44)$$

The "rough" approximation is then completed. To proceed with the "fine" approximation you use the following.

Equation 45 shows the Delay differential for a second order all-pass filter. A small change on Delay is shown as the result of adding a small variation of coefficient "a" times the first partial derivative of the Delay with respect to coefficient "a", and a small variation of coefficient "b" times the first partial derivative of the Delay with respect to coefficient "b".

$$\Delta D(\omega) = \frac{\delta D}{\delta a} \Delta a + \frac{\delta D}{\delta b} \Delta b \quad (45)$$

Equation 46 shows the delay as a function of coefficients "a" and "b" and the variable change ($K_1$, $K_2$, $K_3$, $K_4$ and $K_5$) made to simplify algebraical manipulations.

$$D = \frac{2(1-a^2) + 2b(1-a)\cos\omega}{1 + a^2 + b^2 2b(1+a)\cos\omega + 2a\cos2\omega} = \quad (46)$$

$$\frac{K_1 + K_2\cos\omega}{K_3 + K_4\cos\omega + K_5\cos2\omega}$$

Equation 47 shows the first partial derivative of the Delay with respect to "a" as a function of $K_i$, i=1,2, ... 5 and the frequency "$\omega$".

$$\frac{\delta D}{\delta a} = \frac{(K_3 + K_4\cos\omega + K_5\cos2\omega)\left(\frac{\delta K_1}{\delta a} + \frac{\delta K_2}{\delta a}\cos\omega\right) - (K_1 + K_2\cos\omega)\left(\frac{\delta K_3}{\delta a} + \frac{\delta K_4}{\delta a}\cos\omega + \frac{\delta K_5}{\delta a}\cos2\omega\right)}{(K_3 + K_4\cos\omega + K_5\cos2\omega)^2} \quad (47)$$

Equation 48 shows the first partial derivative of the Delay with respect to coefficient "a" as a function of coefficient "a" itself, coefficient "b" and the frequency "$\omega$".

$$\frac{\delta D}{\delta a} = \frac{-4a - 2b\cos\omega}{(1+a^2+b^2) + 2b(1+a)\cos\omega + 2a\cos2\omega} - \quad (48)$$

$$D\left(\frac{2a + 2b\cos\omega + 2\cos2\omega}{(1+a^2+b^2) + 2b(1+a)\cos\omega + 2a\cos2\omega}\right)$$

Equations 49 and 50 show extra manipulation to simplify the expression for the first partial derivative of the Delay with respect to coefficient "a". On the expression, the delay itself D has been included; this was intentionally done, so an iterative process is implemented later on.

$$\frac{\delta D}{\delta a} = \frac{D}{2(1-a^2) + 2b(1-a)\cos\omega}(-4a - 2b\cos\omega - \quad (49)$$

$$D(2a + 2b\cos\omega + 2\cos2\omega))$$

$$\frac{\delta D}{\delta a} = \frac{D}{(1-a^2) + b(1-a)\cos\omega}(-2a - b\cos\omega - \quad (50)$$

$$D(a + b\cos\omega + \cos2\omega))$$

Equation 51 shows a valid approximation of the Delay differential for very small changes on coefficient "a".

$$\Delta D \approx \frac{\delta D}{\delta a}\Delta a, \quad (51)$$

a small change $\Delta a < 0.05$ can be precisely reflected on $D$.

In a similar way, Equation 52 shows the first partial derivative of the Delay with respect to coefficient "b" as a function of coefficient "a", coefficient "b" and the frequency "$\omega$".

$$\frac{\delta D}{\delta b} = \frac{D}{(1-a^2) + b(1-a)\cos\omega}((1-a)\cos\omega - \quad (52)$$

$$D(b + (1+a)\cos\omega)$$

Equation 53 shows a similar equation as Equation 51 did, but valid for small changes of coefficient "b". Both limits were found by numerical analysis.

$$\Delta D \approx \frac{\delta D}{\delta b}\Delta b, \quad (53)$$

a small chang3 $\Delta b < 0.01$ can be precisely reflected on $D$.

After the "rough" approximation has been found, a "fine" tuning procedure is carried out by using:

$$\frac{\delta D}{\delta a} \text{ and } \frac{\delta D}{\delta b}$$

Equation 54 shows the Laplacian of the Delay $D(\omega)$. Our interest on finding coefficient "a" and coefficient "b" for every section can be achieved by using a "rough" approximation first (iterative solutions for coefficient "a" and coefficient "b") and then using a "fine" approximation, [the differential of $D(\omega)$]. This procedure automatically finds the best Delay match for any previously unknown system configuration, making the overall delay response flatter.

$$\Delta D = \nabla D = \frac{\delta D}{\delta a}\Delta a + \frac{\delta D}{\delta b}\Delta b \quad (54)$$

$\Delta a$ and $\Delta b$ are applied independently, in this way you minimize the difference between the desired delay and the "rough" approximation. The parameter to minimize is the summation of the squared difference over the frequency spectrum.

The aspects of the present invention which are believed to be novel are set forth with particularity in the appended claims. While a specific embodiment of a novel multivariate system, having an intelligent telecommunications interface having a digital adaptive all-pass filter delay distortion equalization circuitry that is automatically variable, and related method, for automatic envelope delay distortion equalization by providing post-delay and pre-delay distortion equalization for bidirectional data lines in a transmission network on the transmit and receive sides of dedicated telephone lines (e.g., conventional 4-wire analog facility) and the data station termination at the customer premises equipment has been described for the purpose of illustrating the manner in which the invention may be used and made, it should be understood that although the invention has been described by reference to particular embodiments thereof, many changes and modifications of the invention may become apparent to those skilled in the art without departing from the spirit and scope of the invention. All such modifications and changes as may reasonably and properly be included within the scope of our invention are intended to be included herein. Therefore, this invention should not be limited in scope to the particular embodiments shown and described herein, but only by the true spirit and scope of the basic underlying principles disclosed in the claims that follow.

APPENDIX I

Copyright 1995   Westell, Inc.
S00E0000061393630323139E70726DD8
S123D0004FB71035CE00002003A700088C006B26F8CE020235BDF47A393B18CE1000181D3B
S123D0200480181D2202181C2302C601F7005F3B18CE1000181D0440181D2201181C23013F
S123D040C601F7005F3B18CE0063BDFD1C2F13FC0065830001FD0065FC0063C2008200FD2C
S123D060006318CE1000181C2540FC00672F06830001FD0067FC00692F06830001FD0069B6
S123D080FC00692E42F60062273DC501270C18CE1000C62018E80418E704F60062C50227D9
S123D0A00C18CE1000C61018E80418E704F60062C504270C18CE1000C60818E80018E70076
S123D0C0F600614FFD00693B3C37363018CE100018E60AC420F70060B6006027044F5F20E4
S123D0E02FC61FF70061CC04C4FD0067FC00672713F60060260E18CE100018E60AC420F7C8
S123D100006020E8C67AF70061FC006727054F5F383839E6094F3736E6073736E6018D1A92
S123D12031313113118CE100018E60AC420F70060B6006027EFCC000120D63C373630E6013F
S123D140271A5A27055A2726202CC6FEF40062F7006218CE1000181D0420201AC6FEF4005D
S123D16062F7006218CE1000181C04202008C601FA0062F70062E607271A5A27055A2726A3
S123D180202CC6FDF40062F7006218CE1000181D0410201AC6FDF40062F7006218CE1000EC
S123D1A0181C04102008C602FA0062F70062E609271A5A27055A2726202CC6FBF40062F7C7
S123D1C0006218CE1000181D0008201AC6FBF40062F7006218CE1000181C00082008C604E8
S123D1E0FA0062F700623838393C373630EC00FD0067FC006726FB3838393C3C304F5FED34
S123D20C0018CE004F6C0126026C00183AC65518E70018CE004FEC006C0126026C00183AF4
S123D220C65518E70018CE004FEC006C0126026C00183AC64018E700EC001A8300102C137F
S123D24018CE004FE601183A186F006C0126E96C00020E53838393C37363C304F5FED00ECA3
S123D2600083000E2C4BEC02262318CE004FE601CB02183A183CEC00C3B60E188F18E600C4
S123D280183818E7006C0126D66C0020D2EC0283000126F118CE004FE601CB02183A183C5C
S123D2A0EC00C3B600188F18E600183818E70020D4383838393C3C304F5FED0018CE004FC4
S123D2C06C0126026C00183AC65518E70018CE004FEC006C0126026C00183AC65518E7004F
S123D2E018CE004FEC006C0126026C00183AC64018E700EC001A8300102C1318CE004FE6BE
S123D30001183A186F006C0126E96C0020E538383901FEBF40FD02FD7F80FEBDFA690EEC88
S123D32000C3FFF5188FCCD311BDFD2D000AEC0E18CE0005BDFC40E300C3FFF5188F18E6CD
S123D340018CE100018EA2318E723EC0E18CE0005BDFC40E300C3FFF5188F18E60418CE85
S123D360100018E42218E722C601F7005F4F5FED02F6005F5A26FAEC02830010265BEC0ED5
S123D38018CE0005BDFC40E300C3FFF5188F18E60218CE100018E40418E704EC0E18CE008B
S123D3A005BDFC40E300C3FFF5188F18E60118CE100018E42218E722EC0E18CE0005BDFC58
S123D3C040E300C3FFF5188F18E60418CE100018E42218E722AE00383918CE004FEC026CE3
S123D3E00326026C02183A18E60018CE100018E7037F005FEC0E18CE0005BDFC40E300C3E6
S123D400FFF5188F18E60018CE100018EA2218E722EC0E18CE0005BDFC40E300C3FFF518A4
S123D4208F18E60218CE100018E40418E704EC0E18CE0005BDFC40E300C3FFF5188F18E643
S123D4400318CE100018EA0418E7047ED3714F5FBDD2564F5FBDD31BCC0001BDD256CC009A
S123D46001BDD31B3900000003D4A4FFFDD493FFFED482FFFD4B53C373630EC00BDFC96F7
S123D480D4654F5F3736C6013736BDD13A313131312022CC0001373637365FBDD13A313102
S123D4A0313121CC000137365F3736C601BDD13A313131313138393C37363018CE100004
S123D4C0181F2E80F7E60118E72F3838393C3430CC04C4FD006718CE1000181E2E2005FC9B
S123D4E000672EF2FC00672606C623E700200918CE100018E62FE700E6004F3138392854BC
S123D5005441323429284520292852323229284143282853312928545441323529285229
S123D52032322928415942928415942928415942828413129285233292841594B29284C232D2949
S123D54028413129BDFA694CEC00C3FFF8188FCCD4FEBDFD2D0007EC00C3FFEF188FCCD5DA
S123D56005BDFD2D0009EC00C3FFE6188FCCD50EBDFD2D0009EC00C3FFDF188FCCD517BD2F
S123D580FD2D0007EC00C3FFCC188FCCD51EBDFD2D0013EC00C3FFB9188FCCD531BDFD2DB5
S123D5A00013C63018CE100018E72B5F18E72DC6F4F700614F5FED04EC048392
S123D5C000022C30CC00F4BDD1E94F5FED02EC021A8300072C16E300C3FFF8188F18E600FF
S123D5E04FBDD4B86C0326E66C0220E26C0526CD6C0420C94F5FED04EC041A8300092C1670
S123D600E300C3FFEF188F18E6004FBDD4B86C0526E66C0420E2CC0989BDD1E94F5FED04D2
S123D620EC041A8300092C16E300C3FFE6188F18E6004FBDD4B86C0526E66C0420E2CC018A
S123D640E8BDD1E9EC4C263B4F5FED04EC048300022C3CC00F4BDD1E94F5FED02EC021A82
S123D6608300072C16E300C3FFDF188F18E6004FBDD4B86C0326E66C0220E26C0526CD6C5E
S123D6800420C94F5FED04EC048300132C35EC4C2618EC04E300C3FFCC188F18E6004FBD8B
S123D6A0D4B86C0526E16C0420DDEC4C83000126F1EC04E300C3FFB9188F18E6004FBDD44F
S123D6C0B820DFAE00383928545441303029285331292841592B29BDFA4F16EC00C3FFFA27
S123D6E0188FCCD6C7BDFD2D0007EC00C3FFF1188FCCD6CEBDFD2D00094F5FED04EC048370
S123D700000022C30CC00F4BDD1E94F5FED02EC021A8300072C16E300C3FFFA188F18E600BB
S123D7204FBDD4B86C0326E66C0220E26C0526CD6C0420C94F5FED04EC041A8300092C162E

```
S123D740E300C3FFF1188F18E6004FBDD4B86C0526E66C0420E2C67AF70061AE0038393E0E
S123D76086A7EF3E86A7EFBBA3D70A3E86A7EF3BA3D70A3DC6A7EFBDC6A7EF3DD2F1A9BDBF
S123D780D2F1A93F8000003DCCCCCCC3B449BA5BB449BA53F8000004050D4FD387FFFD5BD53
S123D7A0FA6937FCD761ED16FCD75FED144F5FED02ED12ED10ED22ED20CC0029BDD4B84F1F
S123D7C05FED24EC248300172C13E636C123270DBDD4CDE7366C2526EA6C2420E6EC248373
S123D7E0001F2C21E636C123271BBDD4CDE736EC24E300C3FFD7188FE63618E7006C2526F7
S123D800DC6C2420D8EC248300312C13E636C123270DBDD4CDE7366C2526EA6C2420E6ECCB
S123D82000C3FFEEBDDC531AEF02ED1AEC02ED1826066C2126026C20EC208300082E5CECC9
S123D840221A8300202E54E636C123274E6C2326026C22EC18ED02EC1A18CED76BBDFDE5E9
S123D86018CED76FBDFA7E2F05C6014F20025F4FED06EC18ED02EC1A18CED763BDFDE51866
S123D880CED767BDFA7E2C05C6014F20025F4FEA07AA0683000027037ED7B9E636C12326AA
S123D8A008CCFFFFBDFC5D200DEC228300202F0DCCFFFEBDFC5D1AEE02AE003839EC2083CB
S123D8C000082F08CCFFFDBDFC5D20EA4F5FED22ED20CC0029BDD4B84F5FED24EC248300C3
S123D8E0062C13E636C123270DBDD4CDE7366C2526EA6C2420E6EC2483000E2C21E636C12E
S123D90023271BBDD4CDE736EC24E300C3FFF0188FE63618E7006C2526DC6C2420D8EC2491
S123D9208300172C13E636C123270DBDD4CDE7366C2526EA6C2420E6EC2483001F2C21E63F
S123D94036C123271BBDD4CDE736EC24E300C3FFD7188FE63618E7006C2526DC6C2420D883
S123D960EC248300312C13E636C123270DBDD4CDE7366C2526EA6C2420E6EC00C3FFF6BD59
S123D980DC531AEF02ED1EEC02ED1CEC00C3FFEEBDDC531AEF02ED1AEC02ED18ED02EC00DF
S123D9A0C3FFDC188FEC1ABDFDE5ED0AEC02ED08ED02EC0A18CED777BDFA7E2C05C6014F0A
S123D9C020025F4FED06EC08ED02EC0A18CED773BDFA7E2F05C6014F20025F4FEA07AA0687
S123D9E083000026037EDAA6EC08ED02EC0A18CED77FBDFA7E2F05C6014F20025F4FED0622
S123DA00EC08ED02EC0A18CED77BBDFA7E2C05C6014F20025F4FEA07AA0683000026037EDA
S123DA20DAA6EC1826037EDB1EEC201A8300012F401A83001D2C3A05E337C3FFFC188F18E9
S123DA403CCC2000BDFC5DED06EC02ED04EC0CED02EC00C3FFD8188FEC0EBDFEB6188FECA0
S123DA6000C3FFCC188FBDFAC01838BDFB9118ED00FCD785ED12FCD783ED106C2126026C8D
S123DA8020EC201A8300012F0D83001D2C08EC1EED0EEC1CED0CEC00C3FFDC373618CED7EE
S123DAA087BDFAAE2058EC08ED02EC0A18CED78BBDFA7E2C43EC08ED02EC0A18CED78FBD57
S123DAC0FA7E2F34EC201A8300012F1883001D2C13EC00C3FFD43736188FEC00C3FFE41857
S123DAE08FBDFAAEEC00C3FFD8373618CED793BDFAAE4F5FED2220066C2326026C22E63642
S123DB00C123271AEC221A8300102E12EC14ED02EC1618CED797BDFA7E2C037ED8D2E636F4
S123DB20C1232608CCFFFFBDFC5D200DEC228300102F0DCCFFFEBDFC5D1AEE02AE003839DD
S123DB40EC182608CCFFFDBDFC5D20ED1AEE3718EC0605BDFC5D18CED79BBDFAC020DABDBA
S123DB60FA69064F5FED04EC041AA30E2C2105E30C188F18EC00ED02EC0405E306188F1866
S123DB80EC00A30218ED006C0526DC6C0420D8AE0038390B0A06890407027C018600D2006B
S123DBA07E0036000B000000400190034007D00B60115017501F3027F032F0415051F06A8
S123DBC09408BC0C1E12491FFBBDFA6938EC00C3FFC9188FCCDB93BDFD2D0036CC001B375F
S123DBE036EC00C3FFC93736EC38BDDB5FAE00383916370CE507E504E702EC01CB00E60018
S123DC005E0019000000110046009D00FD0196023102FD03FB050F068108380A5F0D60110F
S123DC20A618C625B24000BDFA6938EC00C3FFC9188FCCDBF1BDFD2D0036CC001B3736ECDA
S123DC4000C3FFC93736EC38BDDB5FAE0038393DCCCCCCBDFA691A4F5FED0EEC0E1A830073
S123DC60082C13E31A188F18E600C12E27086C0F26E96C0E20E5EC0EC30001ED0CEC0C1AC7
S123DC808300082C25E31A188F18E6004FC3FFD04D2D17EC0CE31A188F18E6004FC3FFC71E
S123DCA02E086C0D26D76C0C20D34F5FED02ED18EC0CC3FFFFED10EC101AA30E2F30C8
S123DCC0E31A188F18E6004FC3FFD0BDFC5D188FEC00C3FFFB188FBDFDC718CEDC4FBDFA67
S123DCE0C0ED18EC02ED16EC10830001ED1020C9EC0EC3FFFFED10A6102D28EC10E31A1830
S123DD008F18E6004FC3FFD04D2D18EC10E31A188F18E6004FC3FFC72E09EC10830001EDE5
S123DD201020D44F5FED02ED14ED12EC10C30001ED0CEC0C1AA30E2C4AE31A188F18E600AA
S123DD404FC3FFD0BDFC5DED0AEC02ED08CC000ABDFC5DED06EC02ED04EC12ED02EC00C394
S123DD60FFE9188FEC14BDFAC0188FEC00C3FFED188FBDFDC7ED14EC02ED126C0D26B36C83
S123DD800C20AFEC10E31A188F18E600C12D2617EC12ED02EC14BDFB84188FEC00C3FFFB62
S123DDA0188FBDFDE52010EC12ED02EC00C3FFFB188FEC14BDFDC71AEE02AE003839BDFA4B
S123DDC069064F5FED02ED04EC041AA30E2C2405E306188F18EC00A3022F0CEC0405E306E2
S123DDE0188F18EC002002EC02ED026C0526D96C0420D5EC02AE003839387FFFD5BDFA69E8
S123DE00164F5FED02ED0EED0CEC1E260BCC0004ED12C618ED1020084F5FED12C611ED10C9
S123DE20EC12ED14EC141AA3102C5505E31C188F18EC00ED06EC1405E316188F18EC00A3A3
S123DE4006BDFC5D18CEDDF9BDFAC0ED0AEC02ED08ED02EC00C3FFF1188FEC0ABDFAC0ED06
S123DE6006EC02ED04EC00C3FFF53736188FEC00C3FFED188FBDFAAE6C1526A86C1420A4C8
S123DE80EC0CED02EC0E1AEE02AE003839BDFA69061AEE0618EC00ED04CC0001ED02EC02A1
S123DEA001AA30C2C2405E306188F18EC00A3042C0CEC0205E306188F18EC002002EC04ED47
```

```
S123DEC0046C0326D96C0220D54F5FED02EC021AA30C2C1505E306188F18EC00A30418ED8F
S123DEE0006C0326E86C0220E4AE00383938D1B717B8D1B717BDFA4F22CC0001BDFC5DEDEA
S123DF0012EC02ED10CC0006BDFC5DED0EEC02ED0CEC303736EC2E3736BDF8331AEF023102
S123DF20313131ED0AEC02ED08CC0004BDFC5DED06EC02ED04EC303736EC2E3736BDF833C0
S123DF401AEF0231313131188FEC00C3FFE3188FBDFAC0188FEC00C3FFE7188FBDFAC01826
S123DF608FEC00C30009188FBDFDC7188FEC00C3FFEB188FBDFDC7188FEC00C30009188FC0
S123DF80BDFAC0188FEC00C3FFEF188FBDFDC7ED20EC02ED1EEC303736EC2E3736BDF8339C
S123DFA01AEF0231313131ED12EC02ED10CC0001BDFC5DED0EEC02ED0CEC2AED02EC00C32B
S123DFC0FFEB188FEC2CBDFDC7ED0AEC02ED08CC0008BDFC5DED06EC02ED04EC2AED02EC8C
S123DFE000C3FFE3188FEC2CBDFAC0188FEC00C3FFE7188FBDFAC0188FEC00C3FFEF188FFD
S123E000BDFAC0ED1CEC02ED1A4F5FED14EC148300102D037EE0EECC0003BDFC5DED12ECF9
S123E02002ED10EC26ED02EC00C3FFEF188FEC28BDFAC0188FEC00C30005188FBDFAC0187C
S123E0408FEC00C3FFFD188FBDFDE5ED0EEC02ED0CEC26ED02EC00C30005188FEC28BDFA33
S123E060C0188FEC00C3FFFD188FBDFDE5188FEC00C30005188FBDFAC0188FEC00C3FFF97D
S123E0800188FBDFDE5188FEC00C3FFEB188FBDFEB6ED0AEC02ED08EC26ED02EC00C3FFE76E
S123E0A0188FEC28BDFDE5ED18EC02ED16ED02EC00C30005188FEC18BDFDE518CEDEEDBDB1
S123E0C0FA7E2E2AEC16ED02EC00C30005188FEC18BDFDE518CEDEF1BDFA7E2D11EC18ED64
S123E0E028EC16ED266C1526026C147EE00DEC16ED02EC181AEE02AE0038393F6F42783F86
S123E1006760D03F5E11FD3F53649D3F4769983F3A33DF3F2BD8383F1C6D613F0C0B993E44
S123E120F599AA3ED1986B3EAC4C593E85F06F3E3D81F13DDBF0563CEE06D9BD4A9691BEA0
S123E14002BBECBE520429BE900064BEB61B6DBEDB1704BEFEB8D8BF106455BF20883FBF3A
S123E1602FAEDDBF3DC0333F82617C3E82617CBDFA698EEC00C3FF93188FCCE0FBBDFD2D94
S123E180006C4F5FED14EC14A39E2D037EE3E1EC9E83001B2617EC140505E300C3FF9318EE
S123E1A08F18EC02ED1818EC00ED162015EC140505E300C3FFAB188F18EC02ED1818EC0075
S123E1C0ED16EC94ED02EC00C30005188FEC96BDFAC0ED12EC02ED10CC0001BDFC5D188F01
S123E1E0EC00C3FF81188FBDFDE5ED1CEC02ED1ACC0001BDFC5D188FEC00C30005188FBD06
S123E200FDE5188FEC00C30009188FBDFAC0188FEC00C3FF87188FBDFAC0ED12EC02ED10B7
S123E220EC00C3FF8B3736188FEC00C3FF81188FBDFAAECC0002BDFC5DED12EC02ED10EC98
S123E24094ED02EC00C3FF81188FEC96BDFAC0188FEC00C3FF87188FBDFAC0ED0EEC02ED98
S123E2600CCC0001BDFC5DED0AEC02ED08EC94ED02EC00C3FF79188FEC96BDFDC7188FECFE
S123E28000C30009188FBDFAC0188FEC00C3FF7D188FBDFDC7ED20EC02ED1ECC0002BDFC09
S123E2A05DED12EC02ED10EC16ED02EC00C3FF81188FEC18BDFAC0ED0EEC02ED0CEC00C340
S123E2C0FF8F3736188FEC00C3FF7D188FBDFAB4CC0001BDFC5DED12EC02ED10EC98ED021B
S123E2E0EC00C30009188FEC9ABDFAC0ED0EEC02ED0CCCFFFEBDFC5DED0AEC02ED08EC94A3
S123E300ED02EC00C3FF79188FEC96BDFDC7188FEC00C30005188FBDFAC0188FEC00C3FF6B
S123E3207D188FBDFDC7188FEC00C3FF81188FBDFDC7ED06EC02ED04EC00C3FF8F373618A2
S123E3408FEC00C3FF75188FBDFAAEEC9C2644EC1405E38E188F183CCC4000BDFC5DED1277
S123E360EC02ED10EC1AED02EC1C18CEE167BDFAC0188FEC00C3FF8F188FBDFEB6188FEC7D
S123E38000C3FF81188FBDFAC0BDFB91183818ED002045EC1405E38E188F183CCC4000BDDB
S123E3A0FC5DED12EC02ED10EC1AED02EC1C18CEE16BBDFAC0188FEC00C3FF8F188FBDFE2A
S123E3C0B6188FEC00C3FF81188FBDFAC0BDFB91183818EC30018ED006C1526026C147EE16E
S123E3E086AE0038393F2BD8383F1C6D613F0C0B993EF599AA3ED1986B3EAC4C593E85F018
S123E4006F3E3D81F13DDBF0563CEE06D9BD4A9691BE02BBECBE520429BE900064BEB61B22
S123E4206DBEDB1704BEFEB8D839FB509839FB5098BDFA695AEC00C3FFBB188FCCE3E5BD58
S123E440FD2D00444F5FED0CEC0C8300112D037EE6B2EC62ED02EC00C30007188FEC64BD2A
S123E4606FAC0ED0AEC02ED08CC0001BDFC5D188FEC00C3FFAD188FBDFDE5ED10EC02ED0EF3
S123E480EC0C0505E300C3FFBB188F183CCC0001BDFC5D188FEC00C30007188FBDFDE5187D
S123E4A08FEC00C3000B188FBDFAC01838BDFAC0ED0AEC02ED08EC00C3FFB33736188FECEF
S123E4C000C3FFAD188FBDFAAEEC6A27037EE5D2CCFFFFBDFC5DED0AEC02ED08EC0C05054C
S123E4E0E300C3FFBB188F183CCC0002BDFC5DED06EC02ED04EC0C0505E300C3FFBB188FFE
S123E50018EC00ED0218EC02188FEC00C3FFA9188FBDFAC0188FEC00C3000B188FBDFDC759
S123E5201838BDFAC0188FEC00C30007188FBDFDC7188FEC00C3FFAD188FBDFDC7ED14EC74
S123E54002ED12EC0C05E360188F18EC00BDFC5D18CEE429BDFAC0ED0AEC02ED08EC00C3C2
S123E560FFB73736188FEC00C3FFAD188FBDFAB4EC0C0505E300C3FFBB188F18EC00ED0264
S123E58018EC02188FEC00C3000B188FBDFAC0ED0AEC02ED08CCFFFEBDFC5DED06EC02ED6B
S123E5A004EC62ED02EC00C3FFA9188FEC64BDFAC0188FEC00C3FFAD188FBDFDE5188FEC76
S123E5C000C3FFB7188FBDFDE5ED14EC02ED127EE675EC0C0505E300C3FFBB188F183CCC88
S123E5E00001BDFC5DED0AEC02ED08EC62ED02EC00C3FFAD188FEC64BDFDC71838BDFAC04F
S123E600188FEC00C3000B188FBDFDC7ED14EC02ED12EC0C05E360188F18EC00BDFC5D1866
S123E620CEE42DBDFAC0ED0AEC02ED08EC00C3FFB73736188FEC00C3FFAD188FBDFAB4ECD4
```

```
S123E6400C0505E300C3FFBB188F183CCC0001BDFC5D188FEC00C30007188FBDFDE518386F
S123E660BDFAC0188FEC00C3FFB7188FBDFDE5ED14EC02ED12EC0C05E35A3736EC0C05E358
S123E68060188F18EC00BDFC5D188FEC00C3FFB7188FBDFAC0188FEC00C3FFB3188FBDFEC1
S123E6A0B6BDFB91183818ED006C0D26026C0C7EE448AE003839BDFA6908EC103736EC0E95
S123E6C0BDDDBE3131ED04EC103736EC08BDDDBE3131ED024F5FED06EC061AA3102C2005D4
S123E6E0E3083736EC0605E308188F18EC00E304A302183818ED006C0726DD6C0620D9AEC1
S123E700003839387FFFD5BDFA694A4F5FED02ED44ED42C61B37365F37361AEE5018EC0616
S123E720373618EC04373618EC02373618EC003736EC00C3FFC1BDE16FBDFD4D0CCC001B99
S123E7403736EC00C3FFC13736EC4ABDE6B6313131314F5F3736EC00C3FFC13736EC4ABD2F
S123E760DDFD1AEF0231313131ED48EC02ED46CC0006ED0AEC0A1A8300172C4405E300C308
S123E780FFC1188F18EC00ED08EC0A05E34A188F18EC00A308BDFC5D18CEE703BDFAC0ED4D
S123E7A006EC02ED04EC00C3FFF73736188FEC00C3FFB9188FBDFAAE6C0B26B86C0A20B4A5
S123E7C0A6422C0BEC46ED02EC48BDFB842006EC46ED02EC481AEE02AE003839BDFA69843D
S123E7E04F5FED82EC821A8300112C2105E300C3FF97373618CE0018E68358183A18EC00CC
S123E800183818ED006C8326DB6C8220D7CC001137365F37361AEE8A18EC06373618EC04A3
S123E820373618EC02373618EC003736EC00C3FFB9BDE16FBDFD4D0CCC00113736C60137B4
S123E840361AEE8C18EC06373618EC04373618EC02373618EC003736EC00C3FFB9BDE16FA6
S123E860BDFD4D0CCC00113736EC00C3FFB9BDDE8D3131CC00113736EC00C3FFB93736EC3C
S123E88000C3FF97BDE6B6313131CC00113736EC00C3FFB93736EC00C3FF97BDDB5F3173
S123E8A0313131CC001137365F37361AEE8418EC06373618EC04373618EC02373618EC00BC
S123E8C03736EC00C3FFB9BDE16FBDFD4D0CCC00113736EC00C3FFB93736EC00C3FF97BD20
S123E8E0E6B6313131CC00013736EC00C3FFB93736EC00C3FF97BDDDFD1AEF023131312C
S123E90031ED16EC02ED144F5FFD003AFC003A8300142D037EECF74F5F37361AEE8418ECE2
S123E920063736188EC04373618EC02373618EC003736EC00C3FFB93736EC00C3FFDBBDE409
S123E94031BDFD4D0CEC8EED02EC00C3FF8F188FEC90BDFAC0ED1AEC02ED184F5FED82EC2C
S123E960821A8300112C7205E300C3FFB93736EC8205E300C3FFDB188F18EC00BDFC5DED54
S123E9800EEC02ED0CCC0003BDFC5DED0AEC02ED08EC18ED02EC00C3FF83188FEC1ABDFA37
S123E9A0C0188FEC00C3FF87188FBDFAC0ED06EC02ED041838183C18EC00BDFC5D188FEC76
S123E9C000C3FF7F188FBDFDE51838BDFB9118ED006C8326026C822086CCFFFEFD003CFC65
S123E9E0003C8300032D037EEAE24F5FED82EC821A8300112C5A05E300C3FFB93736EC82DA
S123EA0005E300C3FFDB188F18EC00BDFC5D188FEC00C3FF93188FBDFAC0ED0EEC02ED0CC4
S123EA201838183C18EC00BDFC5D188FEC00C3FF87188FBDFDC71838BDFB9118ED006C8383
S123EA4026AC6C8220A87C003D26947C003C208FCC00113736EC00C3FFB9BDDE8D3131CC49
S123EA6000113736EC00C3FFB93736EC00C3FF97BDE6B6313131CC00013736EC00C3FFF6
S123EA80B93736EC00C3FF97BDDDFD1AEF0231313131ED12EC02ED10EC02EC00C3FF8F1873
S123EAA08FEC12BDFA7E2C9EFC003CBDFC5D188FEC00C3FF93188FBDFAC0ED0EEC02ED0C90
S123EAC01AEE84183C188FEC00C3FF87188FBDFAAEEC12ED16EC10ED14CC0004FD003C7EE5
S123EAE0EA46CC000137361AEE8418EC06373618EC04373618EC02373618EC003736EC0060
S123EB00C3FFB93736EC00C3FFDBBDE431BDFD4D0CEC8EED02EC00C3FF8F188FEC90BDFA1B
S123EB20C0ED1AEC02ED184F5FED82EC821A8300112C7205E300C3FFB93736EC8205E3001A
S123EB40C3FFDB188F18EC00BDFC5DED0EEC02ED0CCC0003BDFC5DED0AEC02ED08EC18EDC1
S123EB6002EC00C3FF83188FEC1ABDFAC0188FEC00C3FF87188FBDFAC0ED06EC02ED041856
S123EB8038183C18EC00BDFC5D188FEC00C3FF7F188FBDFDE51838BDFB9118ED006C8326FE
S123EBA0026C822086CCFFFEFD003CFC003C8300032D037EECB24F5FED82EC821A83001176
S123EBC02C5A05E300C3FFB93736EC8205E300C3FFDB188F18EC00BDFC5D188FEC00C3FFD2
S123EBE093188FBDFAC0ED0EEC02ED0C1838183C18EC00BDFC5D188FEC00C3FF87188FBD80
S123EC00FDC71838BDFB9118ED006C8326AC6C8220A87C003D26947C003C208FCC00113729
S123EC2036EC00C3FFB9BDDE8D3131CC00113736EC00C3FFB93736EC00C3FF97BDE6B631BC
S123EC40313131CC00013736EC00C3FFB93736EC00C3FF97BDDDFD1AEF0231313131ED1265
S123EC60EC02ED10ED02EC00C3FF8F188FEC12BDFA7E2C9EFC003CBDFC5D188FEC00C3FF32
S123EC8093188FBDFAC0ED0EEC02ED0C1AEE84C604183A183C188FEC00C3FF87188FBDFAA7
S123ECA0AEEC12ED16EC10ED14CC0004FD003C7EEC12CC001137365F37361AEE8418EC0673
S123ECC0373618EC04373618EC02373618EC003736EC00C3FFB9BDE16FBDFD4D0CCC001106
S123ECE03736EC00C3FFB9BDDE8D31317C003B26037C003A7EE90CAE0038393DA0C49B3E10
S123ED00BA29C7BDFA694A4F5FED48EC481A83001B2C1E05E34A373618CE0018E649581886
S123ED203A18EC00183818BDDC06C4926DE6C4820DACC001B37365F37361AEE5018EC06371C
S123ED403618EC04373618EC02373618EC003736EC00C3FFC5BDE16FBDFD4D0CCC001B376F
S123ED6036C60137361AEE5218EC06373618EC04373618EC02373618EC003736EC00C3FF4D
S123ED80C5BDE16FBDFD4D0CCC001B3736EC00C3FFC5BDDE8D3131CC001B3736EC00C3FF37
S123EDA0C53736EC4ABDE6B6313131CC001B3736EC00C3FFC53736EC4ABDDB5F313131D6
```

```
S123EDC031CC001B3736EC4ABDDE8D3131CC001B3736EC4ABDDDBE3131ED484F5FED46ECA4
S123EDE0461A83001B2C1505E34A188F18EC001AA34827086C4726E76C4620E34F5FED0EA1
S123EE00ED0CED02ED0AED08EC54ED48EC48A3562C5EEC46E34805E34A188F18EC001AEEAC
S123EE2048BDFC40BDFC5DED06EC02ED04EC00C3FFC13736188FEC00C3FFB9188FBDFAAEAF
S123EE40EC46E34805E34A188F18EC00BDFC5DED06EC02ED04EC00C3FFBD3736188FEC0021
S123EE60C3FFB9188FBDFAAE6C4926A06C48209CEC0CED02EC00C3FFBD188FEC0EBDFEB6B8
S123EE80ED06EC02ED04EC46BDFC5D188FEC00C3FFB9188FBDFDC7ED0EEC02ED0CFCECFB59
S123EEA0ED02EC00C3FFC1188FFCECFDBDFAC018CEEECFFBDFDC71AEE02AE0038393DF5C27E
S123EEC08F3DF5C28F3EA3D70A3EA3D70A3EE66666BF7851EB3ED5DCC6BEF9E83E3EC6A7F8
S123EEE0EF3E7AE1473DCCCCCC3D75C28F3CA3D70A3DCCCCCC3E199999BDFA4F4CCC00187B
S123EF00BDD79F1AEF02ED14EC02ED12BDD6D7CCFFFFFBDFC5DED06EC02ED04EC12ED02ECCC
S123EF2000C3FFB9188FEC14BDFA7E2E0DEC12ED02EC14BDFB91AE003839CC001B3736CCC6
S123EF400018BDDE8D3131EC12ED02EC1418CEEEBDBDFA7E2C057F004E2045EC12ED02EC1C
S123EF601418CEEEC1BDFA7E2F1CEC12ED02EC1418CEEEC5BDFA7E2C0DC6FFF7004ECC009A
S123EF8018BDDBC9201AEC12ED02EC1418CEEEC9BDFA7E2F0BC601F7004ECC0018BDDC2711
S123EFA0FCEECFFD0012FCEECDFD0010FCEED3FD0016FCEED1FD0014FCEED7FD000AFCEE73
S123EFC0D5FD0008FCEEDBFD000EFCEED9FD000CFCEEDFFD0002FCEEDDFD0000FCEEE3FD61
S123EFE00006FCEEE1FD0004CC001B3736CC0018BDDDBE3131ED0C4F5FED0AEC0A83001B17
S123F0002C1A18CE0018E60B58183AEC0C18A3000518ED006C0B26E36C0A20DFCC0001EDA1
S123F02008EC088300042D037EF2D8CC00033736CCFFFE3736CC00003736CC00083736ECF9
S123F04000C3FFCBBDED031AEF02BDFD4D08ED10EC02ED0E4F5FED0AEC0A8300022D037EA4
S123F060F154FC0016ED14FC0014ED12EC103736EC0E3736FC00123736FC00103736FC0065
S123F080163736FC00143736BDDEF51AEF02BDFD4D0CFD0016EC02FD0014EC12ED02EC14BF
S123F0A018CE0014BDFDE518CEEEE5BDFAC0ED06EC02ED04CC00103736188FEC00C3FFB95A
S123F0C0188FBDFABA4F5FED0CEC0C8300052C7BCC00103736EC00C3FFCBBDE7071AEF02CE
S123F0E03131ED14EC02ED12FCEEE9ED02EC00C3FFC7188FFCEEEBBDFAC0ED06EC02ED04C0
S123F100CC00103736188FEC00C3FFB9188FBDFABAFCEEEDED02EC00C3FFC7188FFCEBEFC1
S123F120BDFAC0ED06EC02ED04CC00143736188FEC00C3FFB9188FBDFAAE6C0D26026C0C02
S123F14020876C0926026C087EF0216C0B26026C0A7EF058CC00093736CCFFF83736CC004B
S123F160003736CC00103736EC00C3FFCBBDED031AEF02BDFD4D08ED10EC02ED0E4F5FED14
S123F1800AEC0A8300022D037EF216C103736EC0E3736FC000A3736FC00083736FC000E72
S123F1A03736FC000C3736BDDEF51AEF02BDFD4D0CFD000EEC02FD0004F5FED0CEC0C8397
S123F1C000052C49CC00083736EC00C3FFCBBDE7071AEF023131ED14EC02ED12FCEEF1ED29
S123F1E002EC00C3FFC7188FFCEEF3BDFAC0ED06EC02ED04CC00083736188FEC00C3FFB978
S123F200188FBDFABA6C0D26B46C0C20B06C0B26026C0A7EF181CC00053736CCFFFC3736C0
S123F220CC00083736CC00103736EC00C3FFCBBDED031AEF02BDFD4D08ED10EC02ED0E4FCB
S123F2405FED0AEC0A8300022D037EF142EC103736EC0E3736FC00023736FC00003736FC58
S123F26000063736FC00043736BDDEF51AEF02BDFD4D0CFD0006EC02FD00044F5FED0CEC77
S123F2800C8300052C49CC00003736EC00C3FFCBBDE7071AEF023131ED14EC02ED12FCEEBF
S123F2A0F5ED02EC00C3FFC7188FFCEEF7BDFAC0ED06EC02ED04CC00003736188FEC00C391
S123F2C0FFB9188FBDFABA6C0D26B46C0C20B06C0B26026C0A7EF243CC0006ED0CEC0C83B1
S123F2E000172C2618CE0018E60D58CBF4183A183C18CE0018E60D58183A18EC00183818EC
S123F300ED006C0D26D76C0C20D3CC0001AE0038393D0F5C283E4CCCCC3E999999BDFA4F2E
S123F320224F5FED20EC208300032C62FCF3133736FCF3113736CC00003736CC0008373676
S123F340CC0010BDE7DCBDFD4D08FCF3173736FCF3153736CC00003736CC00103736CC000C
S123F36008BDE7DCBDFD4D08FCF31B3736FCF3193736CC00083736CC00103736CC0000BDF3
S123F380E7DCBDFD4D086C21269B6C202097FC0012ED0AFC0010ED08FC0016ED0EFC0014E3
S123F3A0ED0CFC000AED12FC0008ED10FC000EED16FC000CED14FC0002ED1AFC0000ED182E
S123F3C0FC0006ED1EFC0004ED1C4F5FED20EC208300062C4618CE0018E62158183A183C4E
S123F3E0CC4000BDFC5DED06EC02ED04EC200505E300C3FFE7188F18EC00ED0218EC0218BB
S123F4008FEC00C3FFE3188FBDFAC0BDFB91183818ED006C2126B76C2020B3CC0001ED2069
S123F420EC208300072C4618CE004FE62158183A183C18CE0018E62158CBFE183A18E60010
S123F440183818E70018CE004FE621585C183A183C18CE0018E62158CBFE183A18EC004FF8
S123F460183818E7006C2126B76C2020B3F6004EF7005D7F005EAE003839BDFA4F0518CEEB
S123F4801000181C2608181C0008181C043F181C07FFCC1E1AFD0065CC0001FD0063C601AF
S123F4A0F70062C67AF70061C601373637365CBDD13A31313131C60618CE100018E72118D4
S123F4C01C24400EBDD1FA4F5FBDD31BCC0001BDD31B4F5F37363736C602BDD0C831313109
S123F4E031830001262BBDD1FACC000E3736CC00513736CCB60EBDF70B31313131CC000EBC
S123F5003736CC00513736CCB600BDF70B31313131BDD44E6F04E604271A5A276B5A2603FF
S123F5207EF5C85A26037EF6565A26037EF6CA5A27E420E2FC0063261BFC00652616CC000E
```

```
S123F54001373637365FBDD13A31313131BDD44EC605E704CC0002373637365FBDD0C831BF
S123F56031313183000126AECC1E1AFD0065CC0001FD0063BDD1FA4F5FBDD31BCC0001BD9E
S123F580D31BC601E704208E4F5F3736C60237365FBDD0C83131313118A8300012604C602C1
S123F5A0E704FC00632603FC006527037EF516BDD44ECC0001373637365FBDD13A31313180
S123F5C031C605E7047EF5164F5FBDD544BDEEF9ED02E6022C0CC603E704C601F7004E7E42
S123F5E0F516BDF31DCC000E3736CC00513736CCB60EBDF70B31313131CC000237365A377F
S123F600365FBDD13A31313131CC0001BDD544BDEEF9ED02E6022C0CC603E704C601F700FD
S123F6204E7EF516BDF31DCC000E3736CC00513736CCB600BDF70B31313131BDD44ECC00A1
S123F640013736C60137365FBDD13A31313131C605E7047EF51618CE100018E60AC420F701
S123F6600060B600602638CC0001373637365CBDD13A31313131C601F7004ECC00023736DC
S123F68037365FBDD0C8313131318300012610CC1E1AFD0065CC0001FD0063C604E704E699
S123F6A004C10327037EF516F6004E5A27037EF516EC02BDD477CC000237363736BDD13A14
S123F6C0313131317F004E7EF516FC0063261CFC00652617EC02BDD477CC0002373637362F
S123F6E0BDD13A31313131C603E7044F5F3736C60237365FBDD0C83131313118A830001273
9
S123F700037EF516C602E7047EF5163C301AEE0626023839EE04188F183C3617E600BDFD30
S123F7206B1808084A26F55F324A2AEE32333839310DC581B493EFA037D00CFBBAB60B60C1
S123F7403D2AAAAABEFFFFFF3F8000002F2EA047B2D72E913638EF19B9500D003C08888804
S123F760BE2AAAAA3F8000003FC90FDABDFA690CFCF76A3736FCF7683736EC12BDF84D31AA
S123F780313131E30CED0C1AEE1218EC00ED0218EC02BDFAC0ED0AEC02ED081F0D0122EC4B
S123F7A00A3736EC083736CC00063736CCF730BDF9F51AEF02BDFD4D06ED0AEC02ED08207E
S123F7C03DEC0A3736EC083736CC00063736CCF74CBDF9F51AEF02BDFD4D06ED06EC02ED45
S123F7E0041AEE1218EC00ED0218EC02188FEC00C3FFF7188FBDFAC0ED0AEC02ED081F0D7E
S123F800020BEC08ED02EC0ABDFB842006EC08ED02EC0A1AEE02AE0038393C3430343C305A
S123F820EC00C3000537364F5FBDD76C1AEF02AE0038393C3430343C30EC00C3000537364A
S123F840CC0001BDF76C1AEF02AE003839BDFA6911A6172C11EC17ED02EC19BDFB84ED1929
S123F860EC02ED172008EC1726044F5F204F1AEE1118A6002C1918EC00ED0218EC02BDFB53
S123F8808418ED02EC0218ED00C601E71020026F10EC19ED06EC17ED04EC00C3FFF2BDFA44
S123F8A038ED0E4F5FED0A1AEE1118EC002612A6102708EC0A405082002002EC0AAE00382C
S123F8C0391AEE1118EC02ED0618EC00ED04EC00C3FFF2BDFA38ED08A30EED0CA60C2C597F
S123F8E0EC193736EC173736CCFFFFBDF9C61AEF0231313131ED06EC02ED041AEE1118EC1E
S123F90000ED0218EC02188FEC00C3FFF2188FBDFA7E2E037EF99E1AEE11183C188FEC0085
S123F920C30005188FBDFABA6C0B26726C0A206ECCFFFFE30CED0C20A3EC193736EC1737AF
S123F94036EC0CBDF9C61AEF0231313131ED06EC02ED041AEE1118EC00ED0218EC02188F9F
S123F960EC00C3FFF2188FBDFA7E2DC41AEE11183C188FEC00C3FFF2188FBDFABAEC0C83CF
S123F98000102D037EF8A74FE60D2A0143188FCC0001BDFC26EA0BAA0AED0A7EF8A7A61090
S123F9A0271EEC0A40508200ED0A1AEE1118EC00ED0218EC02BDFB8418ED02EC0218ED00B7
S123F9C0EC0AAE0038393C3C30ED00EC06271F05164FE3002E084F5F18CE000020141A8359
S123F9E000FF2F02C6FF175F041D0780EA07188FEC083838393C3C3C3C30188F18EC00ED03
S123FA000218EC02ED04C604183A1AEF001830C60C183AEC041AEF04BDFAC01AEE00BDFD22
S123FA20C71AEE04ED04EC00C30004ED006A0B26E2381838323338393C8FEC00270F05167B
S123FA404F83007E1D00401C003F1D0180383918383C308F18E000820030098F35ED0018C4
S123FA606E0118383C3730200618383C3730368F308F18E00082008F35ED00186E013C375E
S123FA8036EC02373630CDA3002613EC02CDA30227170A0724048A08200584F7200107E6E1
S123FAA00018E4002A028808063832333839CCFDC77EFCECCCFAC07EFCECCCFDE57EFCEC80
S123FAC03C3C3C3C3736EE023C3018EC002704EC002608EE0AED02387EFB5CCDEE023CCD66
S123FAE0EE003C301C058005807EA708EC001C018005AB08A708A601E6053DED09A603E611
S123FB00073DA70D4F5FED0BA601E6068D54A602E6058D4EA601E6078D52A602E6068D4C81
S123FB20A603E6058D46A602E6078D4CA603E6068D46E6092B09680C690B690A596A0858E3
S123FB40A604A80048A6084656ED04ED0C2A02CA011AEE0E383838CDEF02383838380A
S123FB6038393DE30AED0A24026C09393DE30BED0B24F86C0A27F2393DE30CED0C24EC6C73
S123FB800B27F0393736EC0227048880ED023233393C183C3736EE023C30EC00270B0580EF
S123FBA07F2A0D4F5FED02ED001AEE00EE06206D81372AEF6F001C0180801727462A2081CC
S123FBC0F92A0EE602E703E601E7026F018B0820EE4D272E6401660266034C26F720248136
S123FBE0082B12E601E700E602E701E603E7026F03800820EA4D270B680369026901690020
S123FC004A26F51AEE00EC02EE066D022A0F4353188F4353188FC30001240218081AEF025A
S123FC20383818383839188FC00082508175F188FC008188F188FC0000270505180926FB39DA
S123FC403C183C373630E6033DE700EC013DEB00E700A601E6033DAB00383838393C3C3069
S123FC60ED00272E2A04405082006F014D260486862005E70116868E5D2B064A6801592A10
S123FC80FA58046D002A028A80EE02ED0231325F38396F0120F3183818EE003C373630188B
S123FCA0EC002723EC0018A3022B11CDA300240C183A183A18EE043338186E0018EC00CB12
```

```
S123FCC002183A183A20D81808180818EC0027143237E601CDA304270B188FC30004188FF8
S123FCE06A0026F0383818EE02186E003C3C183C3C30ED04CCFD08ED061AEE0A3818EC0047
S123FD00ED0218EC02183839183018EE0218ED02EC0218ED0018383131186E0037363CCD69
S123FD20EE0218EC002602080938323339 3C30EE02EE008F5D270D36A60018A7000818088F
S123FD405A26F5324A2AF0381838186E0218383C308F18EB0089008FED00323335388F18B8
S123FD606E0118CEB600348606202218E100272A361718A4001127138616B7103B18E70037
S123FD808617B7103B8D33C1FF270E8602B7103B18E7004CB7103B8D213239183C37200F61
S123FDA0183C37E6028DC41808E6038DBE1808168DB91808338DB41838393CCE0D06092642
S123FDC0FD4FB7103B38393C3C3736EE023CCDEE023CCDEE003C308D26383818383233381F
S123FDE0381AEF02393C3C3736EE023CCDEE023CCDEE003C30EC0027DE8880A70020D8ECCE
S123FE0000270CEC042609EC00ED04EC02ED06396F08EC04056908A709EC0005690816A0F0
S123FE20092732221781E925E6E601CA8054660266034C26F8E7011C0580201F811824C7A2
S123FE40E709E605CA8054660666074A26F8E7051C018020061C01801C0580A6082704819D
S123FE60032615EC06E302ED06E605E901243B56660666076C092032EC06A302ED06E605D7
S123FE80E201240E6308536306600726056C0626015CE7052609EC0626036F0439E6052BA3
S123FEA0096A09680769 06592AF7A60958640864084656ED04393C3C3C3C3736EE023C300C
S123FEC0EC00270518EC002608EE0AED023838207CCDEE023C37363005A70BEC0405A00BF4
S123FEE08B7FA70D1C01801C0580A604A800A70C6F006F048618A70B680A69096908EC0486
S123FF001AA3002B1A2706EC06A3022006EC06A302250CED06EC04E201A200ED046C0A68F2
S123FF20076906690569046A0B26CDEC09ED06A60DE6082B0668076906594A5844566D0C5E
S115FF402A028A80EE0EED023838383233383838383964
S123FFD600000000000000000000000000000000000D030D01A0000D0460000000007
S10DFFF60000000000000000D0002D
S106FF52FF550054
S903D0002C
```

APPENDIX II

Copyright 1995   Westell, Inc.
:10000000010130305138511FF30307960796079601C9

```
:10000000010130305138511FF30307960796079601C9
:100010007930613061306130613061306130613040
:100020006130613061306130613061306130613048
:100030006160015138111E6051385110051FF303079F4
:100040003051FF3060796051FF801E51FF8051FFB9
:1000500030617951006179A079A07960796079607
:10006000793051FF30607960796079607961796108
:100070007961793051FF30E079E079207920799900
:10008000E079E0793051FF3030613079015138511F9
:100090000005100455100613C510041510061385110F
:1000A0000006151006150005100510051005000505A
:1000B00000050005000500050005000500050005000C0
:1000C0000005100510051005100510051005100300C9
:1000D00030303030307930C03061303061C051382C
:1000E00051FF807851FF807901513851FF8078515C
:1000F000FF80B06101513851FF80798051FF80014C
:10010000513851FF80B051FF80B86179A080015112
:1001100003851FF306101151FFA051FF303079013007B
:1001200050003C514031D0013C99D0015000A051C9
:10013000070A0C05100500010500088B0B89949EC
:100140003099E05000B8B030B849B830B030BC5940
:10015000B830B0B89D593030E05000B8B0B8B850A1
:10016000000B034365920B830B838B0B836BF59303E
:1001700030B8E0995000B861B0B835B83759303070
:10018000038E09B5000B0A0B8303138E09B5000B848
:1001900031E05140A0500071B8A050005000B8A000C
:1001A000C02C6868A869451879611C1A183C9849E0
:1001B000B471AEB036361A209F9AE01A3C99D0013D
:1001C00001D00150020150021A3C98CC70EE363634
:1001D0001A209F9AE079B878783CC14599D00145BA
:1001E00045C05100517C451E18510070617070511E
:1001F000FF510081D00151FF30D00145454551140AC
:10020000031D00182517E30304545514031D002180S
:10021000003C99E0510031D002E0181A3C99D00245D7
:100220004578E0603C99E0D00218E018E0181A51D7
:10023000FF3C98E03C510031B831E0D00281517F61
:100240001851100A030304545514031D002183C993A
:10025000E0510031D0025100A002181A51003C3187
:1002600098E0454531B831E0515531D0020218507F
:100270000006060651FFA00218E00250021851FFF820
:1002800006D1002181A51FFB8A0D002C001FB0CE9DE
:100290002AC74DBA40BA4DC72AE90CFB0101FA1131
:1002A000DF3CB066AD40AD66B03CDF11FA0101FC49
:0502B00009EE23D2203D
:00000001FF
```

```
:10000000E2A1C0C0C000E0EBC0C0DC6CDC7CDCCC9A
:10001000DCC0DCC0DCC0DCC0DCC0DCC0DCC0DCC000
:10002000DCC0DCC0DCC0DCC0DCC0DCC0DCC0DCC0F0
:10003000DCAC1BC00000ACC0003000E0E2C0C0DCA3
:10004000C0E0D0C09CDC3CE0D8D400E0EAD4E0D1F1
:10005000C04CDC40000CDCDCDCCCDC0CDC1CDC2C24
:10006000DCC0E0DBC04CDC5CDC8CDCBCDC5CDC6C75
:10007000DC7CDCC0E0E4C0DCDCCCDCDCDCCCDC0E3A
:10008000DCDCCCDCC0E0EFC0C0ECC0DC16C000E0C3
:100090000000000000000CCC00000000000CCC00B0
:1000A0000DCE0000C900000010020000000010B8
:1000B000020003000600070004000500080000B060
:1000C000050006000700080008B00030004000C0B0
:1000D000C0C0C0C0C0DCC000C0DCC0C0DC00C0000C
:1000E000E0ECD82CE0EDD6D816C000E0ECD82CE03F
:1000F000EDD8CC0816C000E0ECD8ECD8E0EDD41E6A
:10010000C000E0ECD8CCE0EDD8DC0CECDCD41EC0B8
:10011000000E0EFC0DC1E10FFDCE0FFC0C0DC1EC052
:1001200001AD11000600334D0CE03342021D9103E
:10013000008DD9003002202102001AD3C3500E00D6
:10014000400ED9001AD3C34192005282C24092009D
:1001500053A1C1500E0040A0D9001AD3C2531000C1
:100160001AC303A100D8D242B2D2C253A3B00040F6
:10017000A0D8D98E001FD20842B282D0A01040A0D1
:10018000D8D9CE001FC2D850A0A0D8D9CE001FD039
:10019000A0D91000DA102806DAD5002E1020D4D00D
:1001A00000DD0D1DDD5DD003A0A0212F03D00E10BA
:1001B000890C74C960E035D46E2ED02ED4CE03C124
:1001C000D510C6808CC8809D3BD00E80906460E0C6
:1001D00043D46E2ED05EDE1E0EDE00C0CE01DBA04C
:1001E000D000800CC000D065007000FF717F7F5090
:1001F000FC3002DB0BF150F6C00BF8D0D0D0100071
:10020000C003FB7AC000C0C0D0D01000C002771875
:10021000D02ED010C8E00306D00506D1CE025AE099
:10022000E004D105D42ED4033E05D008D0091A50DD
:10023000FAD1AED4D110FFC0D4A0D50B3120D0FF5D
:10024000191000D0C0C0D0D01000C0034019D02E6B
:10025000D01002E003441000D006010810FFD4C003
:10026000AED0E0E0C0D0A0D41055E0026E3E0580D4
:1002700009818110F2D13E18D00680AE2150FAC01B
:1002800010B7F262850FBD2D50B87006EEE4AA3C8
:10029000028D2D7C100C1D7D228A34AEE6EC9A5176C
:1002A000DBB99AD2580058D29AB9DB17A5C938FBE6
:0502B000B0FE414B000F
:00000001FF
```

We claim:
1. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

2. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

3. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges for said telephone line.

4. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating a analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

5. An intelligent envelope delay distortion equalization telecommunications interface for an associated analog communications channel, the analog communications channel comprising a telephone line of a telecommunications network, the communications channel having an associated analog signal having signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

6. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges in the voice-band spectrum for said telephone line.

7. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating a analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

8. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

9. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

10. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising, in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

11. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

12. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital real-time signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges for said telephone line.

13. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

14. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

15. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital real-time signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges in the voice-band spectrum for said telephone line.

16. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating a analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

17. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital signal processing means for the real-time signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

18. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal, and (ii) the phase of the signal in accordance with a second determination comprising a predetermined second stage directed to the signal conditioning of the phase of the signal, thereafter, the processor storing the acquired information and the variables in associated nonvolatile memory, the alignment means operatively coupled to an associated signal processing means, thereafter the processor means providing an output signal to the signal processing means;

digital real-time signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center all-pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

19. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0 \quad K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

20. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining predetermined variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0$$
$$K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges for said telephone line.

21. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquires information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0$$
$$K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges for said telephone line.

22. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising, in combination:

an analog transmission facility and associated transmission medium comprising in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0$$
$$K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

23. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining predetermined variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0$$
$$K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the voice-band spectrum for said telephone line.

24. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprising a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0 \quad K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is achieved for a plurality of predetermined frequency ranges in the voice-band spectrum for said telephone line.

25. A multi-variate system for the automatic delay distortion equalization of an associated receive and/or transmit signal path of an associated analog communications channel, the analog communications channel comprising a telephone line of a telecommunications network, the communications channel selected from a plurality of available communications channels, the communications channel having an associated analog signal having an associated frequency and an associated phase, the system able to determine the actual envelope delay distortion characteristics present for predetermined frequency ranges of the analog communications channel prior to equalization, and thereafter automatically effectuating compensation for the actual envelope delay distortion present by making requisite phase corrections for predetermined frequency ranges of the signal of a selected analog communications channel, the system having an analog transmission facility and associated transmission medium, means for initiating a predetermined test sequence, and at least one intelligent envelope delay distortion equalization telecommunications interface means, the system comprising in combination:

an analog transmission facility and associated transmission medium comprising, in combination:

means for originating an analog signal from a predetermined location over a plurality of analog communications channels, the analog transmission facility having an originating first end and a terminating second end, the first end and the second end being operatively coupled by a plurality of analog transmission spans of predetermined lengths;

means for transmitting an analog signal over the communications channel including any predetermined transmission span to the end-user location selected from a plurality of end-user locations; and means for receiving the analog signal from the communications channel by the end-user location selected from a plurality of end-user locations;

means for originating a predetermined test in response to a command from a predetermined location, the predetermined location selected from a plurality of available locations positioned between the end-user location and the telecommunications network; and at least one intelligent envelope delay distortion equalization telecommunications interface means, the interface means comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprises a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0 \quad K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1 - a^2) + 2b(1 - a)\text{Cos}\omega}{1 + a^2 + b^2 + 2b(1 + a)\text{Cos}\omega + 2a\text{Cos}2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

26. An intelligent envelope delay distortion equalization telecommunications interface for an associated analog communications channel, the analog communications channel comprising a telephone line of a telecommunications network, the communications channel having an associated analog signal having an associated frequency and an associated phase, the interface having a digital adaptive all-pass filter means, the interface having a first mode of operation for determining the actual envelope delay distortion characteristics for predetermined frequency ranges of the analog communications channel prior to equalization, and a second mode of operation for compensating for the actual envelope delay distortion for predetermined frequency ranges of the analog communications channel, the interface comprising:

means for operatively locating the interface at a predetermined location within the transmit signal path and/or the receive signal path of the communications channel, the predetermined location selected from a plurality of available locations positioned between the end-user location and the telecommunications network;

in response to a predetermined test actuated by the interface, means for aligning the interface in the signal path, said aligning means including associated processor means, said processor means having associated logic operatively coupled thereto, thereafter said processor means acquiring information directed to determine the actual envelope delay distortion present for predetermined frequency ranges of the communications channel, thereafter said processor means determining predetermined variables with respect to said predetermined frequency ranges in accordance with a predetermined manner in which (i) the phase of the signal in accordance with a first determination comprises a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K1 = 1 + 6a + a^2 + 4a\text{Cos}^2\omega_0 \quad K2 = 8a(1 + a)\text{Cos}\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1-a^2) + 2b(1-a)\cos\omega}{1 + a^2 + b^2 + 2b(1+a)\cos\omega + 2a\cos 2\omega}$$

thereafter, the processor storing the acquired information and the variables in associated nonvolatile memory, the alignment means operatively coupled to an associated signal processing means, thereafter the processor means providing an output signal to the signal processing means;

digital signal processing means for the signal processing of the signal in a predetermined manner, the signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

27. A method of envelope delay distortion equalization of a transmit and/or receive signal path of an associated analog communications channel, the analog communications channel comprising a telephone line of a telecommunications network, the communications channel selected from a plurality of available communications channels, the communications channel having an associated analog signal having an associated frequency and an associated phase, comprising the steps of:

operatively locating an intelligent envelope delay distortion equalization telecommunications interface means at a predetermined location within the transmit signal path and/or the receive signal path of the communications channel, the predetermined location selected from a plurality of available locations positioned between the end-user location and the telecommunications network;

originating a predetermined test in response to a command from a predetermined location, the predetermined location selected from a plurality of available locations positioned between the end-user location and the telecommunications network;

aligning the interface means in the signal path, thereafter, in response to a predetermined test actuated by the interface, the interface means including associated processor means, said processor means having associated logic operatively coupled thereto, thereafter said processor means acquiring information directed to determine the actual envelope delay distortion present for predetermined frequency ranges of the communications channel, thereafter said processor means determining variables with respect to said predetermined frequency ranges in accordance with a predetermined manner in which (i) the phase of the signal in accordance with a first determination comprises a predetermined first stage directed to the signal conditioning of the phase of the signal in accordance with the following formula, namely, $$b_n = b_{n-1} - \frac{b_{n-1}^3 - b_{n-1}K_1 - K_2}{3b_{n-1}^2 - K_1}$$

$$K_1 = 1 + 6a + a^2 + 4a\cos^2\omega_0 \quad K_2 = 8a(1+a)\cos\omega_0$$

and (ii) the phase of the signal in accordance with a second determination comprising a predetermined second stage directed to the signal conditioning of the phase of the signal in accordance with the following formula, namely, $$\Delta D = \nabla D = \frac{\delta D}{\delta a} \Delta a + \frac{\delta D}{\delta b} \Delta b$$

$$D = \frac{2(1-a^2) + 2b(1-a)\cos\omega}{1 + a^2 + b^2 + 2b(1+a)\cos\omega + 2a\cos 2\omega}$$

thereafter, the processor storing the acquired information and the variables in associated nonvolatile memory, the alignment means operatively coupled to an associated signal processing means, thereafter the processor means providing an output signal to the signal processing means;

digital signal processing the signal in a predetermined manner, the interface means including digital signal processing means having associated logic operatively coupled thereto, the signal processing means determining the requisite phase shift of the signal for the predetermined frequency ranges to compensate for the envelope delay distortion for the communications channel, the signal processing means operatively coupled to an associated digital adaptive all pass filter means; and digital adaptive all pass filtering the signal in a predetermined manner, the interface means including digital adaptive all pass filter means, the filter means having associated logic operatively coupled thereto, the filter means having an automatically variable center band pass filter which facilitates the shifting of the phase of the signal over predetermined frequencies, the filter means acting to modify the signal in a manner which compensates for the envelope delay distortion for the communications channel to a corresponding conditioned output signal to the communications channel, whereby, pre and post delay distortion equalization is attained for a plurality of predetermined frequency ranges in the 300–3300 Hz spectrum for said telephone line.

* * * * *